United States Patent
Kuroda

(10) Patent No.: US 10,348,365 B2
(45) Date of Patent: Jul. 9, 2019

(54) DIRECTIONAL COUPLING COMMUNICATION APPARATUS

(71) Applicant: KEIO UNIVERSITY, Tokyo (JP)

(72) Inventor: Tadahiro Kuroda, Yokohama (JP)

(73) Assignee: KEIO UNIVERSITY, Tokyo (JP)

( * ) Notice: Subject to any disclaimer, the term of this patent is extended or adjusted under 35 U.S.C. 154(b) by 56 days.

(21) Appl. No.: 15/808,200

(22) Filed: Nov. 9, 2017

(65) Prior Publication Data

US 2018/0076853 A1     Mar. 15, 2018

Related U.S. Application Data

(62) Division of application No. 14/408,797, filed as application No. PCT/JP2013/067078 on Jun. 21, 2013.

(30) Foreign Application Priority Data

Jul. 12, 2012  (JP) .................................. 2012-156874
May 29, 2013  (JP) .................................. 2013-113066

(51) Int. Cl.
  *H04B 3/32* (2006.01)
  *H04B 5/00* (2006.01)
  (Continued)

(52) U.S. Cl.
  CPC ............. *H04B 5/0018* (2013.01); *H04B 3/32* (2013.01); *H04B 5/0012* (2013.01);
  (Continued)

(58) Field of Classification Search
  CPC ...... H04B 5/0018; H04B 3/32; H04B 5/0093; H04B 5/0012; H04B 5/0075;
  (Continued)

(56) References Cited

U.S. PATENT DOCUMENTS 3,764,941 A    10/1973 Nick
6,483,398 B2 * 11/2002 Nagamori ............... H01P 5/185
                                                 333/101
(Continued)

FOREIGN PATENT DOCUMENTS

JP    2007-049422 A    2/2007
JP    2007-526555 A    9/2007
(Continued)

OTHER PUBLICATIONS

International Search Report dated Jul. 16, 2013, issued in corresponding application No. PCT/JP2013/067078.
(Continued)

*Primary Examiner* — Andrew Wendell
*Assistant Examiner* — Maryam Soltanzadeh
(74) *Attorney, Agent, or Firm* — Westerman, Hattori, Daniels & Adrian, LLP

(57) ABSTRACT

The invention relates to a directional coupling communication apparatus where the coupling impedance can be easily matched to reduce reflections, and thus, the speed of communication channels is increased as compared to that with inductive coupling, and at the same time, the reliability of communication is improved by increasing the signal intensity. Modules having a coupler where an input/output connection line is connected to a first end, and either a ground line or an input/output connection line to which an inverse signal of a signal to be inputted into the input/output connection line connected to the above-described first end is inputted is connected are layered on top of each other so that the couplers are couplers to each other using capacitive coupling and inductive coupling.

2 Claims, 53 Drawing Sheets

(51) Int. Cl.
*H05K 1/02* (2006.01)
*H05K 1/14* (2006.01)

(52) U.S. Cl.
CPC ......... *H04B 5/0075* (2013.01); *H04B 5/0093* (2013.01); *H05K 1/0239* (2013.01); *H05K 1/0243* (2013.01); *H04B 5/0031* (2013.01); *H05K 1/141* (2013.01); *H05K 1/147* (2013.01); *H05K 2201/042* (2013.01); *H05K 2201/09045* (2013.01)

(58) Field of Classification Search
CPC .. H04B 5/0031; H05K 1/0243; H05K 1/0239; H05K 1/141; H05K 2201/042; H05K 2201/09045; H05K 1/147
See application file for complete search history.

(56) References Cited

U.S. PATENT DOCUMENTS

| | | | |
|---|---|---|---|
| 2003/0074638 | A1 | 4/2003 | Osaka et al. |
| 2006/0166552 | A1* | 7/2006 | Bence ............... H01R 9/05 439/578 |
| 2007/0037516 | A1 | 2/2007 | Sawai et al. |
| 2007/0105509 | A1 | 5/2007 | Muhammad et al. |
| 2008/0039009 | A1 | 2/2008 | Symons et al. |
| 2008/0048919 | A1* | 2/2008 | Jung ............... H01Q 1/12 343/702 |
| 2009/0273418 | A1 | 11/2009 | Shimizu et al. |
| 2011/0057291 | A1 | 3/2011 | Slupsky et al. |
| 2011/0273242 | A1* | 11/2011 | Totani ............... H01P 5/185 333/116 |
| 2012/0146855 | A1* | 6/2012 | Spencer ............... H01Q 1/364 343/700 MS |
| 2013/0300628 | A1* | 11/2013 | Liu ............... H01Q 5/335 343/853 |

FOREIGN PATENT DOCUMENTS

| | | |
|---|---|---|
| JP | 2008-091627 A | 4/2008 |
| JP | 2008-278290 A | 11/2008 |
| JP | 2010-533387 A | 10/2010 |
| JP | 2011-041066 A | 2/2011 |

OTHER PUBLICATIONS

Ishikuro, Hiroki, et al., "An Attachable Wireless Chip Access Interface for Arbitrary Data Rate Using Pulse-Based Inductive-Coupling through LSI Package", IEEE International Solid-State Circuits Conference (ISSCC '07), Dig. Tech. Papers, Feb. 2007, pp. 360-361, 608, cited in Specification.

Niitsu, Kiichi, et al., "An Inductive-Coupling Link for 3D Integration of a 90 nm CMOS Processor and a 65 nm CMOS SRAM", IEEE International Solid-State Circuits Conference (ISSCC '09), Dig. Tech. Papers, Feb. 2009, pp. 480-481, cited in Specification.

Kawai, Shusuke, et al., "A 2.5 Gb/s/ch 4PAM Inductive-Coupling Transceiver for Non-contact Memory Card", IEEE International Solid-State Circuits Conference (ISSCC '10), Dig. Tech. Papers, Feb. 2010, pp. 264-265, cited in Specification.

Yun, Won-Joo, et al., "A 7Gb/s/Link Non-Contact Memory Module for Multi-Drop Bus System Using Energy-Equipartitioned Coupled Transmission Line", IEEE International Solid-State Circuits Conference (ISSCC '12), Dig. Tech. Papers, Feb. 2012, pp. 52-53, cited in Specification.

Extended European Search Report dated Feb. 23, 2016, issed in counterpart European Patent Application No. 13817589.8. (9 pages).

Office Action dated Feb. 23, 2017, issued in counterpart European Application No. 13 817 589.8. (5 pages).

Chinese Office Action dated Nov. 4, 2015, issued in counterpart Chinese Patent Application No. 201300636776.2 with English translation. (12 pages).

Office Action dated Nov. 16, 2017, issued in counterpart European Application No. 13817589.8. (7 pages).

\* cited by examiner

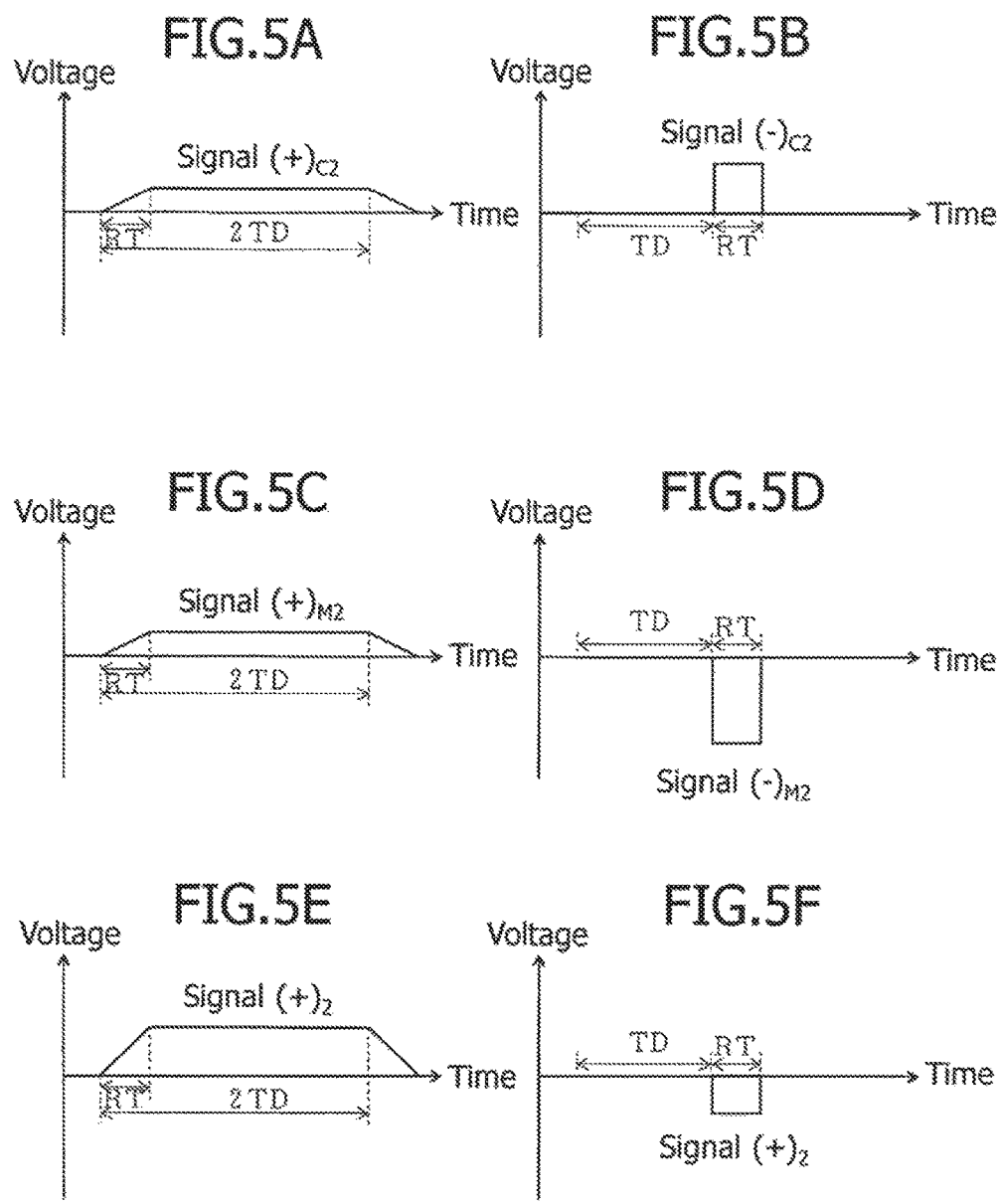

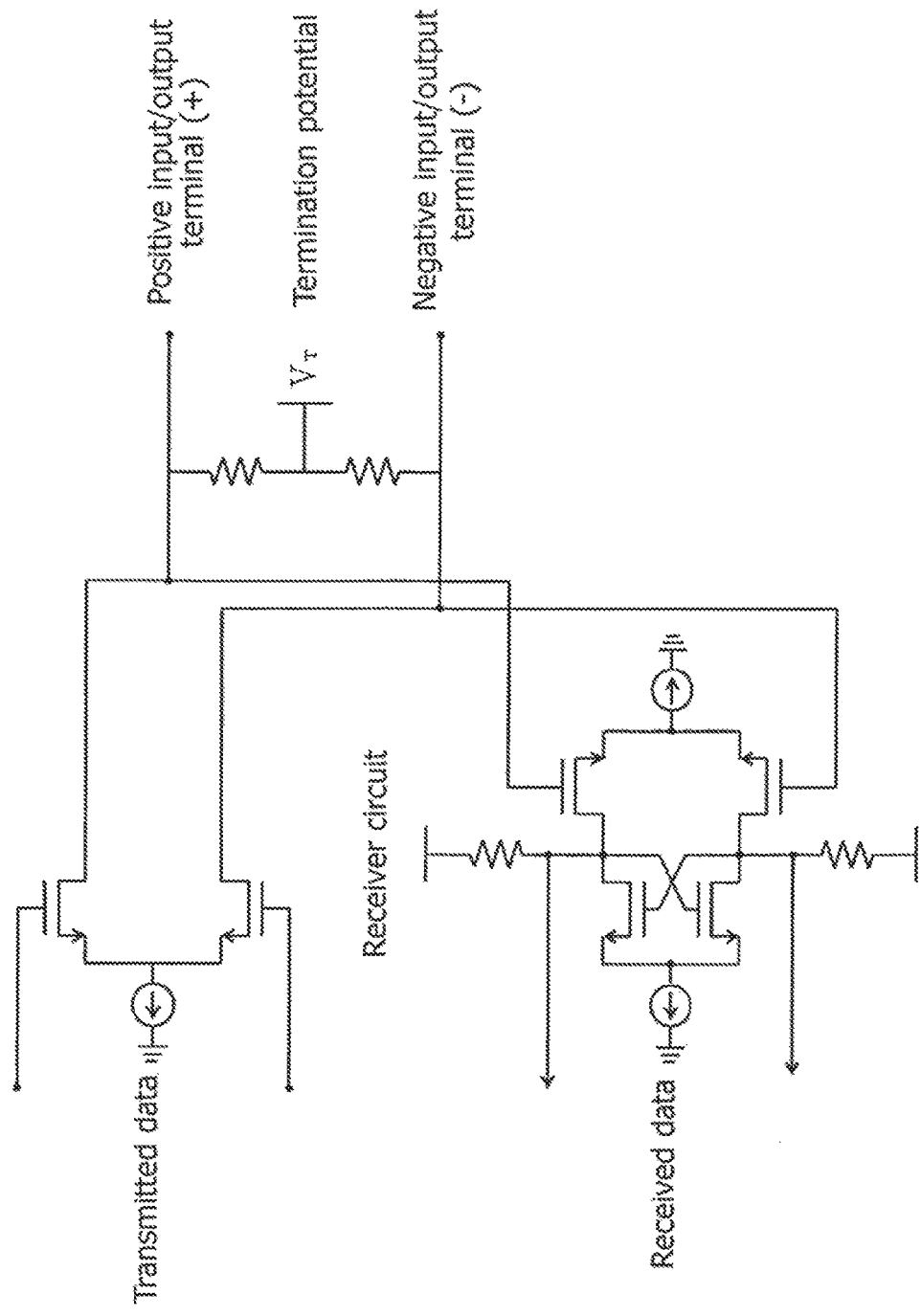

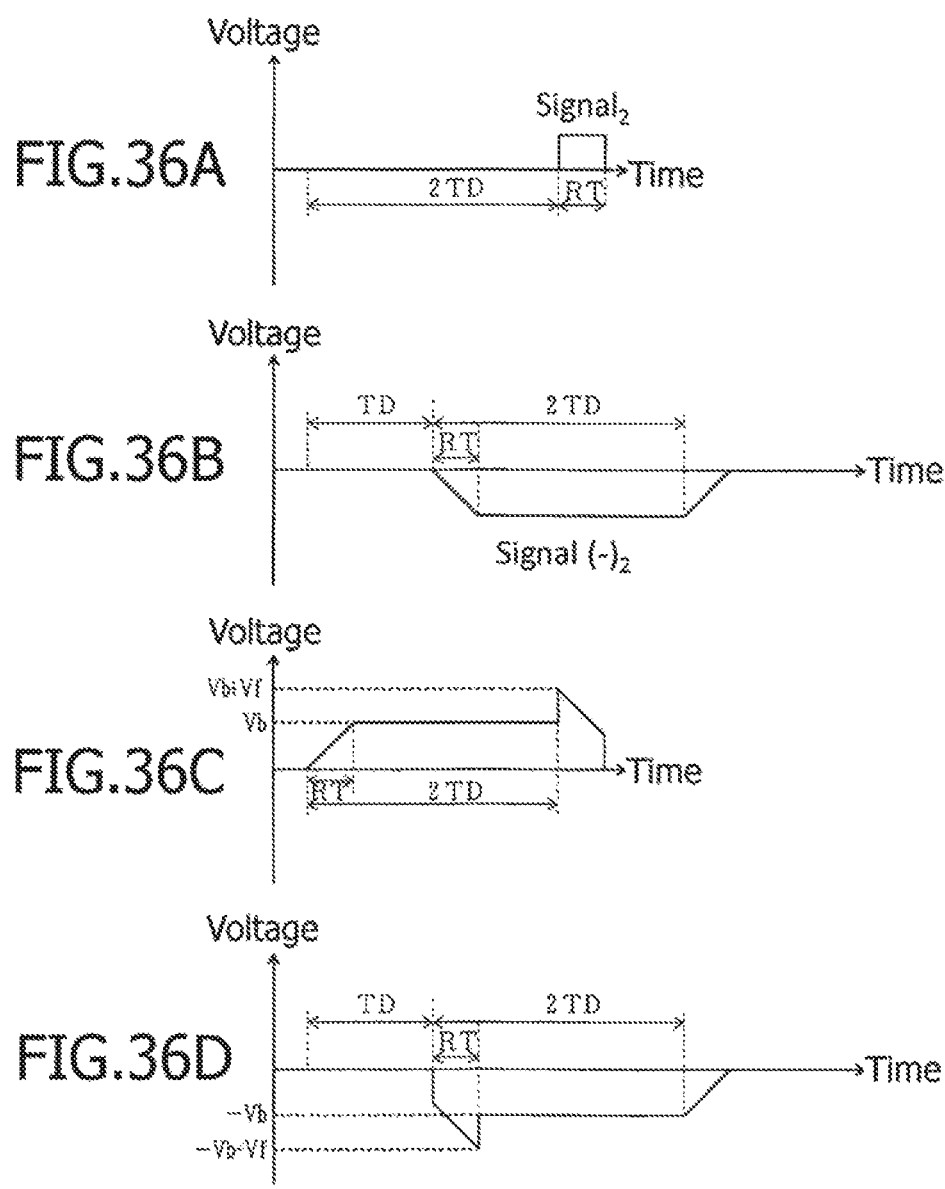

FIG. 51A
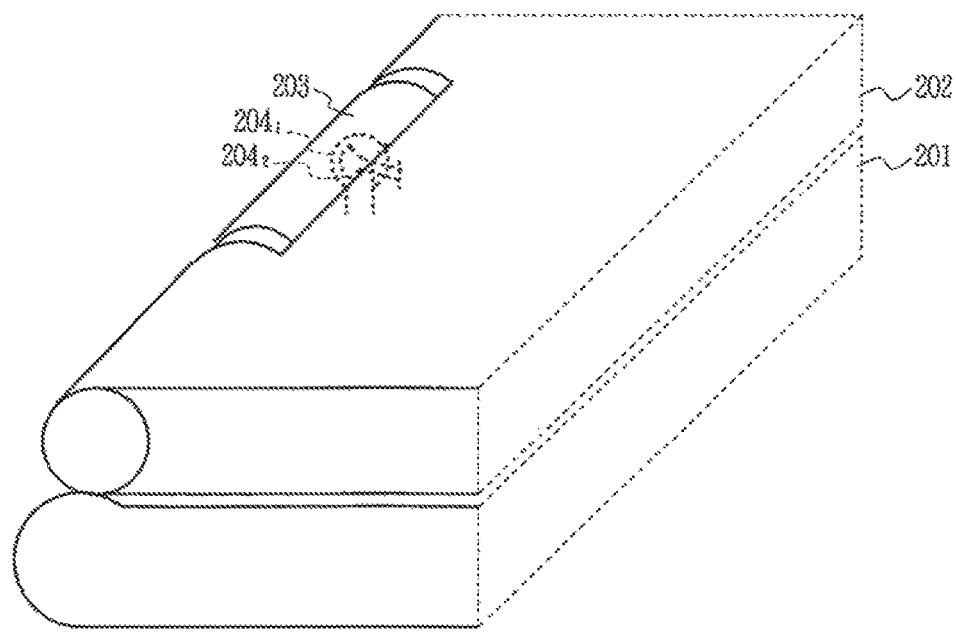
FIG. 51B
FIG. 51C
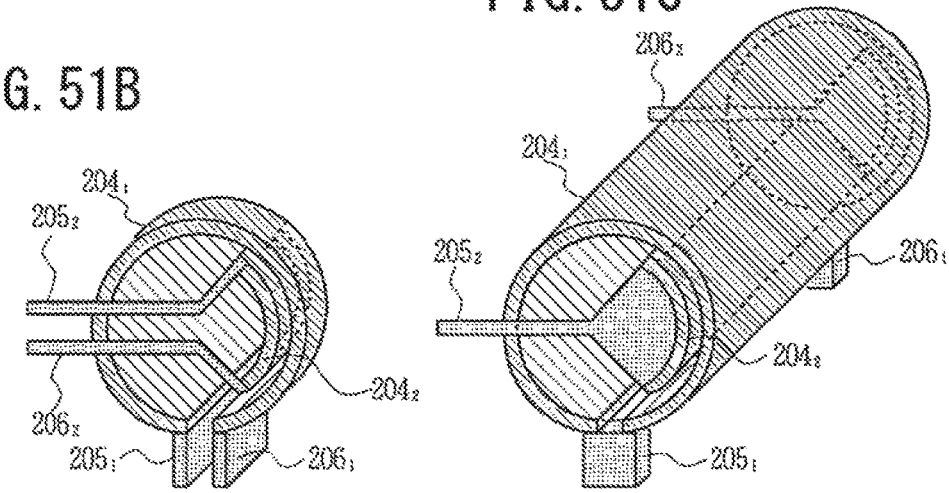

DIRECTIONAL COUPLING COMMUNICATION APPARATUS

CROSS-REFERENCE TO RELATED APPLICATIONS

This application is a divisional of U.S. application Ser. No. 14/408,797, filed on Dec. 17, 2014, which is a continuation of International Application No. PCT/JP2013/067078 filed on Jun. 21, 2013, which is based upon and claims the benefit of priority from the prior Japanese Patent Application No. 2013-113066, filed on May 29, 2013 and Japanese Patent Application No. 2012-156874 filed on Jul. 12, 2012, the entire contents of which are incorporated herein by reference.

TECHNICAL FIELD

The present invention relates to a directional coupling communication apparatus, and in particular, to a structure for non-contact data communication at high speed between modules or terminals using capacitive coupling and inductive coupling between a pair of transmission lines in close proximity without using a contact type connector.

BACKGROUND ART

In the case where a system is constructed by combining modules according to the prior art, signal wires between modules are connected through connectors. In a mobile phone, for example, a display module or a camera module is connected to the main substrate in the main body through wires and connectors on a flexible substrate.

When the characteristic impedance becomes discontinuous through a connector, part of the signal is reflected, causing distortion in the signal that has passed through. This causes inter-symbol interference and causes such a problem that an increase in the speed of communication is hindered. In the case where the distance between the connector terminals is reduced in order to increase the number of signals or miniaturize the connectors, crosstalk between signals increases, which results in an increase in the speed of communication and miniaturization of the device being hindered.

In the case where the material for the connectors and the manufacturing process are more sophisticated in order to solve these problems, the manufacturing costs increase. In addition, it is difficult to automate the work for connecting modules with connectors, and therefore, the assembly costs increase. These hinder the price of the device from being reduced. Furthermore, there may be an incident such that a connector disengages due to vibrations while the device is being used, which lowers the reliability of the device.

The present inventor has proposed an electronic circuit for data communication between substrates or semiconductor integrated circuit chips using inductive coupling, that is to say, magnetic field coupling, through coils formed of wires on printed circuit boards (PCBs) and semiconductor integrated circuit chips (see Non-Patent Documents 1 to 3).

Meanwhile, it has also been proposed that microstrip lines or bus lines be coupled in close proximity for wireless communication of data using capacitive coupling and inductive coupling (see Patent Documents 1 and 2). Patent Document 1 discloses that differential transmission lines consisting of two transmission lines placed parallel to each other and terminated for matching with a terminal resistor can be placed parallel to each other in the same direction for wireless communication between two modules.

In addition, Patent Document 2 discloses that two microstrip lines that are provided on a ground plane with a dielectric body film in between and are terminated for matching with a terminal resistor can be used as a directional coupler for wireless communication between two modules when differential signals in a microwave band are inputted into the two microstrip lines.

PRIOR ART DOCUMENTS

Patent Documents

Patent Document 1: Japanese Unexamined Patent Publication 2008-278290
Patent Document 2: Japanese Unexamined Patent Publication 2007-049422

Non-Patent Documents

Non-Patent Document 1: H. Ishikuro, T. Sugahara, and T. Kuroda, "An Attachable Wireless Chip Access Interface for Arbitrary Data Rate by Using Pulse-Based Inductive-Coupling through LSI Package", IEEE International Solid-State Circuits Conference (ISSCC '07), Dig. Tech. Papers, pp. 360-361, 608, February 2007
Non-Patent Document 2: K. Niitsu, Y. Shimazaki, Y. Sugimori, Y. Kohama, K. Kasuga, I. Nonomura, M. Saen, S. Komatsu, K. Osada, N. Irie, T. Hattori, A. Hasegawa, and T. Kuroda, "An Inductive-Coupling Link for 3D Integration of a 90 nm CMOS Processor and a 65 nm CMOS SRAM", IEEE International Solid-State Circuits Conference (ISSCC '09), Dig. Tech. Papers, pp. 480-481, February 2009
Non-Patent Document 3: S. Kawai, H. Ishikuro, and T. Kuroda, "A 2.5 Gb/s/ch Inductive-Coupling Transceiver for Non-contact Memory Card", IEEE International Solid-State Circuits Conference (ISSCC '10), Dig. Tech. Papers, pp. 264-265, February 2010

SUMMARY OF THE INVENTION

Problem to be Solved by the Invention

In order to solve these problems relating to connectors, the present inventor has proposed an apparatus for wireless data communication at high speed between modules (or between devices) using capacitive coupling and inductive coupling between transmission lines formed of wires on electronic circuit substrates (see Patent Application 2011-032886).

FIG. 52 is a schematic perspective diagram showing a communication apparatus between modules proposed by the present inventor, where couplers have a differential structure with the resistance to same-phase noise increased as compared to those with a single end. As shown in FIG. 52, feedback lines $224_1$ and $224_2$ have the same structure as signal lines $212_1$ and $212_2$ in order to provide differential couplers. In this case, the feedback lines $224_1$, $224_2$ and the signal lines $212_1$, $212_2$ are terminated with resistors $214_1$, $214_2$ having a characteristic impedance $Z_0$ that is equal to the coupling impedance $Z_{0\text{-}coupled}$.

In the case of this proposal, the differential structure makes the resistance to same-phase noise high as compared to a structure with a single end and makes it easy to control the coupling impedance $Z_{0\text{-}coupled}$ as compared to a structure with a single end.

FIG. 53 is a schematic perspective diagram showing another communication apparatus between modules proposed by the present inventor, and in this proposal, signal lines $212_1$, $212_2$ and feedback lines $224_1$, $224_2$ are all provided with lead transmission lines $225_1$, $225_2$, $226_1$, and $226_2$.

In this case as well, semiconductor integrated circuit apparatuses $215_1$, $215_2$, transmission lines $225_1$, $225_2$, $226_1$, $226_2$, signal lines $212_1$, $212_2$, and feedback lines $224_1$, $224_2$ are respectively connected for impedance matching, and the terminals of the signal lines $212_1$, $212_2$ and the feedback lines $224_1$, $224_2$ are also impedance matched.

In the structures shown in FIGS. 52 and 53, however, four signal lines ($212_1$, $212_2$, $224_1$, $224_2$) and two terminal resistors $214_1$, $214_2$ are required. In the case of FIG. 53, four lead transmission lines ($225_1$, $225_2$, $226_1$, $226_2$) are additionally required. Thus, such a problem remains that the number of parts is great and the volume of the terminal resistors is great, which makes the volume of mounted parts large with high costs.

In addition, four signal lines ($212_1$, $212_2$, $224_1$, $224_2$) are capacitively and inductively coupled to each other, which makes it relatively difficult to match the coupling impedance, and thus, the reflection of signals easily occurs. Furthermore, such a problem remains that the value of the terminal resistors cannot be adjusted, and thus, the reflection of signals easily occurs.

Moreover, only near-end crosstalk that has been transmitted is used for signal reception while far-end crosstalk is discarded as heat from the terminal resistors, and therefore, such a problem remains that the energy of the signal that can be used for reception is small.

Accordingly, an object of the present invention is to reduce the number of necessary parts in order to reduce the volume of mounted parts and the costs so that matching can be made easier as a coupling impedance, and the value of the terminal resistors can be adjusted in order to reduce the reflection of signals, or the energy of the signals that can be used for reception is increased so as to increase signal intensity and reliability for communication.

Means for Solving Problem (1) In order to solve the above-described problems, a directional coupling communication apparatus is characterized by having: a first module having a first coupler provided on a first insulating substrate, where an input/output connection line is connected to a first end, and either a ground line or an input/output connection line to which an inverse signal of a signal to be inputted into the input/output connection line connected to the above-described first end is connected to a second end; and a second module having a second coupler provided on a second insulating substrate, where an input/output connection line is connected to a first end, and either a ground line or an input/output connection line to which an inverse signal of a signal to be inputted into the input/output connection line connected to the above-described first end is connected to a second end, wherein the above-described first module and the above-described second module are layered on top of each other so that the above-described first coupler and the above-described second coupler overlap at least partially as viewed in the direction in which the above-described first module and the above-described second module are layered on top of each other, and signal coupling occurs using capacitive coupling and inductive coupling between the above-described first coupler and the above-described second coupler.

Thus, electromagnetic field coupling is generated between the first coupler and the second coupler where an input/output connection line is connected to one end and an input/output connection line or a ground line is connected to the other end so that only two signal lines form a coupler, and therefore, the number of necessary parts can be reduced as compared to the prior art inventions in order to reduce the volume of mounted parts, lower the cost, and make it relatively easy to match the coupling impedance.

(2) In addition, the present invention provides the directional coupling communication apparatus according to the above (1), which is characterized in that the above-described first module and the above-described second module are layered on top of each other in such a state that signal coupling between an input/output connection line connected to the above-described first coupler and an input/output connection line connected to the above-described second coupler is weaker than signal coupling between the above-described first coupler and the above-described second coupler.

Thus, it is desirable for the first coupler and the second coupler to be layered on top of each other in such a state that the signal coupling that does not effectively contribute to communication between the input/output connection line connected to the first coupler and the input/output connection line connected to the second coupler is weaker than the signal coupling that contributes to communication between the first coupler and the second coupler.

(3) Furthermore, the present invention provides the directional coupling communication apparatus according to the above (1) or (2), which is characterized in that at least one of the above-described first module and the above-described second module has a semiconductor integrated circuit apparatus with a transmitter/receiver circuit connected to an input/output connection line.

Thus, the semiconductor integrated circuit apparatus with a transmitter/receiver circuit may be provided to at least one of the first module and the second module. In the case where the semiconductor integrated circuit apparatus is provided to both, direct communication is created between the two. In the case where the semiconductor integrated circuit apparatus is provided to only one module, the other module handles the mediation for communication.

(4) Furthermore, the present invention provides the above (3), which is characterized in that an impedance matching circuit is connected to an input/output terminal of the above-described transmitter/receiver circuit provided in the above-described semiconductor integrated circuit apparatus.

When an impedance matching circuit is connected to an input/output terminal of the transmitter/receiver circuit, matching termination can be achieved on the semiconductor integrated circuit apparatus side without using a terminal resistor, and as a result, signal reflection can be suppressed.

(5) In addition, the present invention provides any of the above (1) to (4), which is characterized in that the input/output connection line is connected to the second end of the above-described first coupler, and the input/output connection line is connected to the second end of the above-described second coupler.

By providing such a structure where a differential signal is inputted through the two ends of a coupler, the far end crosstalk, which was discarded as heat according to the prior art, strengthens the signal, and therefore, the reliability in communication increases. That is to say, the far end crosstalk for the (+) signal strengthens the near end crosstalk for the (−) signal while the far end crosstalk for the (−) signal strengthens the near end crosstalk for the (+) signal, and thus, the received signal is strengthened. In addition, (+) and (−) signals are always applied to the two ends of a coupler, and therefore, the common signal does not change, which makes unnecessary radiation (noise) lower.

(6) Furthermore, the present invention provides the above (5), which is characterized in that a connection portion of the input/output connection lines connected to the two ends of the above-described first coupler runs in the direction of a long axis of the above-described first coupler, and a connection portion of the input/output connection lines connected to the two ends of the above-described second coupler runs in the direction of a long axis of the above-described second coupler.

By adopting such a connection structure, signals that transmit through couplers do not have a different current intensity in the direction of the width of the first coupler and the second coupler, and therefore, communication with high precision becomes possible.

(7) Moreover, the present invention provides the above (5), which is characterized in that a connection portion of the input/output connection lines connected to the two ends of the above-described first coupler is connected to an end on a side along the direction of a long axis of the above-described first coupler, and a connection portion of the input/output connection lines connected to the two ends of the above-described second coupler is connected to an end on a side along the direction of a long axis of the above-described second coupler.

By adopting such a connection structure, it is possible to miniaturize the input/output connection lines, including couplers.

(8) In addition, the present invention provides any of the above (5) to (7), which are characterized in that at least one of the above-described first coupler and the above-described second coupler is mounted on a protrusion, and a neighborhood of a connection portion of the above-described input/output connection lines of the coupler mounted on the above-described protrusion is provided along a side of the above-described protrusion.

Thus, by mounting at least one coupler on top of a protrusion, the first coupler and the second coupler can be made to face each other at an arbitrary distance without taking the thickness of the semiconductor integrated circuit apparatus into consideration.

(9) Furthermore, the present invention provides the above (5), which is characterized in that an input/output connection line connected to the above-described first coupler and an input/output connection line connected to the above-described second coupler are bonding wires. Thus, bonding wires may be used as the input/output connection lines that connect the couplers to the transmitter/receiver circuit.

(10) Moreover, the present invention provides any of the above (5) to (8), which are characterized in that an input/output connection line connected to the above-described first coupler and an input/output connection line connected to the above-described second coupler are signal lines. Thus, signal lines may be used as the input/output connection lines for connecting the couplers to the transmitter/receiver circuit, which makes it possible to install the transmitter/receiver circuit in a place away from the couplers, and furthermore makes the input/output connection line through which a (+) signal is applied and the input/output connection line through which a (−) signal is applied have the same length with high precision.

(11) In addition, the present invention provides any of the above (1) to (4), which are characterized in that the ground line is connected to the second end of the above-described first coupler, and the ground line is connected to the second end of the above-described second coupler.

Thus, the second end of a coupler may be connected to the ground line so that an input signal is reflected from the second end that is connected to the ground line, and a reflected signal with reverse polarity progresses from the second end to the first end, and therefore, the far end crosstalk strengthens the signal in the same manner as when a differential signal is inputted through the two ends of the coupler, which increases the reliability in communication.

(12) Furthermore, the present invention provides any of the above (1) to (11), which are characterized in that the length of the above-described first coupler is greater than the length of the above-described second coupler. Thus, the couplers can have different lengths so as to have a great positioning margin when modules are layered on top of each other.

(13) Moreover, the present invention provides any of the above (1) to (12), which are characterized in that a long axis of the above-described first coupler and a long axis of the above-described second coupler are not parallel to each other. Thus, the long axes of the couplers can be made unparallel to each other so as to have a great positioning margin as well when modules are layered on top of each other.

(14) In addition, the present invention provides the above (5), which is characterized in that the above-described first coupler and the above-described second coupler have a shape that has been bent a number of times so that the two ends of the coupler approach each other. Thus, it is not necessary for the couplers to be rectangular, and they may have such a shape as to be bent a number of times so that the two ends of the coupler approach each other, for example, in a C shape, which makes it easy for the entire structure to be compact, where the input/output signal lines can have the same length or be shortened.

(15) Furthermore, the present invention provides any of the above (1) to (14), which are characterized in that at least either an area on the side opposite to a surface of the above-described first insulating substrate on which the above-described first coupler is provided or an area on the side opposite to a surface of the above-described second insulating substrate on which the above-described second coupler is provided has an electromagnetic shield layer. Thus, the electromagnetic shield layer can be provided so as to reduce the electromagnetic field noise that enters from the outside, and as a result, noise resistance can be further increased.

(16) Moreover, the present invention provides the above (15), which is characterized in that the above-described electromagnetic shield layer has a missing portion in a location facing the above-described first coupler or the above-described second coupler. Thus, a missing portion is provided to the electromagnetic shield layer so that electric lines of force can be concentrated between the couplers in order to increase the degree of coupling between the couplers. Furthermore, this structure is indispensible in the case where the two modules are layered on top of each other in the same direction instead of being layered on top of each other so as to face each other.

(17) In addition, the present invention provides any of the above (1) to (4), which are characterized in that a third coupler, where an input/output connection line is connected to a first end, and either a ground line or an input/output connection line to which an inverse signal of a signal to be inputted into the input/output connection line connected to the above-described first end is connected to a second end, is provided on the above-described first insulating substrate in the above-described first module, and a third module provided with a fourth coupler, where an input/output connection line is connected to a first end, and either a ground line or an input/output connection line to which an inverse signal of a signal to be inputted into the input/output connection line connected to the above-described first end is connected to a second end, on an insulating substrate is layered so that the above-described third coupler and the above-described fourth coupler overlap at least partially as viewed in the direction in which the above-described third module is layered, and signal coupling occurs using capacitive coupling and inductive coupling between the above-described third coupler and the above-described fourth coupler.

Thus, the number of modules is not limited to two, but rather three or more modules may be provided.

(18) Furthermore, the present invention provides the above (17), which is characterized in that the two ends of the above-described third coupler and the two ends of the above-described first coupler are connected with wires having the same length, and the above-described first module mediates communication between the above-described second module and the above-described third module.

In this case, it is possible to use the first module as an interposer or in the same manner as for a motherboard so as to mediate communication between the second module and the third module.

(19) Moreover, the present invention provides any of the above (1) to (4), which are characterized in that the first coupler provided on the above-described first insulating substrate in the above-described first module has a length that corresponds to at least two couplers, and a third module provided with a fourth coupler, where an input/output connection line is connected to a first end, and either a ground line or an input/output connection line to which an inverse signal of a signal to be inputted into the above-described first end is connected to a second end, on an insulating substrate is layered so that the above-described first coupler and the above-described fourth coupler overlap at least partially as viewed in the direction in which the above-described third module is layered, and signal coupling occurs using capacitive coupling and inductive coupling between the above-described first coupler and the above-described fourth coupler.

Thus, the first coupler may be formed so as to have such a length that can correspond to at least two couplers instead of the provision of a third coupler, and as a result, a multi-drop bus for communication with a number of modules can be formed.

(20) In addition, the present invention provides any of the above (1) to (4), which are characterized in that a third module provided with a third coupler, where an input/output connection line is connected to a first end, and either a ground line or an input/output connection line to which an inverse signal of a signal to be inputted into the input/output connection line connected to the above-described first end is connected to a second end, is layered on a surface of the above-described first insulating substrate on the side opposite to a surface on which the above-described second module is layered so that signal coupling occurs using capacitive coupling and inductive coupling between the above-described first coupler and the above-described third coupler.

Such a structure can also make communication between a number of modules possible. In this case, direct communication between the second coupler and the third coupler is blocked because the first coupler works as a shield.

(21) Furthermore, the present invention provides any of the above (17), (19), or (20), which are characterized in that the above-described first module is equipped with a semiconductor integrated circuit apparatus that works as a microprocessor, and the above-described second module and the above-described third module are equipped with a semiconductor integrated circuit apparatus that works as a semiconductor memory apparatus for communicating with the above-described microprocessor.

Thus, as a typical example of communication using three or more modules, communication between one microprocessor and a number of semiconductor integrated circuit apparatuses controlled by the microprocessor can be cited.

(22) Moreover, the present invention provides any of the above (1) to (4), which are characterized in that a dielectric body in plate form for intensifying the electromagnetic field coupling is inserted between the above-described first coupler and the above-described second coupler. Thus, the dielectric body in plate form is inserted between the first coupler and the second coupler so that electromagnetic field coupling is possible between the first coupler and the second coupler even when the distance between the two is great.

(23) In addition, the present invention provides the above (17) or (18), which are characterized in that the above-described first coupler and the above-described third coupler are formed of two couplers and are terminal resistors for linking the two couplers respectively. Thus, the first coupler and the third coupler that form a closed circuit are respectively formed of two couplers and a terminal resistor for linking the two couplers so that the evenness of the degree of coupling can be maintained for a broadband and signal distortion can be reduced.

(24) Furthermore, the present invention provides either the above (1) or (4), which are characterized in that the above-described first coupler and the above-described second coupler are couplers in arc form having the same curvature radius. Thus, the first coupler and the second coupler are couplers in arc form so that lead transmission lines from the first module and the second module can be led out at an arbitrary angle.

(25) Moreover, the present invention provides the above (24), which is characterized in that the center of the above-described second coupler in the above-described second module matches with the center of the above-described first coupler in the above-described first module, and the above-described second module is freely rotatable around the above-described first module. Thus, the second module is provided so as to be freely rotatable around the first module, which makes communication between the operating members through electromagnetic field coupling possible.

(26) In addition, the present invention provides the above (24) or (25), which are characterized in that the length of an arc of the above-described second coupler is shorter than the length of an arc of the above-described first coupler. Thus, in the case of couplers in arc form, a good degree of coupling can be maintained even when the length of the arc in each coupler is not the same.

(27) Furthermore, the present invention provides any of the above (1) to (4), which are characterized by further having: a third module having a third coupler provided on a third insulating substrate, where an input/output connection line is connected to a first end, and either a ground line or an input/output connection line to which an inverse signal of a signal to be inputted into the input/output connection line connected to the above-described first end is connected to a second end, wherein the above-described first to third modules are layered on top of each other so that the above-described first coupler, the above-described second coupler, and the above-described third coupler overlap at least partially as viewed in the direction in which the above-described first to third modules are layered on top of each other, and signal coupling occurs using capacitive coupling and inductive coupling between the above-described first coupler, the above-described second coupler, and the above-described third coupler.

In this manner, the three modules can be layered on top of each other so that the couplers overlap in the direction in which the modules are layered, and thus, a multi-drop bus can be formed with any one module acting as a bus. As a result, it is possible for the module acting as a bus to simultaneously communicate with the other two modules.

(28) Moreover, the present invention provides any of the above (1) to (4), which are characterized in that a third module having a third coupler is layered on a surface of the above-described first insulating substrate on the side opposite to a surface on which the above-described first module is layered so that a longitudinal direction of the above-described first coupler and a longitudinal direction of the third coupler cross at right angles. Thus, the third coupler can be provided on the rear surface of the same substrate so as to prevent electromagnetic interference between the first coupler and the third coupler.

(29) In addition, the present invention provides a directional coupling communication apparatus, which is characterized by having: a first coupler in arc form provided on a first insulating substrate, where an input/output connection line is connected to a first end, and either a ground line or an input/output connection line to which an inverse signal of a signal to be inputted to the input/output connection line connected to the above-described first end is inputted is connected; and a second coupler in arc form, where an input/output connection line is connected to a first end, and either a ground line or an input/output connection line to which an inverse signal of a signal to be inputted to the input/output connection line connected to the above-described first end is inputted is connected, wherein the diameter of a coupler in the above-described second coupler is smaller than the diameter of a coupler in the above-described first coupler, and the above-described second coupler is incorporated inside the above-described first coupler so as to be freely rotatable around the above-described first coupler in a concentric manner. Thus, the second coupler can be incorporated inside the first coupler so as to be freely rotatable around the first coupler in a concentric manner and work as an electromagnetic field connector in the rotatable portion.

(30) Furthermore, the present invention provides the above (26) or (29), which are characterized in that the above-described first coupler and the above-described second coupler are provided to a hinge portion of a housing that can be freely opened and closed. Thus, as an electromagnetic field connector in the rotatable portion, a connector is typically provided in a hinge portion of a housing that can be freely opened and closed.

Effects of the Invention

The disclosed directional coupling communication apparatus makes matching easier as a coupling impedance so as to reduce reflection, and makes it possible for the communication channel to be faster (broadband) than inductive coupling and for the signal intensity to be increased so as to improve the reliability of communication.

BRIEF DESCRIPTION OF THE DRAWINGS

FIGS. 5A to 5F are graphs for showing the operational principle (2) of the directional coupling communication apparatus according to the embodiment of the present invention;

FIG. 10 is a circuit diagram showing the transmitter/receiver circuit used in Example 1 of the present invention;

FIGS. 36A to 36D are graphs for showing the operational principle (3) of the directional coupling communication apparatus according to Example 18 of the present invention;

FIGS. 51A to 51C are schematic diagrams showing the structure of the directional coupling differential communication apparatus according to Example 29 of the present invention;

PREFERRED EMBODIMENTS OF THE INVENTION

Figure 1:
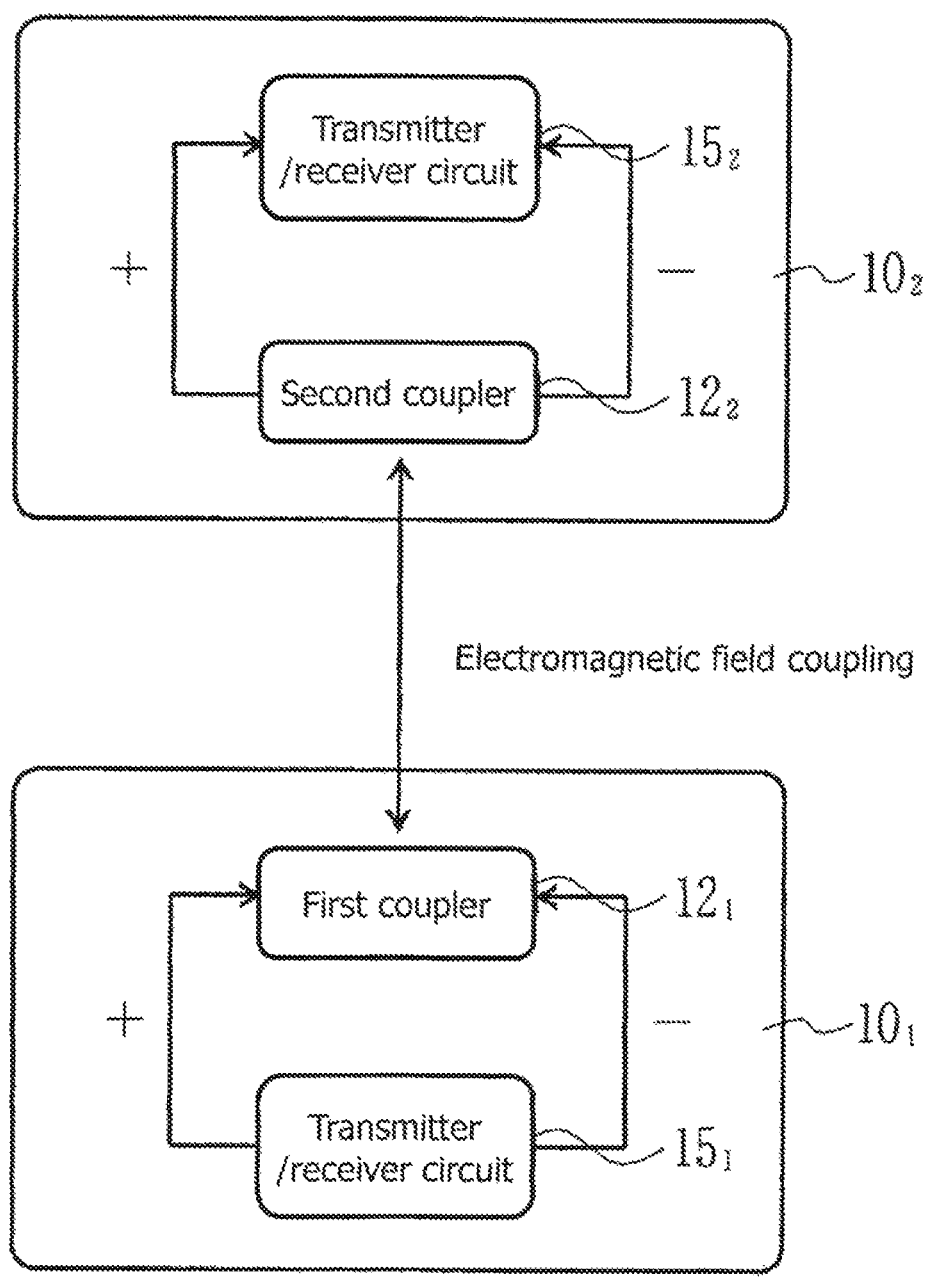
FIG. 1 is a schematic diagram showing the structure of the directional coupling communication apparatus according to an embodiment of the present invention.

The directional coupling communication apparatus according to an embodiment of the present invention is described below in reference to FIGS. 1 to 6D. FIG. 1 is a schematic diagram showing the structure of the directional coupling communication apparatus according to an embodiment of the present invention, where a first module $10_1$ having a first coupler $12_1$ and a transmitter/receiver circuit $15_1$ and a second module $10_2$ having a second coupler $12_2$ and a transmitter/receiver circuit $15_2$ are layered on top of each other in such a manner that the first coupler $12_1$ and the second coupler $12_2$ at least partially overlap in the direction in which the first module $10_1$ and the second module $10_2$ are layered on top of each other, and thus, signal coupling is generated between the first coupler $12_1$ and the second coupler $12_2$ through electromagnetic field coupling, that is to say, capacitive coupling and inductive coupling. Though not necessary, it is desirable to achieve impedance matching by adjusting the input/output impedance of the transmitter/receiver circuit $15_1$ and the transmitter/receiver circuit $15_2$ so that it is equal to the coupling impedance $Z_{0\text{-}coupled}$ during the time when the first coupler $12_1$ and the second coupler $12_2$ are in a coupled state.

The objects to which the present invention is applied is a field where the system is treated as a distributed constant circuit of which the assumption is that each coupler has a length longer than the signal wavelength, typically 1/10 of the signal wavelength or longer, and thus, the objects are totally different than coils that can be handled as a lumped constant circuit.

Figure 2A:
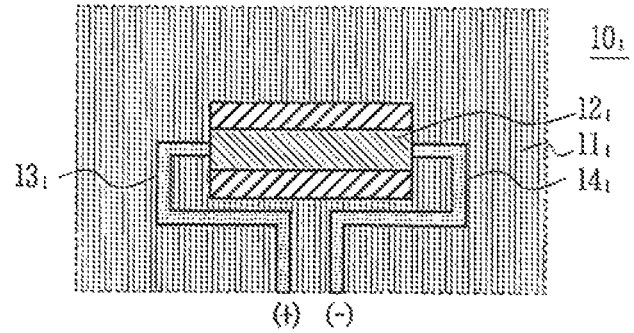
FIGS. 2A to 2C are schematic diagrams showing portions of the structure of the directional coupling communication apparatus according to the embodiment of the present invention.
Figure 2B:
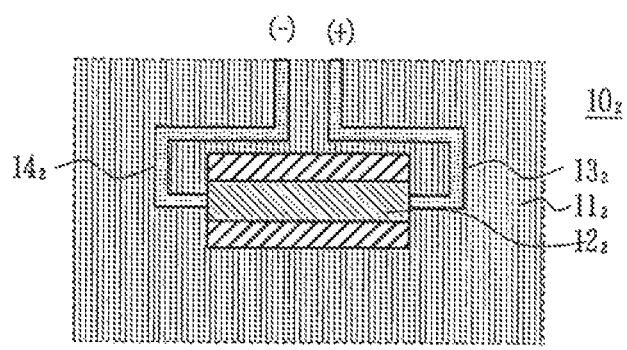
Figure 2C:
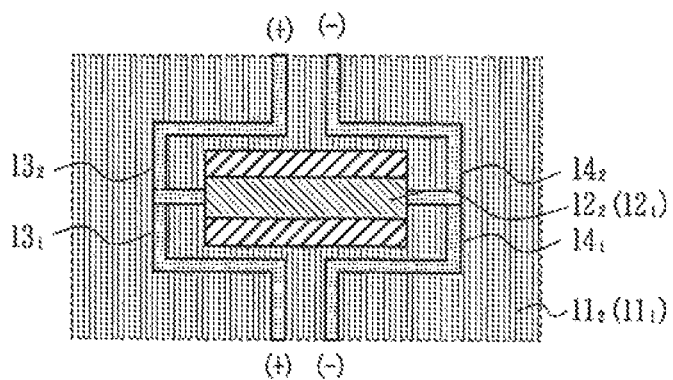

FIGS. 2A to 2C are schematic diagrams showing the structure of parts of the directional coupling communication apparatus according to the embodiment of the present invention, where FIG. 2A is a plan diagram showing the first module, FIG. 2B is a plan diagram showing the second module, and FIG. 2C is a perspective plan diagram showing the second module in the case where it is layered inversely from front to rear. As shown in FIG. 2A, the first coupler $12_1$ is formed on a first insulating substrate $11_1$, and input/output connection lines $13_1$ and $14_1$ are connected to the two ends of the first coupler $12_1$. In addition, as shown in FIG. 2B, the second coupler $12_2$ is formed on a second insulating substrate $11_1$ in the same manner as in the first module $10_1$, where input/output connection lines $13_2$ and $14_2$ are connected to the two ends of the second coupler $12_2$. In this case, the input/output connection lines $13_2$ and $14_2$ are parts that do not effectively contribute to communication, and therefore are provided in such a manner that the coupled state is weaker than the electromagnetic field coupling between the first coupler $12_1$ and the second coupler $12_2$ that contribute to communication.

FIG. 2C is a perspective plan diagram showing the second module in the case where it is layered inversely from front to rear, where the direction in which the input/output connection lines $13_1$ and $14_1$ are led out from the first module $10_1$ and the direction in which the input/output connection lines $13_2$ and $14_2$ are led out from the second module $10_2$ are opposite to each other, and therefore, the electromagnetic field coupling between the input/output connection lines $13_1$, $14_1$, and the input/output connection lines $13_2$, $14_2$ can be greatly reduced.

Though the input/output connection lines $13_1$, $14_1$ and the input/output connection lines $13_2$, $14_2$ are formed as signal lines to which a distributed constant circuit is applied, bonding wires may be used. In addition, though the connection portions between the input/output connection lines $13_1$, $14_1$ and the input/output connection lines $13_2$, $14_2$ run in the direction of the long axes of the first coupler $12_1$ and the second coupler $12_2$, the input/output connection lines $13_1$, $14_1$ and the input/output connection lines $13_2$, $14_2$ may respectively be connected to the ends of sides of the first coupler $12_1$ and the second coupler $12_2$ along the long axis.

Furthermore, it is not necessary for the first coupler $12_1$ and the second coupler $12_2$ to have the same length, and they may have a length different from each other. Alternatively, the long axes of the first coupler $12_1$ and the second coupler $12_2$ may not be parallel to each other so that the margin for positioning at the time of layering can be increased. Moreover, it is not necessary for the first coupler $12_1$ and the second coupler $12_2$ to be rectangular, and for example, they may be in C shape where there are two bends. As another alternative, they may be in such a shape that the two ends of the C shape are bent so that the shape has four bends in total. Thus, the couplers have such a shape that the two ends are close to each other in such a manner that the connection portions between the coupler and the input/output connection lines are in close proximity, and therefore, the couplers having the same coupling length can be made compact.

Figure 3:
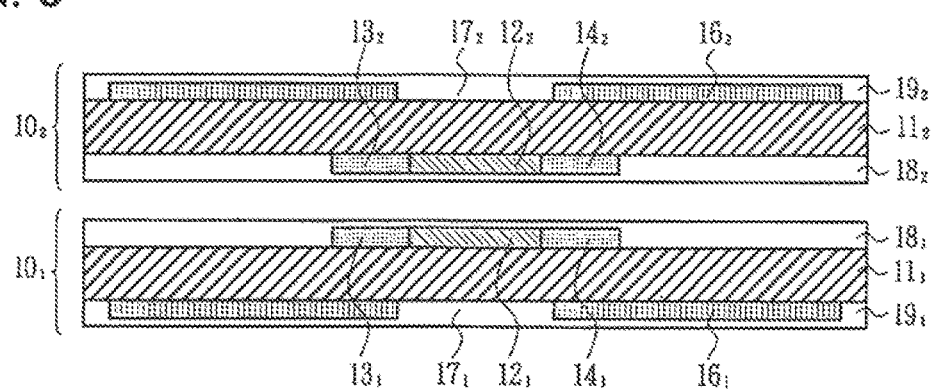
FIG. 3 is a schematic cross-sectional diagram showing the directional coupling communication apparatus according to the embodiment of the present invention.

FIG. 3 is a schematic cross-sectional diagram showing the directional coupling communication apparatus according to the embodiment of the present invention, where electromagnetic shield layers $16_1$ and $16_2$ are respectively formed on the rear surface of the first insulating substrate $11_1$ and the second insulating substrate $11_2$ having a relative dielectric constant $\varepsilon_2$, and missing portions $17_1$ and $17_2$ are provided in the portions of the electromagnetic shield layers $16_1$ and $16_2$ that face the first coupler $12_1$ and the second coupler $12_2$ in order to increase the degree of coupling.

In addition, surface layers $18_1$, $18_2$, $19_1$, and $19_2$ having a relative dielectric constant $\varepsilon_3$ are formed on the front and rear of the first insulating substrate $11_1$ and the second insulating substrate $11_2$ for protection. The first module $10_1$ and the second module $10_2$ are layered on top of each other so as to face each other with a space or an insulating film of which the relative dielectric constant is $\varepsilon_1$.

Resins such as a polyimide resin, an epoxy resin, a phenol resin, and an acryl resin may be used as the material for the first insulating substrate $11_1$, the second insulating substrate $11_2$, the surface layers $18_1$, $18_2$, $19_1$, $19_2$, and the insulating film, where it is desirable for the setting to be $\varepsilon_1 < \varepsilon_2 < \varepsilon_3$. In order to set the relative dielectric constant at any value, it may be adjusted by the selection of the type of base resin and additives. As for the substrates, flexible printed circuits (FPCs) having any of the above-described resins as a base are flexible and have a thickness as thin as approximately 75 μm, and thus are easily mounted in a small apparatus such as a mobile phone. However, the substrates are not limited to FPCs, and printed circuit boards (PCBs), semiconductor substrates, and substrates within a package may be used.

In the case where the dielectric constant between the coupler lines is lower than the dielectric constant of the material around the coupler lines, the crosstalk in the near ends becomes smaller and the crosstalk in the far ends becomes greater, and therefore, the reliability of communication can be secured by using the crosstalk between the far ends. As a result, a gap may be left between the two modules when they are provided in close proximity, for example, which has such an advantage that the connection of modules is easy and at a low cost. Alternatively, the selection of an insulating film at the time of close connection with an insulating film in between can be more varied.

Figure 4A:
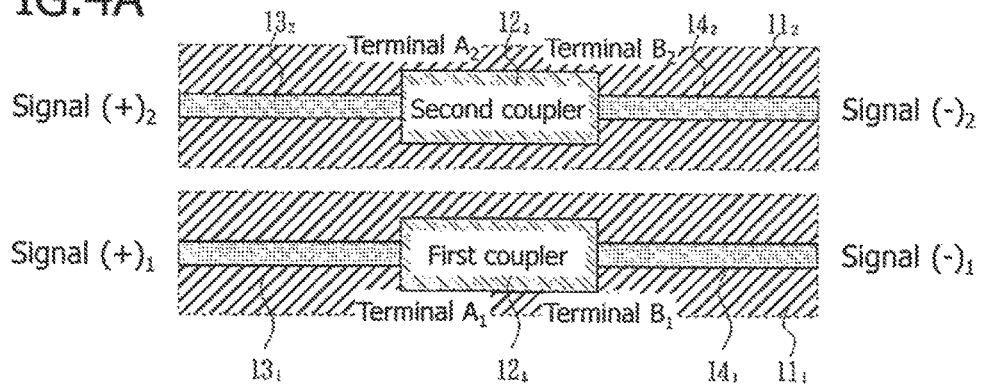
FIGS. 4A to 4C are a diagram and graphs for showing the operational principle (1) of the directional coupling communication apparatus according to the embodiment of the present invention.

Next, the operational principle of the directional coupling communication apparatus according to the embodiment of the present invention is described in reference to FIGS. 4A to 6D. First, as shown in FIG. 4A, the input end for a $(+)_1$ signal of the first coupler $12_1$ is terminal $A_1$, and the input end for a $(-)_1$ signal of the first coupler $12_1$ is terminal $B_1$. Likewise, the output end for a $(+)_2$ signal of the second coupler $12_2$ is terminal $A_2$, and the output end for a $(-)_2$ signal of the second coupler $12_2$ is terminal $B_2$.

Figure 4B:
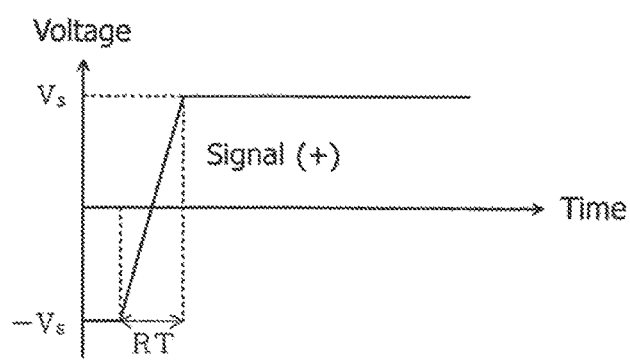
Figure 4C:
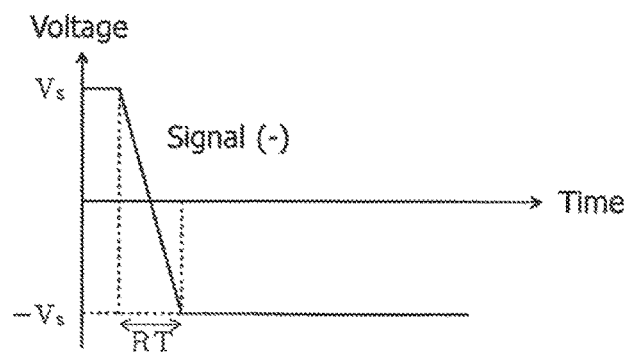

FIG. 4B is a waveform diagram showing an example of the $(+)_1$ signal, and FIG. 4C is a waveform diagram showing the $(-)_1$ signal having an opposite polarity and corresponding to the $(+)_1$ signal, where the $(+)_1$ signal and the $(-)_1$ signal form a differential signal. Here, the signal waveform has an amount of time RT respectively for rising and falling.

When the signal $(+)_1$ propagates from the terminal $A_1$ of the first coupler $12_1$ towards the terminal $B_1$, the current and the voltage change at the crest of a wave of the signal that propagates. Mutual capacitance C and mutual inductance M exist continuously between the first coupler $12_1$ and the second coupler $12_2$, and therefore, a capacitive coupling current and an inductive coupling current are induced in the second coupler $12_2$ so as to flow due to the coupling effects of i=C (dv/dt) and v=L (di/dt).

After a displacement current flows from the first coupler $12_1$ to the second coupler $12_2$, the impedance of the second coupler $12_2$ is equal as viewed in the left and right directions from that point, and therefore, the capacitive coupling current branches equally to the left and right and flows to the two ends. That is to say, half of the capacitive coupling current returns back to the near end (terminal $A_2$) and the other half proceeds to the far end (terminal $B_2$). Either current generates a positive voltage signal in the terminal resistor located in the point to which the current flows. Here, there are terminal resistors for matching termination in the transmitter/receiver circuit $15_1$ and $15_2$ shown in FIG. 1.

The signal that returns back to the near end (terminal $A_2$) has a waveform shown in FIG. 5A since the crest of the wave that is its current signal source proceeds from the terminal $A_1$ towards the terminal $B_1$ through the first coupler $12_1$ while returning back towards the terminal $A_2$ through the second coupler $12_2$ at the same speed.

That is to say, a signal that propagates through the first coupler $12_1$ completely enters into the first coupler $12_1$ after the amount of time RT for the wave to rise since the crest of the wave of the signal has entered into the terminal $A_1$, and while the signal propagates towards the terminal $B_1$, half of the displacement current that has emitted from the current signal source that progresses towards the terminal $B_1$ returns back towards the terminal $A_2$ at the same speed, and therefore, the terminal $A_z$ has a constant current value. When the time it takes for the signal $(+)_1$ to propagate from the terminal $A_1$ to the terminal $B_2$ is TD, at the point in time when the signal has reached the terminal $B_1$, half of the displacement current that has moved to the second coupler $12_2$ returns to the terminal $A_2$ of the second coupler $12_2$, taking additional time TD, and therefore, the coupling signal $(+)_2$ that appears at the terminal $A_2$ becomes a pulse signal with a time width of 2TD as shown in FIG. 5A.

In addition, the remaining half of the current that progresses towards the terminal $B_2$ reaches the terminal $B_2$ after TD while accumulating the amount of current together with the current signal source since it progresses towards the terminal $B_1$, and thus, a waveform as shown in FIG. 5B is provided.

Meanwhile, the inductive coupling current is a current that flows due to the voltage supply that is induced in the second coupler $12_2$ through inductive coupling, and the direction thereof is opposite to the direction of the current loop in the first coupler $12_1$ and is directed from the terminal $B_2$ to the terminal $A_2$ macroscopically, and thus, a waveform as shown in FIG. 5C is provided. Accordingly, the signal generated at the terminal $A_2$ through inductive coupling has the same symbol as the signal generated at the terminal $A_2$ through capacitive coupling so that the signals strengthen each other and a waveform as shown in FIG. 5E is provided.

Furthermore, the signal generated at the terminal $B_2$ has the symbol opposite to that of the signal generated at the terminal $B_2$ through capacitive coupling as shown in FIG. 5D so that the signals weaken each other, and as a result, as shown in FIG. 5F, a negative signal propagates through the terminal $B_2$ in many cases.

Figure 6A:
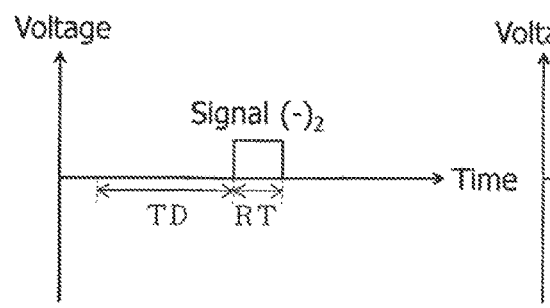
FIGS. 6A to 6D are graphs for showing the operational principle (3) of the directional coupling communication apparatus according to the embodiment of the present invention.
Figure 6B:
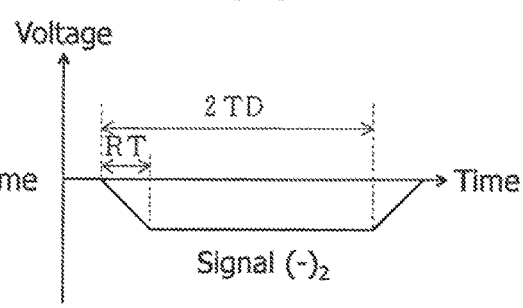

That is to say, the signal $(+)_1$ that has been inputted from the terminal $A_1$ generates a coupling signal $(+)_2$ having the same polarity applied to the terminal $A_2$ by means of the coupler, and at the same time generates the coupling signal $(+)_2$ having the opposite polarity at the terminal $B_2$. Meanwhile, the signal $(-)_1$ that has been inputted from the terminal $B_1$ generates a coupling signal $(-)_2$ having the opposite polarity at the terminal $A_2$ by means of the coupler as shown in FIG. 6A and generates a coupling signal $(-)_2$ having the same polarity at the terminal $B_2$ as shown in FIG. 6B.

Figure 6C:
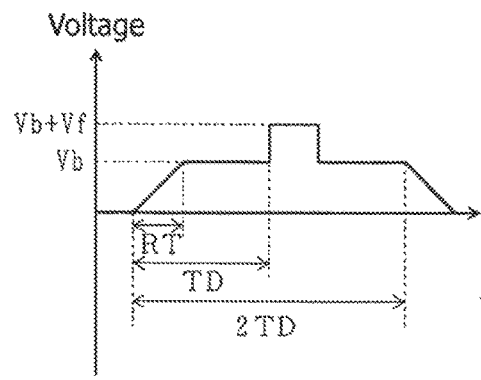
Figure 6D:
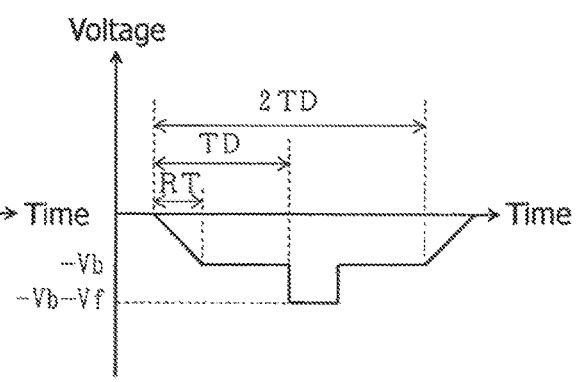

Accordingly, at the terminal $A_2$, the coupling signal $(+)_2$ and the coupling signal $(-)_2$ both have the same polarity as the signal $(+)_1$ so as to strengthen each other and generate the signal in FIG. 6C through overlapping. Likewise, at the terminal $B_2$, the coupling signal $(+)_2$ and the coupling signal $(-)_2$ both have a polarity opposite to the signal $(+)_1$ so as to strengthen each other and generate the signal in FIG. 6D through overlapping. As a result, the digital signal that has been inputted into the first module $10_1$ can be received by the second module $10_2$ in the case where the polarity is determined near the center of the differential signal $(+)_2-(-)_2$.

Here, when the signal $(+)_1$ that has been inputted from the terminal $A_1$ generates a coupling signal $(+)_2$ having the same polarity at the terminal $A_2$ by means of a coupler, this is referred to as crosstalk in the near ends, and when it generates a coupling signal $(+)_2$ having the opposite polarity at the terminal $B_2$, this is referred to as crosstalk in the far ends. That is to say, when the signal $(-)_1$ that has been inputted from the terminal $B_1$ generates a coupling signal $(-)_2$ having the opposite polarity at the terminal $A_2$ by means of a coupler, this is referred to as crosstalk in the far ends, and when it generates a coupling signal $(-)_2$ having the same polarity at the terminal $B_2$, this is referred to as crosstalk in the near ends.

In conventional differential couplers, only crosstalk in the near ends is used for communication, and crosstalk in the far ends is consumed as heat through the terminal resistor, and thus cannot be used for communication. Meanwhile, in the directional coupling differential communication apparatus according to the embodiment of the present invention, crosstalk in the far ends between differential signals having a polarity opposite to each other is also used, and therefore, the received signal can be increased.

Here, in the couplers, copper foil having a thickness of approximately 20 μm formed on the two surfaces of a substrate and vias that penetrate through the substrate are created through a printing process so that transmission lines for the signal may be provided. The characteristic impedance of the transmission lines is generally 50Ω but may have other values.

When the application for data communication between the display module and the motherboard in a portable phone is assumed, the communication distance (distance between couplers) is approximately 0.1 mm, but the same structure can be used in the case where the distance is from several mm to several cm.

Though a typical example relates to the connection between two modules, the number of modules may be three or more. The present invention also includes a case of communication between three semiconductor chips of which two semiconductor chips are mounted on the two surfaces of a PCB as shown in the below-described Example 15, for example, so that the transmission lines that form a coupler provided on the PCB and the transmission lines on the two semiconductor chips are coupled to each other while the remaining semiconductor chip is connected to the transmission lines provided on the PCB. In this case, semiconductor chips may be combined in any form, and as an example, a semiconductor chip connected to the transmission lines provided on a PCB can be a microprocessor and the other semiconductor chips can be memory chips.

Here, in order to increase the coupling efficiency between the first coupler and the second coupler, a dielectric body in plate form may be inserted between the first coupler and the second coupler, which makes electromagnetic field coupling possible even in the case where the first coupler and the second coupler have a gap that is relatively large.

In the case where a third coupler is provided on the first insulating substrate so as to form a closed circuit, the first coupler and the third coupler are respectively formed of two couplers and a terminal resistor for linking the two couplers so that a standing wave attenuates and the flatness of the coupling degree can be maintained in the broadband, which makes it possible to remove signal distortion.

Furthermore, the above-described first coupler and second coupler are couplers in arc form having the same radius of curvature so that lead transmission lines of the first module and the second module can be led out at a free angle.

In this case, the center of the second coupler in the second module matches with the center of the first coupler of the first module, and the second module is provided so as to be rotatable relative to the first module, thereby making communication possible between the operational members through electromagnetic field coupling.

In the case of couplers in arc form, the length of the arc of the second coupler may be shorter than the length of the arc of the first coupler, and thus, an excellent degree of coupling can be maintained even in the case where the length of the arc of each coupler is not the same.

A third module having a third coupler, where an input/output connection line is connected to a first end provided on a third insulating substrate and either a ground line or an input/output connection line to which an inverse signal of the signal inputted through the input/output connection line connected to the above-described first end is inputted is connected to a second end, may further be provided, and the first to third modules can be layered on top of each other so that the first coupler, the second coupler, and the third coupler at least partially overlap as viewed in the direction in which the modules are layered on top of each other, and signal coupling is generated between the first coupler, the second coupler, and the third coupler using capacitive coupling and inductive coupling.

The three modules are layered on top of each other in this manner so that the couplers overlap in the direction in which the modules are layered on top of each other, and thus, a multi-drop bus can be formed using any one module as a bus. As a result, simultaneous communication becomes possible between the module that works as a bus and the other two modules.

In the case where a third coupler is provided on the rear surface of the first insulating substrate, a third module with a third coupler may be layered in such a manner that the longitudinal direction of the first coupler crosses the longitudinal direction of the third coupler at right angles so that electromagnetic interference between the first coupler and the third coupler can be prevented.

A second coupler in arc form, where an input/output connection line is connected to a first end and either a ground line or an input/output connection line to which an inverse signal of the signal inputted through the input/output connection line connected to the above-described first end is inputted is connected to a second end, may be built inside a first coupler in arc form, where an input/output connection line is connected to a first end provided on a first insulating substrate and either a ground line or an input/output connection line to which an inverse signal of the signal inputted through the input/output connection line connected to the above-described first end is inputted is connected to a second end, so as to be rotatable around the first coupler in a concentric manner, and thus, the couplers can work as an electromagnetic field connector in the rotatable portion.

In this case, the first coupler and the second coupler typically form a connector in the hinge of a housing that can be opened and closed as a electromagnetic field connector in the rotatable portion.

In summary, the directional coupling communication apparatus according to the embodiment of the present invention can provide the following working effects:

1) A coupler where four signal lines and two terminal resistors are necessary according to the prior art can be formed of two signal lines.

2) Since the number of lines for capacitive and inductive coupling is two, it is relatively easy to match the coupling impedance as compared to a conventional case where four signal lines are capacitively and inductively coupled to each other.

3) Signal reflection does not occur because matching termination can be achieved using a variable resistor provided in the transmitter/receiver circuit.

4) The signal is intensified through the crosstalk in the far ends, and therefore, the reliability of communication increases.

5) Since (+) and (−) signals are always applied to the two ends of a coupler, the common signal does not change, making unnecessary radiation (noise) smaller.

Example 1

Figure 7A:
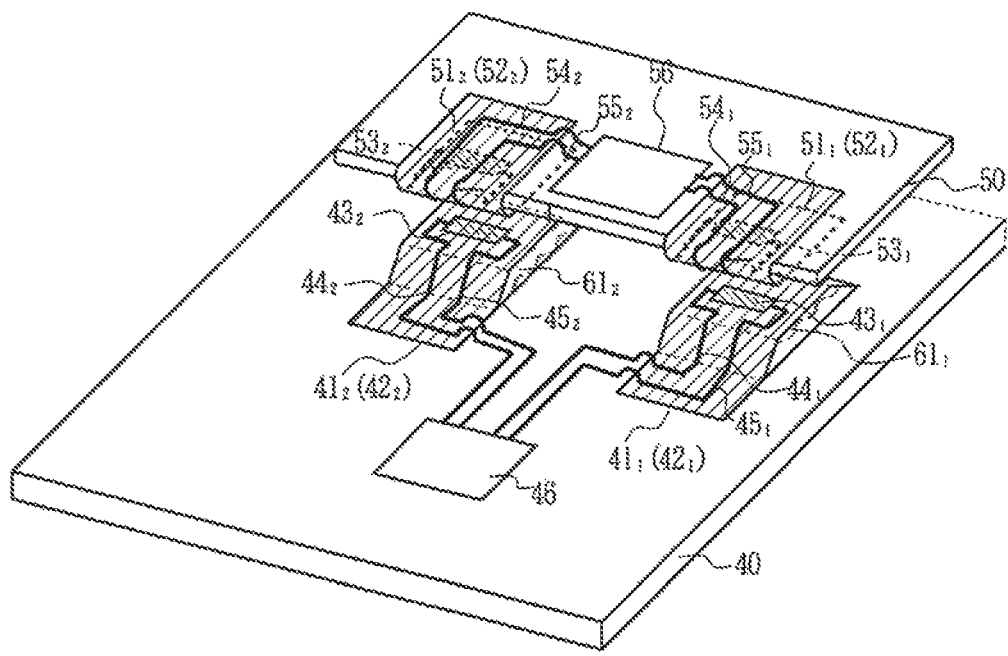
FIGS. 7A and 7B are diagrams showing the structure of the directional coupling differential communication apparatus according to Example 1 of the present invention.

Next, the directional coupling differential communication apparatus according to Example 1 of the present invention is described in reference to FIGS. 7A to 9. FIGS. 7A and 7B are diagrams showing the structure of the directional coupling differential communication apparatus according to Example 1 of the present invention, where FIG. 7A is a schematic perspective diagram which illustrates an example of the interface realized between modules of the main substrate (motherboard) and a child substrate. For example, coupler components $41_1$ and $41_2$ using FPCs $42_1$ and $42_2$ are installed on the main substrate 40 in a mobile phone while coupler components $51_1$ and $51_2$ using FPCs $52_1$ and $52_2$ are installed on the rear surface of the display module (child substrate) 50.

The coupler components $41_1$, $41_2$, $51_1$, and $51_2$ are respectively provided with couplers $43_1$, $43_2$, $53_1$, and $53_2$, which are respectively connected to transmitter/receiver circuits 46 and 56 via lead transmission lines $44_1$, $44_2$, $45_1$, $45_2$, $54_1$, $54_2$, $55_1$, and $55_2$. Here, terrace members $61_1$ and $61_2$ provided on the main substrate 40 are used so that the couplers $43_1$ and $43_2$ provided on the coupler components $41_1$ and $41_2$ are installed in the proximity of the couplers $53_1$ and $53_2$ provided in the coupler components $51_1$ and $51_2$ in the structure. The main substrate 40 and the child substrate 50 are layered on top of each other using a support member 62. In the following examples, including this example, the setting allows the coupling impedance $Z_{0\text{-}coupled}$ to be matched in the electromagnetic field coupling between couplers that face each other.

Figure 8A:
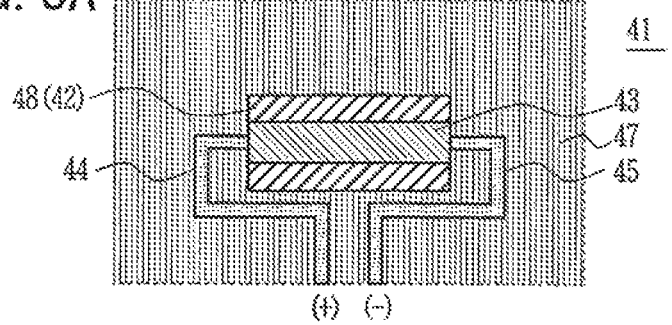
FIGS. 8A to 8C are diagrams showing the structure of coupler elements used in Example 1 of the present invention.
Figure 8B:
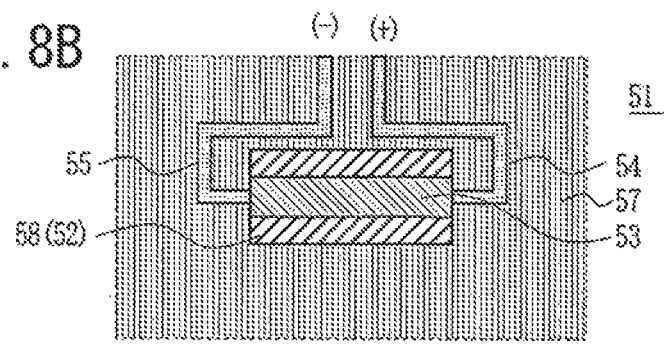
Figure 8C:
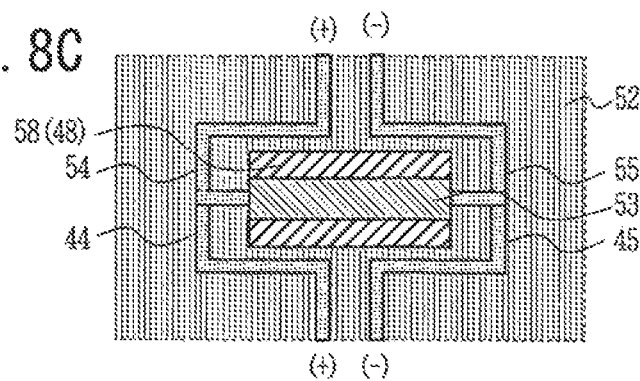
Figure 9:
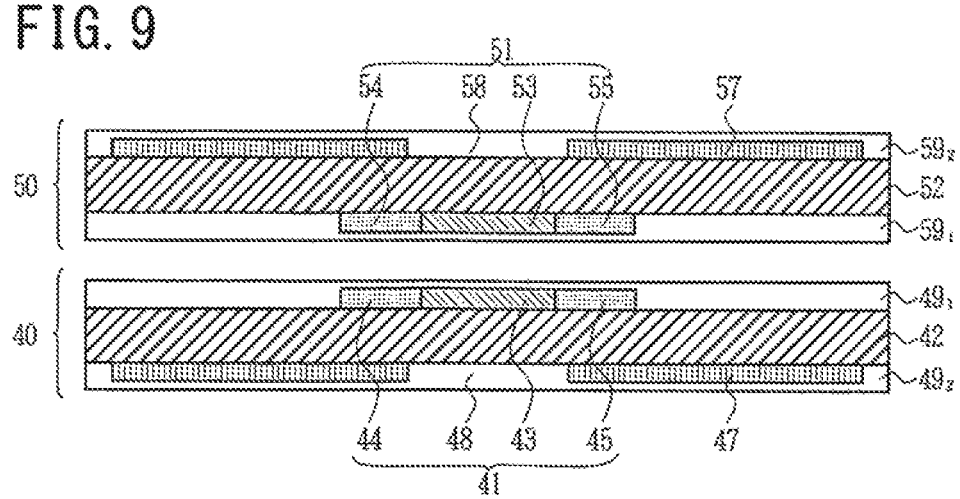
FIG. 9 is a cross-sectional diagram showing the state of the layers of the coupler elements used in Example 1 of the present invention.

FIGS. 8A to 9 are diagrams showing coupler components used in Example 1 of the present invention, where FIG. 8A is a plan diagram showing the coupler component provided on the main substrate side, FIG. 8B is a plan diagram showing the coupler component provided on the child substrate side, and FIG. 8C is a perspective plan diagram showing a case where coupler components are layered on top of each other with the one on the child substrate side being inverted. In the coupler component 41, the copper foil on one surface is patterned to form a coupler 43 and lead transmission lines 44 and 45 while a plane 47 is formed on the other surface.

The dimensions of the coupler 43 are different between the cases where the substrate is an FPC or a PCB and vary in accordance with the communication distance and the communication speed. An example can be cited where the length is 5 mm and the width is 0.5 mm. In an example of the dimensions of the lead transmission lines 44 and 45, the width is 0.3 mm, and close coupling can be achieved in places where two lead transmission lines 44 and 45 are provided in close proximity with a distance that is three times or less greater than the width.

A differential signal is inputted to the two ends of the coupler on the transmitter side while a differential signal is outputted from the two ends of the coupler on the receiver side. It is desirable for the lead transmission lines for connecting the transmitter to the coupler and the lead transmission lines for connecting the coupler to the receiver to have an equal length so that the delay of the signal is the same. When the lead transmission lines 44 and 45 go out from the two ends of the coupler 43 and are bent so as to return to the center of the coupler 43, the coupler 43 and the lead transmission lines 44 and 45 are sufficiently spaced away from each other, such as by approximately three times the width, in order to prevent capacitive and inductive coupling. In the case where the width of the coupler 43 is 0.5 mm and the width of the lead transmission lines 44 and 45 is 0.3 mm, for example, it is desirable for them to be spaced away from each other by 1 mm to 1.5 mm or more.

In contrast, when the coupler 43 and the lead transmission lines 44 and 45 are spaced away too far from each other, they are in coil form having an inductance component which resonates with the parasitic capacitance. In the case where the band that can be used for communication is broadened by making the resonant frequency sufficiently high, it is effective to reduce the area surrounded by the coupler 43 and the lead transmission lines 44 and 45 so that the inductance component becomes smaller. In the case where the coil is quadrangular, the inductance is determined by the shorter sides, and therefore, it is effective to narrow down the distance between the coupler 43 and the lead transmission lines 44 and 45.

In addition, the plane 47 provided on the surface on the opposite side has a missing portion 48 only in the portion that faces the coupler 43. As a result, the degree of coupling by the coupler 43 can be increased. In the case of a PCB, the substrate is thick, and this makes the effects from the plane sufficiently small when the two couplers are placed sufficiently close to each other, and therefore, it is not necessary to cut out the plane on the side opposite to the couplers.

As shown in FIG. 8B, the coupler component provided on the child substrate side has the same shape as the coupler component shown in FIG. 8A. In the case where the child substrate and the parent substrate are layered on top of each other as shown in FIG. 8C, the two lead transmission lines 44 and 45 or 54 and 55 are provided so as to be away from each other and so as not to overlap in the direction in which the substrates are layered on top of each other in order to sufficiently reduce the coupling between the lead transmission lines 44 and 45 or between the lead transmission lines 54 and 55.

FIG. 9 is a cross-sectional diagram showing the state where the child substrate and the parent substrate are layered on top of each other, where the surface layers $49_1$, $49_2$, $59_1$, and $59_2$ are provided for protection on the two surfaces of the FPCs 42 and 52, which are placed so as to face each other with a gap in between. The width of the gap is from 0 mm to several cm. The substrates may be pasted to each other with an adhesive or the like so that the coupler 43 and the coupler 53 overlap in the direction in which the substrates are layered on top of each other with an insulating film made of the same material as a surface layer of an FPC or polyethylene terephthalate (PET) in between instead of having a gap.

FIG. 10 is a circuit diagram showing the transmitter/receiver circuit used in Example 1 of the present invention, where the upper side forms a transmitter circuit and the lower side forms a receiver circuit. The transmitter circuit transmits an NRZ (Non-Return to Zero) waveform.

Example 2

Figure 11A:
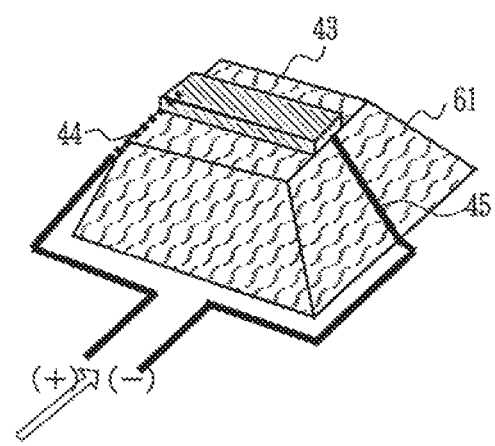
FIGS. 11A and 11B are diagrams showing the directional coupling differential communication apparatus according to Example 2 of the present invention.
Figure 11B:
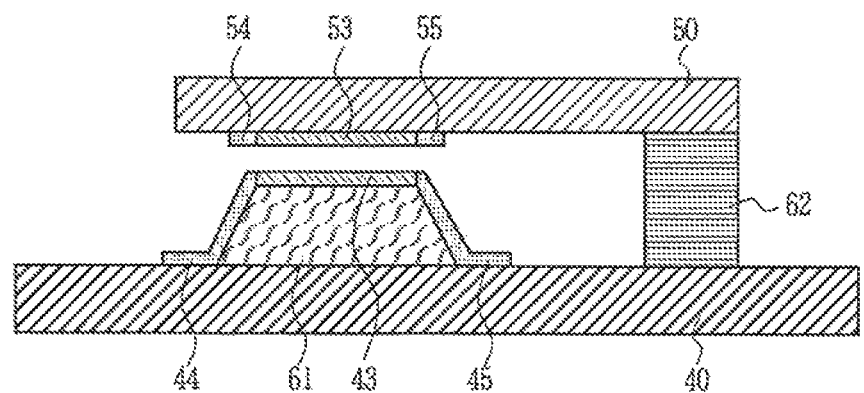

FIGS. 11A and 11B are diagrams illustrating the directional coupling differential communication apparatus according to Example 2 of the present invention. Here, only the difference from Example 1 is described. FIG. 11A is a perspective diagram showing the terrace member and its surroundings, and FIG. 11B is a cross-sectional diagram showing the same as in FIG. 11A as viewed in the direction of the arrow. As shown in the figures, the portions of the lead transmission lines 44 and 45 of the coupler component 41 provided on the parent substrate side are made to run along the sides of the terrace member 61 in close proximity to the connection portions.

Figure 7B:
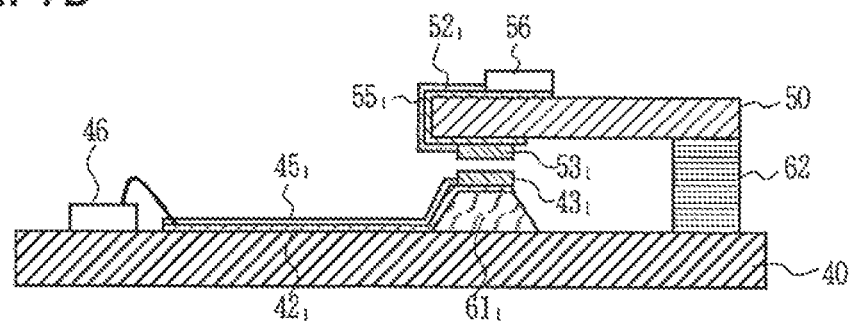

Meanwhile, the lead transmission lines 54 and 55 of the coupler component 51 on the child substrate side are in the same state as in FIGS. 7A and 7B, and therefore, the direction in which the lead transmission lines 44 and 45 run and the direction in which the lead transmission lines 54 and 55 run are different. Accordingly, the distance between the lead transmission lines 44 and 45 and the lead transmission lines 54 and 55 increases, and thus, the degree of coupling between the two can be greatly reduced.

Example 3

Figure 12A:
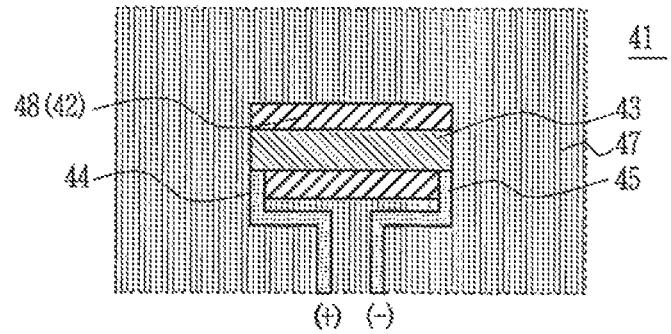
FIGS. 12A to 12C are diagrams showing the coupler elements for forming the directional coupling differential communication apparatus according to Example 3 of the present invention.
Figure 12B:
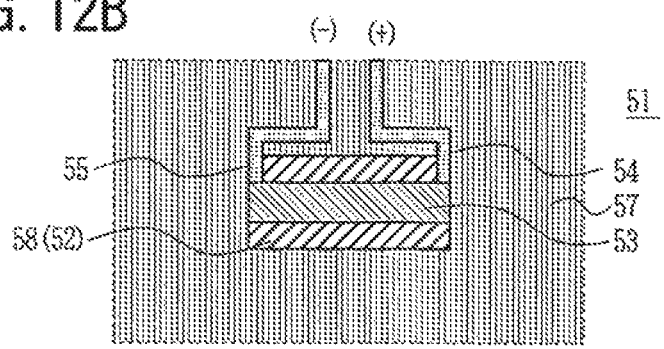
Figure 12C:
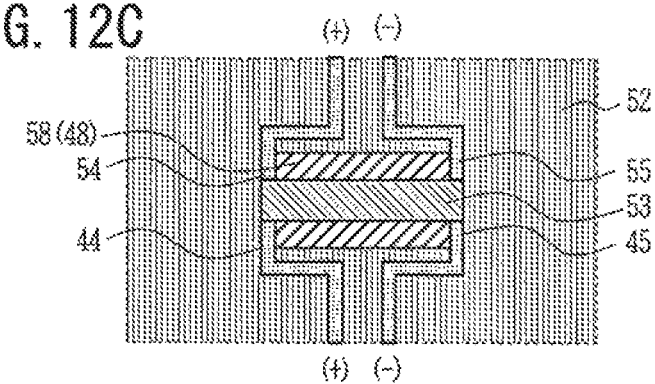

Next, the directional coupling differential communication apparatus according to Example 3 of the present invention is described in reference to FIGS. 12A to 12C. FIGS. 12A to 12C are diagrams illustrating the coupler components for forming the directional coupling differential communication apparatus according to Example 3 of the present invention, where FIG. 12A is a plan diagram showing a coupler component provided on the main substrate side, FIG. 12B is a plan diagram showing a coupler component provided on the child substrate side, and FIG. 12C is a perspective plan diagram showing a case where coupler components are layered on top of each other with the one on the child substrate side being inverted.

In Example 3, as shown in FIG. 12A or FIG. 12B, lead transmission lines 44, 45, 54, and 55 are connected to an end of a side of the couplers 43 and 53 along the long axis. This structure allows the lead transmission lines 44 and 45 to be completely prevented from overlapping the lead transmission lines 54 and 55 in the direction in which the coupler components are layered on top of each other in the case where the coupler components 41 and 51 are layered on top of each other as shown in FIG. 12C, and thus, there is an advantage that the coupling between lead transmission lines can further be reduced.

Meanwhile, the place through which a current flows in close proximity to the connection point between the coupler 43 or 53 and the lead transmission lines 44, 45, 54, or 55 is different between the coupler 43 and the coupler 53, and therefore, there is a possibility that the impedance is not equal between an end and the center of the coupler 43 or 53. Conversely, the effective width of the crossing portion is wider at the center of the crossing portion and narrower on the two sides, and therefore, it is possible to make the band broader.

Example 4

Figure 13:
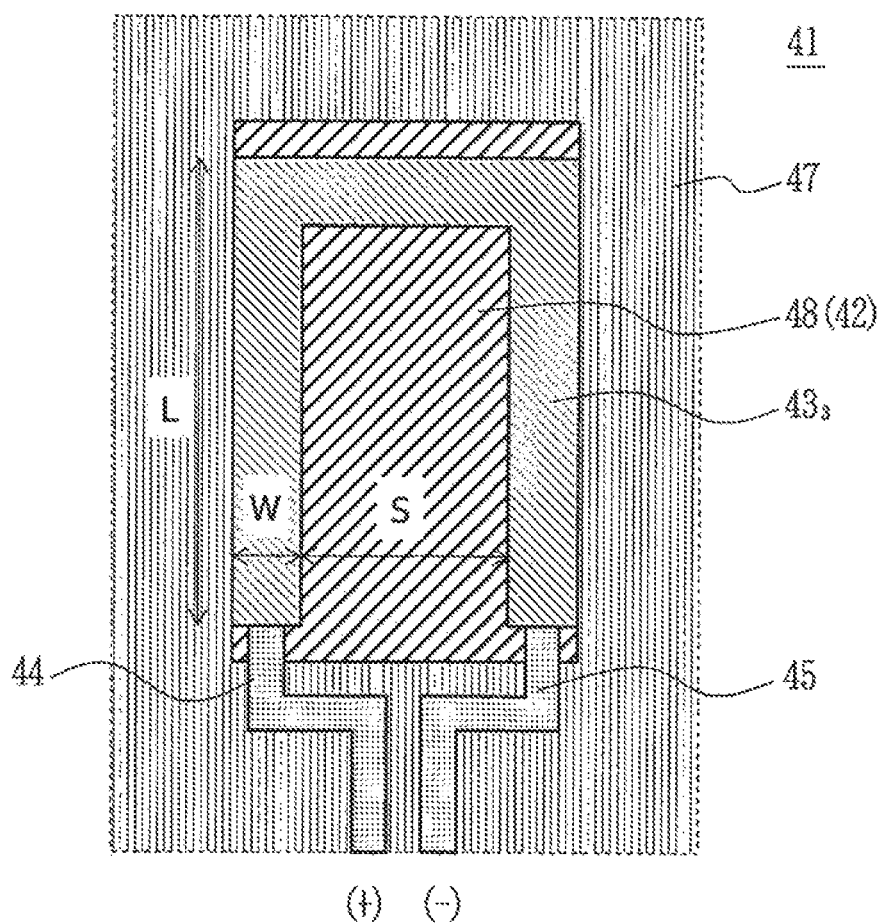
FIG. 13 is a plan diagram showing the coupler elements for forming the directional coupling differential communication apparatus according to Example 4 of the present invention.

Next, the directional coupling differential communication apparatus according to Example 4 of the present invention is described in reference to FIG. 13. FIG. 13 is a plan diagram showing a coupler component, where the coupler 43$_3$ is bent into a C shape so that the two ends of the coupler 43$_3$ come close to each other. Though in the following description a case where the coupler 43$_3$ is bent twice into a C shape is cited, all the cases where the coupler 43$_3$ is bent so that the two ends come close to each other, including a case where the number of times the coupler is bent is further increased, can be included in the present example.

Thus, the coupler 43$_3$ can be bent so as to reduce the area occupied by the coupler 43$_3$. In the case where the total length of the coupler 43$_3$ is 5 mm, for example, the length L can be shortened to approximately 2.5 mm by bending. Here, it is desirable for the distance S between the bent portions of the coupler 43$_3$ to be three times or more greater than the width W of the coupler 43$_3$ in order to prevent capacitive coupling and inductive coupling in the facing portions of the coupler 43$_3$. In the case when W=0.5 mm, for example, S=1.5 mm, and therefore, the length of the center portion of the coupler 43$_3$ is 2.0 mm (=1.5 mm+0.5 mm×2), taking the length of the center line into consideration, and the length L of the side portions is 1.5 mm [=(5 mm−2 mm)/2]. Though the coupler on the parent substrate side is described above, the coupler provided on the child substrate side has the same structure, and thus, the substrates are layered on top of each other so that the couplers overlap completely.

In Example 4, it is easier to connect the lead transmission lines 44 and 45, which are differential signal lines, to the coupler 43$_3$. That is to say, when the lead transmission lines 44 and 45 that approach from the bottom in FIG. 13 are connected to the coupler 43$_3$, the coupler in C shape can greatly reduce the indirect route portion, unlike the case where the coupler is linear as shown in Example 1 instead of being in a C shape, where the connection line to the lower terminal needs to have an indirect route because the differential signal lines connected to the two ends of the coupler should have the same wire length, and the distance in the direction in which signals arrive is closer to the lower terminal as compared to the upper terminal that is directly connected to the coupler.

Example 5

Figure 14A:
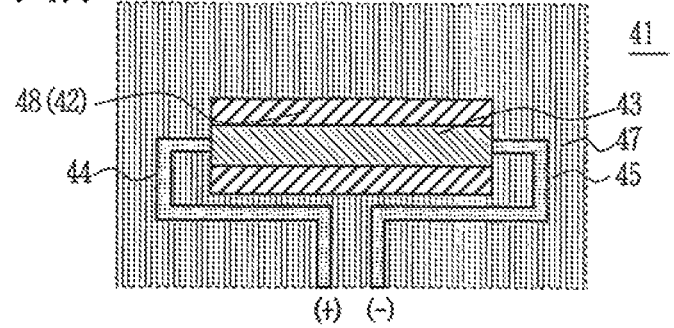
FIGS. 14A to 14C are diagrams showing the coupler elements for forming the directional coupling differential communication apparatus according to Example 5 of the present invention.
Figure 14B:
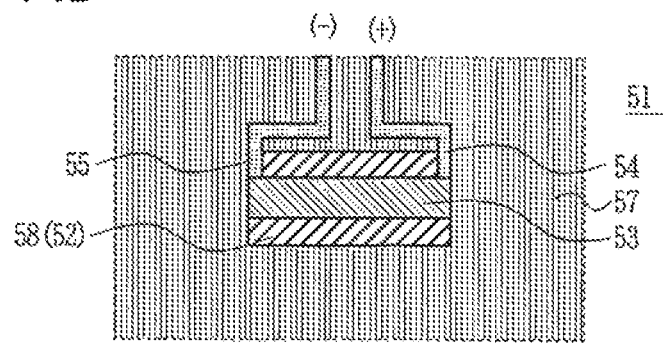
Figure 14C:
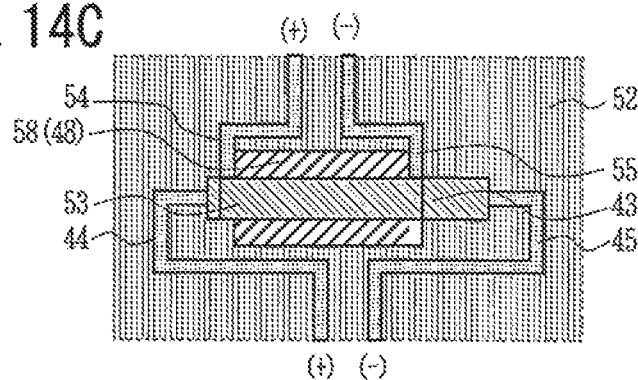

Next, the directional coupling differential communication apparatus according to Example 5 of the present invention is described in reference to FIGS. 14A to 14C. FIGS. 14A to 14C are diagrams for illustrating the coupler components for forming the directional coupling differential communication apparatus according to Example 5 of the present invention, where FIG. 14A is a plan diagram showing a coupler component provided on the main substrate side, FIG. 14B is a plan diagram showing a coupler component provided on the child substrate side, and FIG. 14C is a perspective plan diagram showing a case where coupler components are layered on top of each other with the one on the child substrate side being inverted.

As shown in FIG. 14A, the structure in Example 1 is adopted for the coupler component 41 provided on the main substrate side. As shown in FIG. 14B, the structure in Example 3 is adopted for the coupler component 51 provided on the main substrate side. In addition, the length of the coupler 43 is greater than the length of the coupler 53.

Thus, one coupler 43 is longer so that the other coupler 53 can be placed anywhere in the range of this length, which reduces the restriction for positioning. Alternatively, the module can be moved when communication is achieved or communication can be achieved while the module is moving. Here, the relationship of the difference between the lengths of the couplers may be opposite to each other. Likewise, the width of one coupler is greater so that the freedom for positioning can be increased in the direction of the width.

Example 6

Figure 15A:
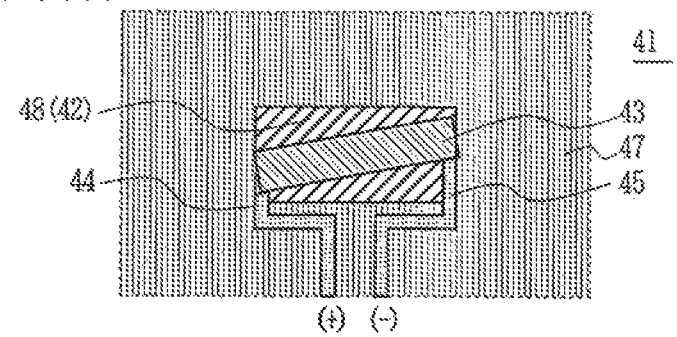
FIGS. 15A to 15C are diagrams showing the coupler elements for forming the directional coupling differential communication apparatus according to Example 6 of the present invention.
Figure 15B:
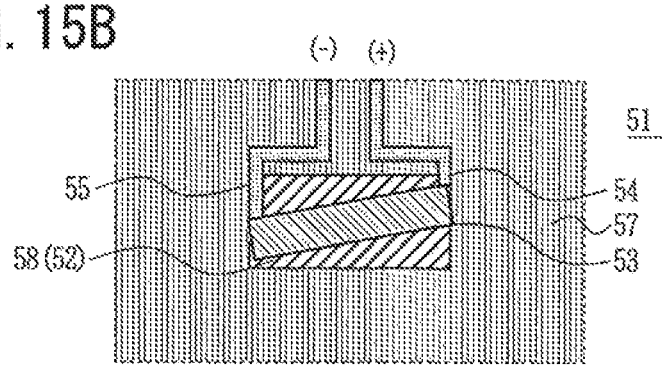
Figure 15C:
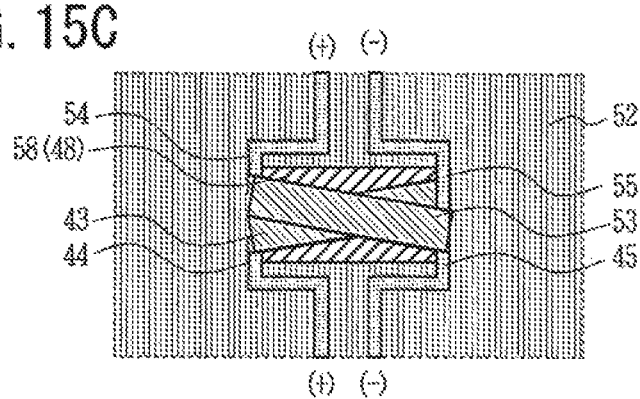

Next, the directional coupling differential communication apparatus according to Example 6 of the present invention is described in reference to FIGS. 15A to 15C. FIGS. 15A to 15C are diagrams illustrating the coupler components for forming the directional coupling differential communication apparatus according to Example 6 of the present invention, where FIG. 15A is a plan diagram showing the coupler component provided on the main substrate side, FIG. 15B is a plan diagram showing the coupler component provided on the child substrate side, and FIG. 15C is a perspective plan diagram showing a case where the coupler components are layered on top of each other with the one on the child substrate side being inverted.

In Example 6, as shown in FIG. 15C, the coupler component 41 and the coupler component 51 are formed so that the long axes of the coupler 43 and the coupler 53 are not parallel when the coupler components are layered on top of each other. When the couplers 43 and 53 having a constant width and a uniform impedance cross diagonally, the width of the crossing portion is wide at the center of the crossing portion and narrow at the two ends, and thus, a broadband is provided. Furthermore, the shape of the crossing portion is constant even when the location of the coupler 43 or 53 shifts in any direction on the plane relative to the position of the other, and therefore, such effects can also be gained that the coupling properties are constant irrespective of the positional shifting of a module.

Thus, the couplers 43 and 53 are provided so as to cross each other diagonally in Example 6 of the present invention, and therefore, a broadband wireless communication path can be realized. In addition, there are such features that the properties of the communication path do not change even in the case where the location of the coupler component 41 or the coupler component 51 is shifted relative to the other.

Example 7

Figure 16:
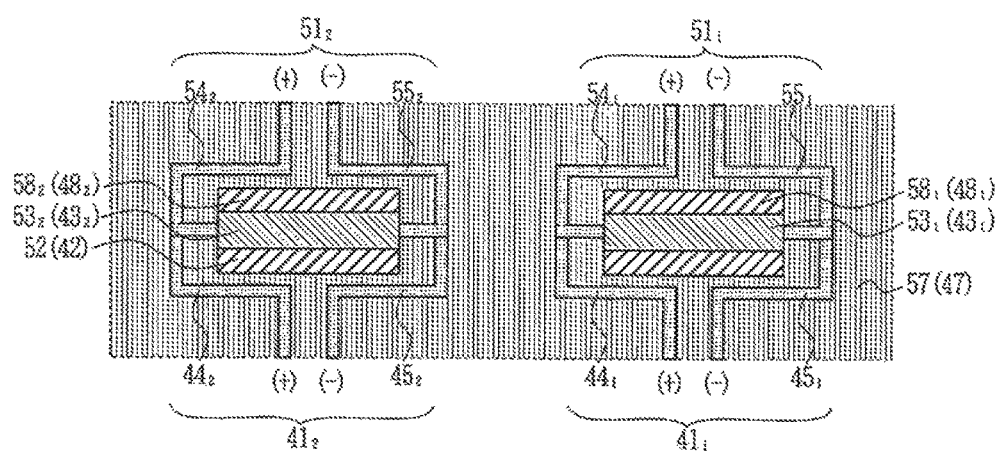
FIG. 16 is a plan diagram showing the coupling state of the coupler elements for forming the directional coupling differential communication apparatus according to Example 7 of the present invention.

Next, the directional coupling differential communication apparatus according to Example 7 of the present invention is described in reference to FIG. 16. FIG. 16 is a plan diagram showing the coupling state of the coupler components for forming the directional coupling differential communication apparatus according to Example 7 of the present invention, where two couplers $43_1$, $43_2$, $53_1$, $53_2$ are provided on each substrate, and the substrates are then layered on top of each other in the same manner as in FIGS. 7A and 7B.

In this case, the electromagnetic fields are generated in the orthogonal direction along the coupler lines, and therefore, the couplers $43_1$, $43_2$, $53_1$, $53_2$ are arranged in the longitudinal direction of the couplers, that is to say, in the direction of the line length. This arrangement makes interference between the couplers smaller, which increases reliability, and makes arrangement in close proximity possible as shown in FIG. 16, and therefore, the density of the mounted elements can be increased.

Example 8

Figure 17A:
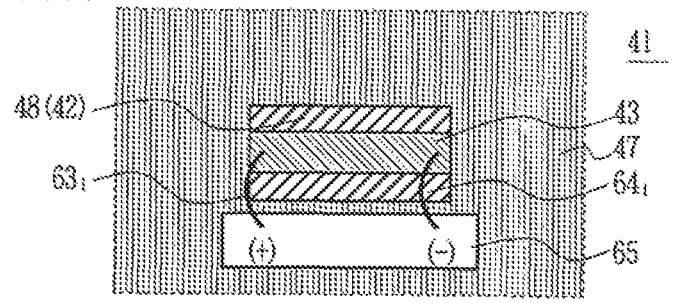
FIGS. 17A to 17C are diagrams showing the coupler elements for forming the directional coupling differential communication apparatus according to Example 8 of the present invention.
Figure 17B:
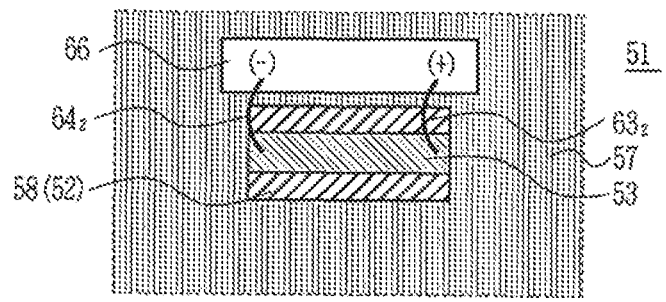
Figure 17C:
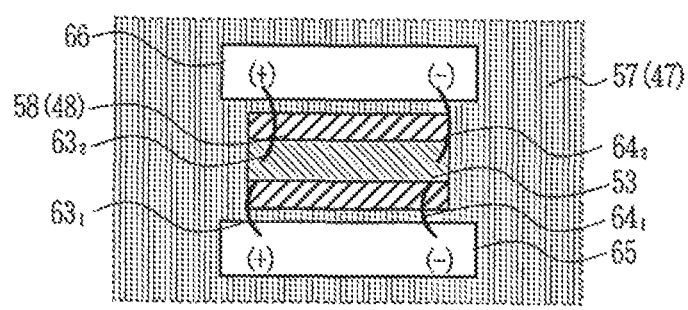

Next, the directional coupling differential communication apparatus according to Example 8 of the present invention is described in reference to FIGS. 17A to 17C. FIGS. 17A to 17C are diagrams illustrating the coupler components for forming the directional coupling differential communication apparatus according to Example 8 of the present invention, where FIG. 17A is a plan diagram showing the coupler component provided on the main substrate side, FIG. 17B is a plan diagram showing the coupler component provided on the child substrate side, and FIG. 17C is a perspective plan diagram showing a case where the coupler components are layered on top of each other with the one on the child substrate side being inverted.

In Example 8, semiconductor integrated circuit apparatuses 65 and 66 having a transmitter/receiver circuit are connected to couplers 43 and 53 using short bonding wires $63_1$, $63_2$, $64_1$, and $64_2$ instead of lead transmission lines.

Example 9

Figure 18:
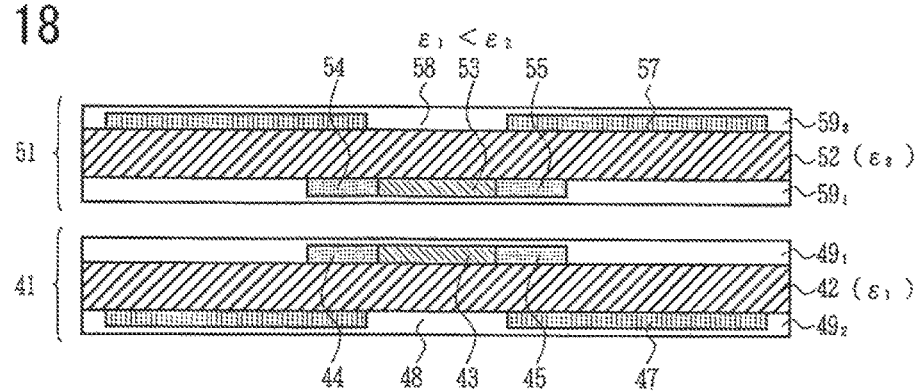
FIG. 18 is a cross-sectional diagram showing the vicinity of the coupler elements for forming the directional coupling differential communication apparatus according to Example 9 of the present invention.

Next, the directional coupling differential communication apparatus according to Example 9 of the present invention is described in reference to FIG. 18. FIG. 18 is a cross-sectional diagram showing the coupler components and their surroundings for forming the directional coupling differential communication apparatus according to Example 9 of the present invention of which the basic structure is the same as the structure shown in FIG. 9.

Here, the relative dielectric constant $\varepsilon_1$ of the gap between the couplers (in the case where the gap is a space, the relative dielectric constant is $\varepsilon_0=1$) is smaller than the dielectric constant $\varepsilon_2$ of the other parts around the coupler lines. For example, the relative dielectric constant of polyimide, which is the base resin of FPCs, is 3.2, while the relative dielectric constant of the surface layer where additives are added to polyimide is 3.4. Meanwhile, the relative dielectric constant of air is 1.0 and the dielectric constant of PET is 3.0. Accordingly, the gap between the two couplers 43 and 53 may be a space or an intervening insulating film made of a material such as PET of which the relative dielectric constant is smaller than 3.2.

Thus, when the dielectric constant between the coupler lines is smaller than the dielectric constant of the other parts surrounding the coupler lines, the crosstalk in the near ends becomes smaller and the crosstalk in the far ends becomes greater. The reason for this, as shown as FIG. 5D, is that the propagating signal in the far ends due to an inductive coupling current has a symbol opposite to that of the signal generated through capacitive coupling, and thus, the signals are weakened by each other, which in many cases results in, as shown in FIG. 5F, a negative signal being propagated in the far ends. That is to say, crosstalk in the far ends is a signal gained by subtracting a signal caused by capacitive coupling from a signal caused by inductive coupling, and therefore, the signal caused by capacitive coupling becomes smaller when the dielectric constant between the coupler lines is lowered, and thus, crosstalk in the far ends becomes greater.

In Example 9, as in the other examples, crosstalk in the far ends is also used, and therefore, the reliability for communication can be secured. As a result, it is possible to leave a gap between two modules, for example, that are arranged in close proximity, and thus, there is such an advantage that the connection between modules can be easily achieved at a low cost. Alternatively, the selection of an insulating film can be made wider when the modules are connected in close proximity with the insulating film in between.

Example 10

Figure 19:
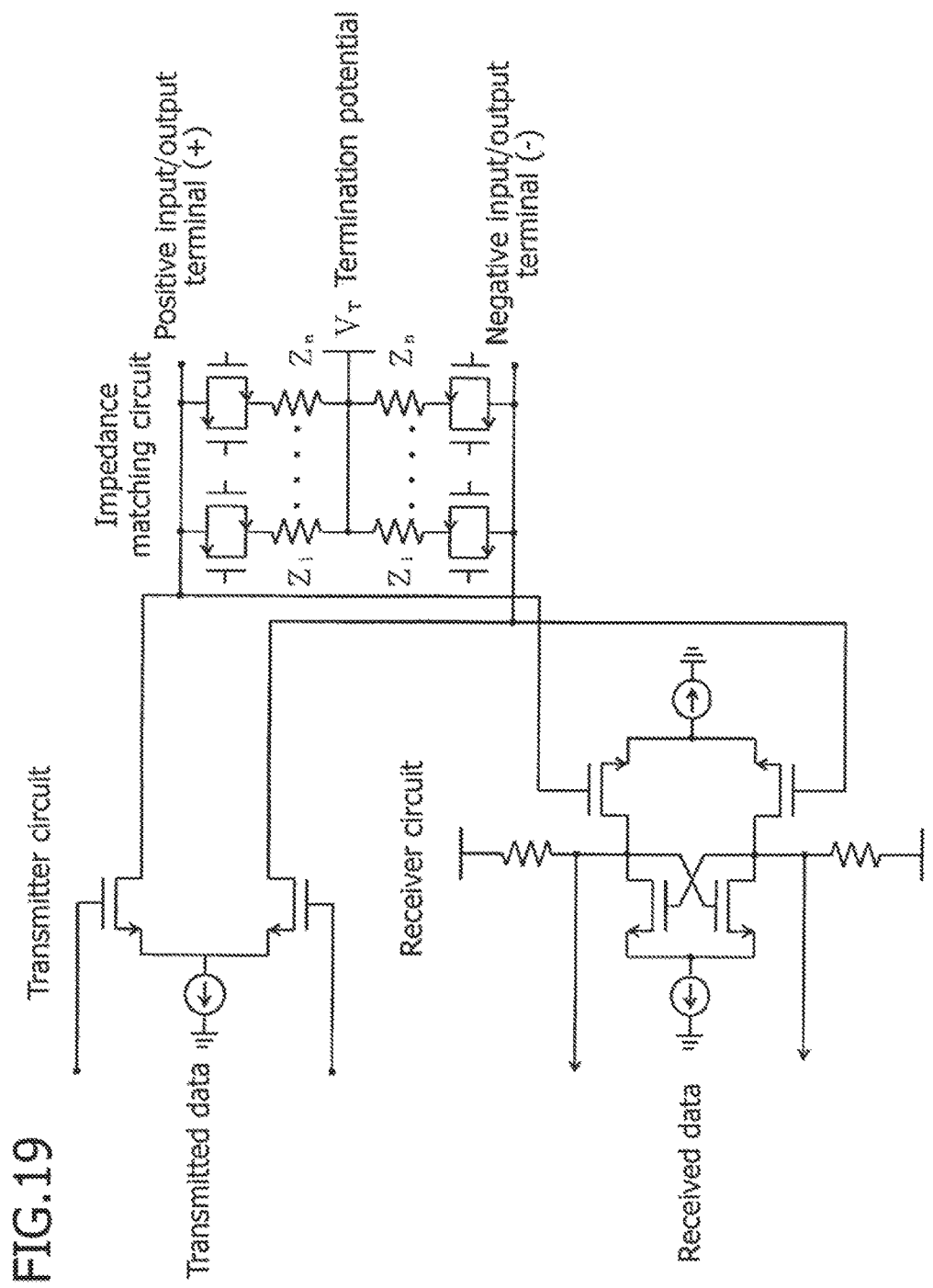
FIG. 19 is a circuit diagram the transmitter/receiver circuit used in the directional coupling differential communication apparatus according to Example 10 of the present invention.

Next, the directional coupling differential communication apparatus according to Example 10 of the present invention is described in reference to FIG. 19, where Example 10 relates to a transmitter/receiver circuit and the remaining structure is the same as in Examples 1 to 9.

FIG. 19 is a circuit diagram showing a transmitter/receiver circuit used in the directional coupling differential communication apparatus according to Example 10 of the present invention, where connections between a number of terminal resistors that are aligned side-by-side are changed by switches so that an impedance matching circuit of which the resistance value can be adjusted is provided on the input/output terminal side.

Thus, an impedance matching circuit is provided on the transmitter/receiver circuit side so that the resistor members for termination connected to the couplers become unnecessary, and thus, the costs can be lowered and the volume of the mounted parts can be reduced. In addition, the resistance value can be adjusted by means of the circuit even in the case where the communication distance is inconsistent or the impedance of the couplers is inconsistent due to the positional shift, and therefore, signal reflection can be suppressed. In the above-described prior art inventions, a resistor member is required for termination and the impedance cannot be adjusted.

In addition, the impedance adjusting circuit can be implemented as a digital circuit as shown in FIG. 19 or can be implemented as an analog circuit. When a received signal is inputted into the source of the transistor instead of the gate as shown in FIG. 19, the input impedance as viewed from the source can be changed through the application of a bias to the gate of the transistor.

Example 11

Figure 20:
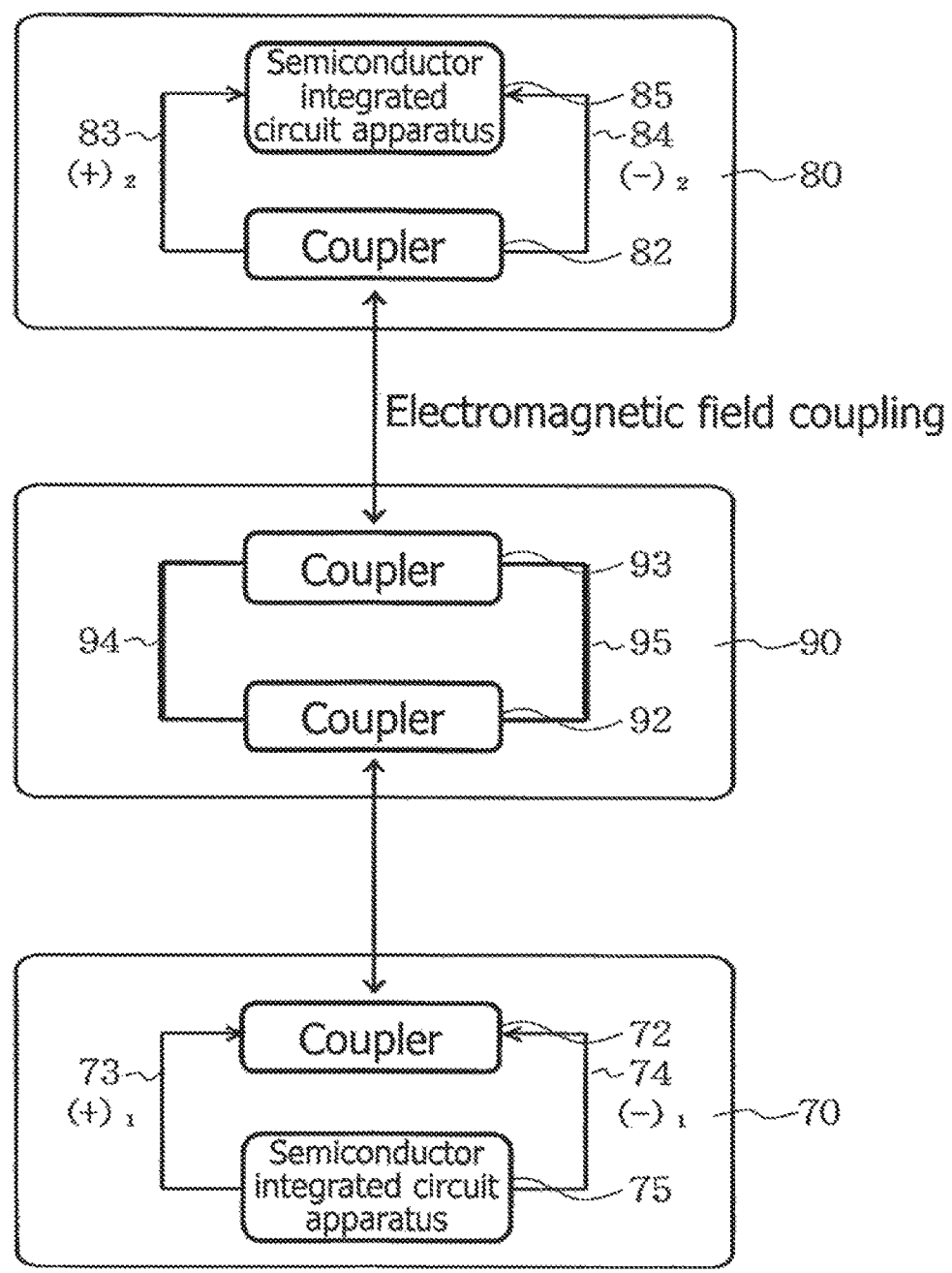
FIG. 20 is a schematic diagram showing the structure of the directional coupling differential communication apparatus according to Example 11 of the present invention.

Next, the directional coupling differential communication apparatus according to Example 11 of the present invention is described in reference to FIGS. 20 to 23B. FIG. 20 is a schematic diagram showing the structure of the directional coupling differential communication apparatus according to Example 11 of the present invention, where a first module 70 and a second module 80 communicate with each other via a third module 90 in which two couplers 92 and 93 are provided.

In this case, the first module 70 and the second module 80 have the same structure as the above-described child substrate, and thus are respectively provided with the couples 72 and 82, which are connected to semiconductor integrated circuit apparatuses 75 and 85 having a transmitter/receiver circuit through lead transmission lines 73, 74, 83, and 84.

Meanwhile, the third module 90 has two couplers 92 and 93, where these two couplers 92 and 93 are connected through lead transmission lines 94 and 95. Here, the lead transmission line 94 and the lead transmission line 95 have the same length.

Figure 21A:
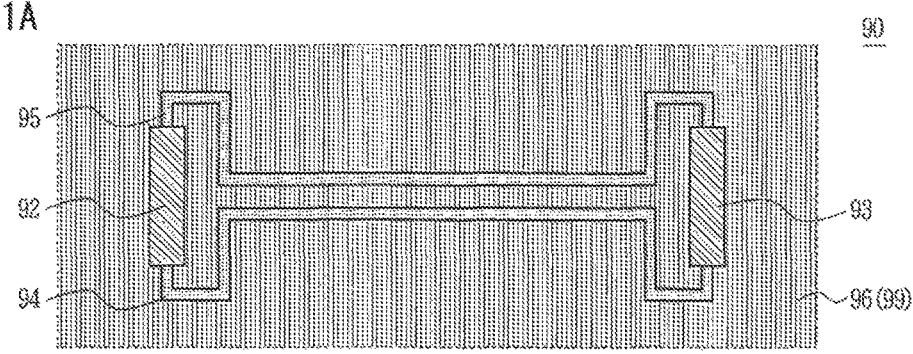
FIGS. 21A to 21C are schematic diagrams showing the structure of the directional coupling differential communication apparatus according to Example 11 of the present invention.
Figure 21B:
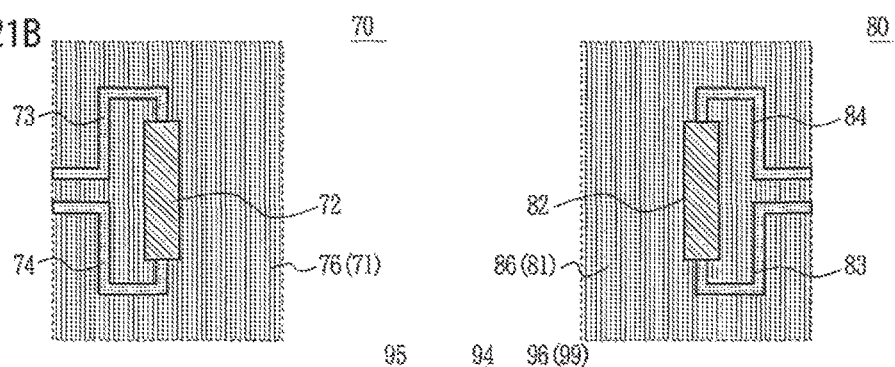
Figure 21C:
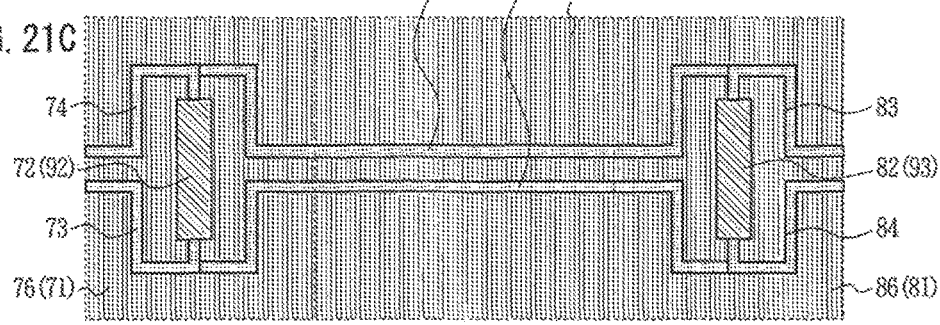

FIGS. 21A to 21C are schematic diagrams showing the structure of the directional coupling differential communication apparatus according to Example 11 of the present invention, where FIG. 21A is a plan diagram showing the third module, FIG. 21B is a plan diagram showing the first module and the second module, and FIG. 21C is a perspective plan diagram showing a case where the first module and the second module are layered on top of each other with one being inverted.

Figure 22:
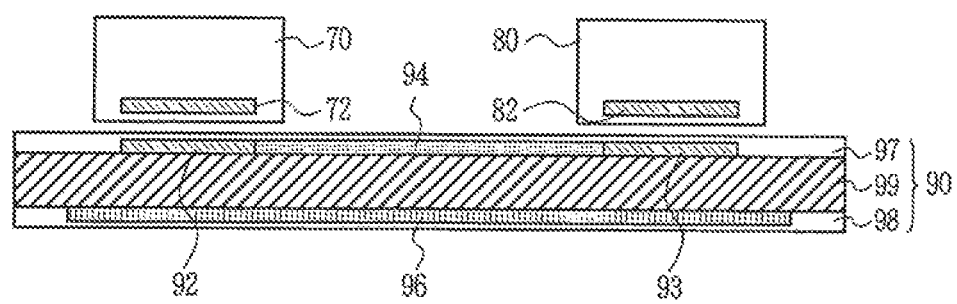
FIG. 22 is a cross-sectional diagram concretely showing the structure of the directional coupling differential communication apparatus according to Example 11 of the present invention.

FIG. 22 is a cross-sectional diagram showing the structure in detail of the directional coupling differential communication apparatus according to Example 11 of the present invention, where an FR4 substrate 99, which is a PCB substrate, is used as the substrate for the third module 90. Here, the rear surface of the FR4 substrate 99 is provided with a plane 96 for electromagnetic shielding, and at the same time, surface layers 97 and 98 are provided on the front and rear surfaces.

The couplers 72 and 82 and the lead transmission lines 73, 74, 83, and 84 for forming the first module 70 and the second module 80 are formed using wires on the PCB or FPC or wires on a substrate or a semiconductor chip within a package.

In this case, the first module 70 and the second module 80 achieve capacitive coupling and inductive coupling with the couplers 92 and 93 provided in the third module 90 so that data communication can be established between the first module 70 and the second module 80.

Figure 23A:
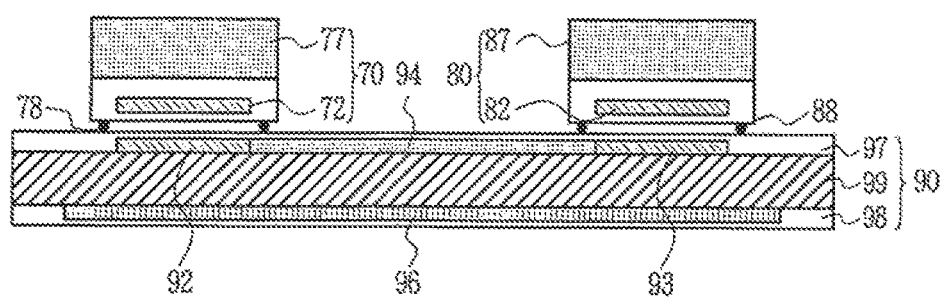
FIGS. 23A and 23B are diagrams showing a case where the first module and the second module are formed of a semiconductor chip.
Figure 23B:
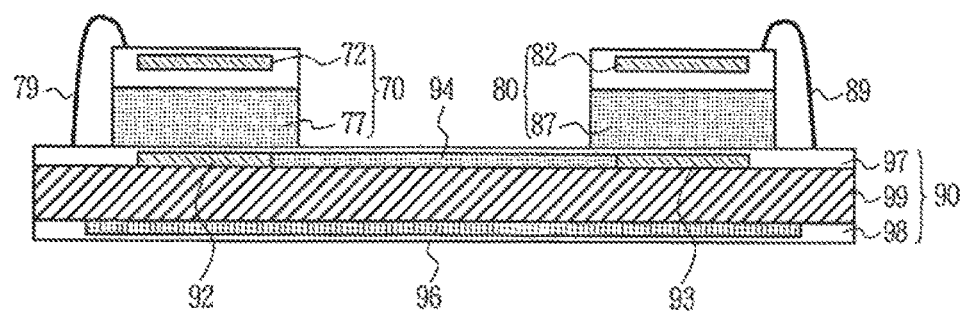

FIGS. 23A and 23B are diagrams for illustrating a case where the first module and the second module are formed of a semiconductor chip, where FIG. 23A is a cross-sectional diagram showing a case where a semiconductor chip faces downward, and FIG. 23B is a cross-sectional diagram showing a case where a semiconductor chip faces upward.

As shown in FIG. 23A, in the case where the first module and the second module are formed of semiconductor chips 77 and 87, the couplers 72 and 82 are formed using wires in the semiconductor chips and are connected to the third module 90 using bumps 78 and 88. In this case, the couplers face each other with a short distance in between without an intervening semiconductor substrate, and therefore, the degree of coupling is great.

Meanwhile, as shown in FIG. 23B, in the case where the semiconductor chips 77 and 87 face upward, they are connected to the third module 90 through bonding wires 79 and 89. In this case, the coupling is intervened by a semiconductor substrate, and therefore, the degree of coupling is slightly smaller.

Example 12

Figure 24:
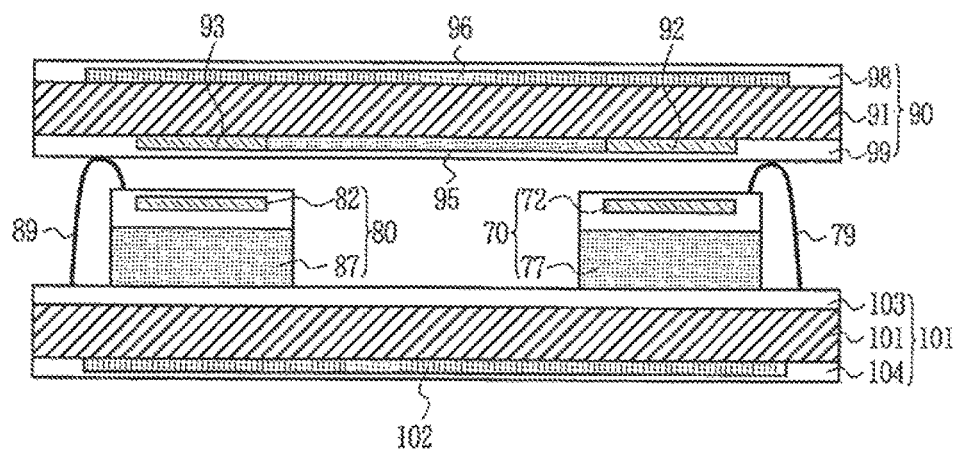
FIG. 24 is a cross-sectional diagram showing the directional coupling differential communication apparatus according to Example 12 of the present invention.

Next, the directional coupling differential communication apparatus according to Example 12 of the present invention is described in reference to FIG. 24. FIG. 24 is a cross-sectional diagram showing the directional coupling differential communication apparatus according to Example 12 of the present invention, where an FPC 91 is used as the substrate for the third module 90, and the first module 70 and the second module 80 are formed of semiconductor chips 77 and 87, and at the same time, these semiconductor chips 77 and 87 are connected to a PCB 100 through bonding wires 79 and 89. Here, an FR4 substrate 101 is used for the PCB 100, where a plane 102 is formed on the rear surface and surface layers 103 and 104 are provided on the front and rear surfaces. In this case, in the same manner as in the case of FIG. 23A, coupling is achieved without an intervening semiconductor substrate.

Example 13

Figure 25A:
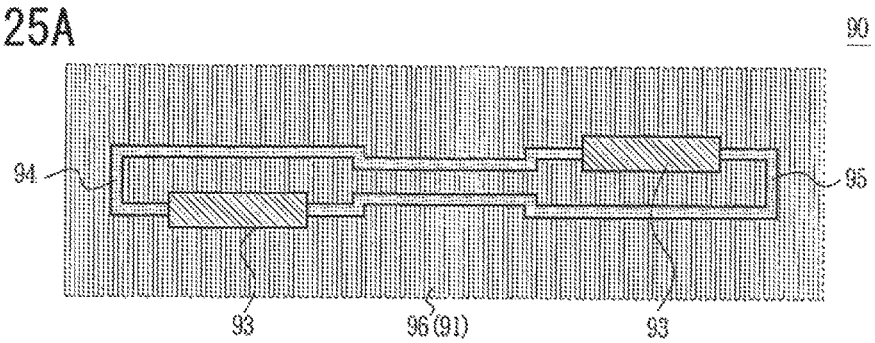
FIGS. 25A to 25C are schematic diagrams showing the structure of the directional coupling differential communication apparatus according to Example 13 of the present invention.
Figure 25B:
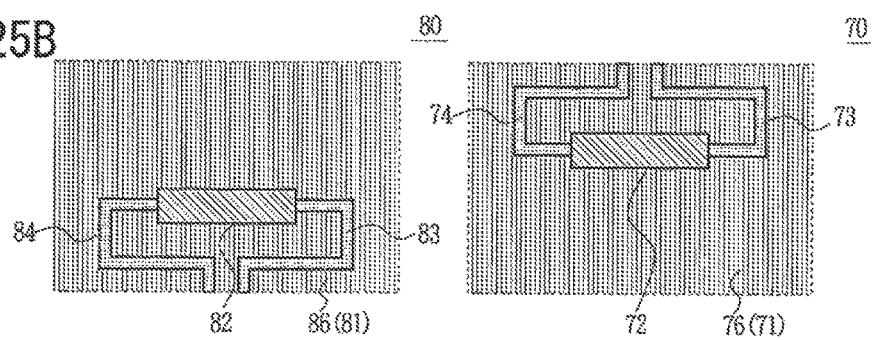
Figure 25C:
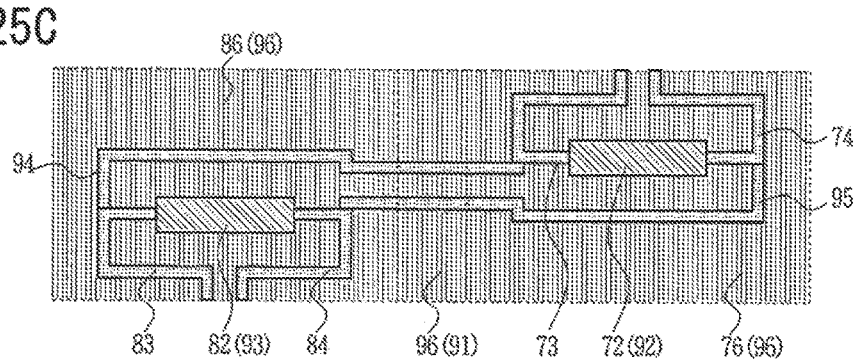

Next, the directional coupling differential communication apparatus according to Example 13 of the present invention is described in reference to FIGS. 25A to 25C. FIGS. 25A to 25C are schematic diagrams showing the structure of the directional coupling differential communication apparatus according to Example 13 of the present invention, where FIG. 25A is a plan diagram showing a third module, FIG. 25B is a plan diagram showing a first module and a second module, and FIG. 25C is a perspective plan diagram showing a case where the first module and the second module are layered on top of each other with one being inverted.

Example 13 corresponds to a case where the wires having the same length in Example 11 rearrange when the couplers 92 and 93 are shifted in the lateral direction. That is to say, no problem arises whenever wires are drawn out as long as the lead transmission line 94 and the lead transmission line 95 have the same length.

Example 14

Figure 26A:
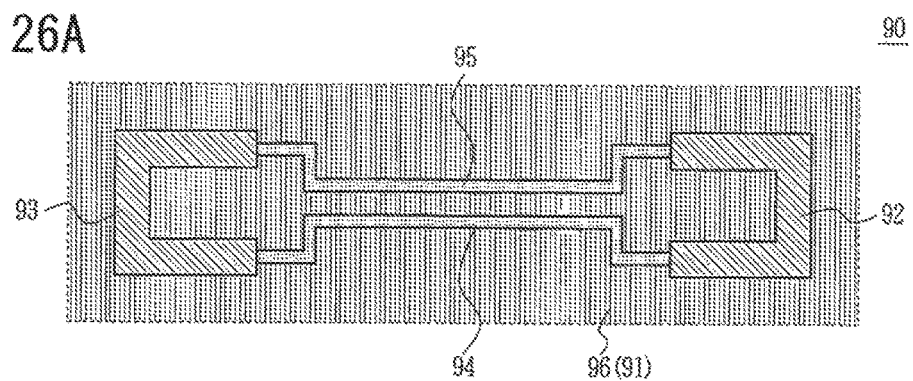
FIGS. 26A and 26B are diagrams showing the structure of the directional coupling differential communication apparatus according to Example 14 of the present invention.
Figure 26B:
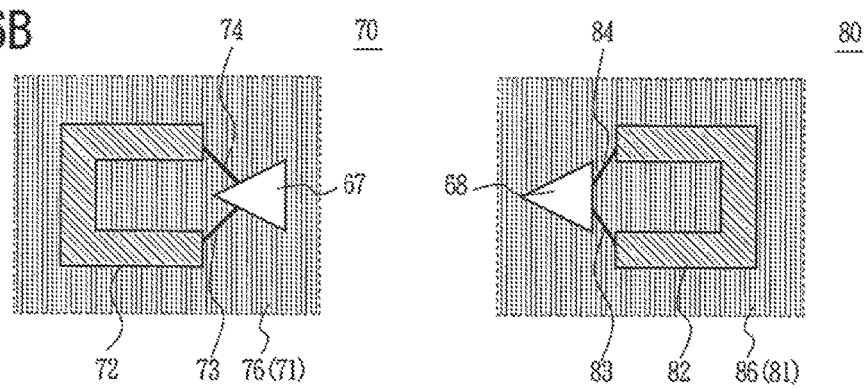

Next, the directional coupling differential communication apparatus according to Example 14 of the present invention is described in reference to FIGS. 26A and 26B. FIGS. 26A and 26B are diagrams for illustrating the structure of the directional coupling differential communication apparatus according to Example 14 of the present invention, where FIG. 26A is a plan diagram showing a third module, and FIG. 26B is a plan diagram showing a first module and a second module.

Example 14 corresponds to Example 4 shown in FIG. 13, and each coupler 72, 82, 92, 93 is bent into a C shape. As shown in Example 11, in the case where the couplers 72 and 82 are formed of wires in semiconductor chips, a problem arises in the case where the entire length of the coupler 72 or 82 does not fit along one side of the chip. In the case where the entire length of the couplers 72 and 82 is 5 mm and one side of the semiconductor chips is 4 mm, for example, the linear couplers 72 and 82 cannot be formed of wires in the semiconductor chips. Even in the case where one side of the semiconductor chips is greater than the entire length of the couplers 72 and 82, wires for connecting the two ends of the coupler 72 or 82 to the differential signal terminals of the transmitter/receiver circuit 67 or 68 become long or do not have the same wire length, and as a result, such a problem arises that the phase of the differential signals is shifted from 180° the wires easily pick up noise.

Such a problem can be solved by bending the couplers 72 and 82 into a shape where the two ends approach each other as shown in FIGS. 26A and 26B. In addition, wires can be made shorter for the connection to the transmitter/receiver circuits 67 and 68, and therefore, wires having precisely the same length can be provided.

Example 15

Figure 27:
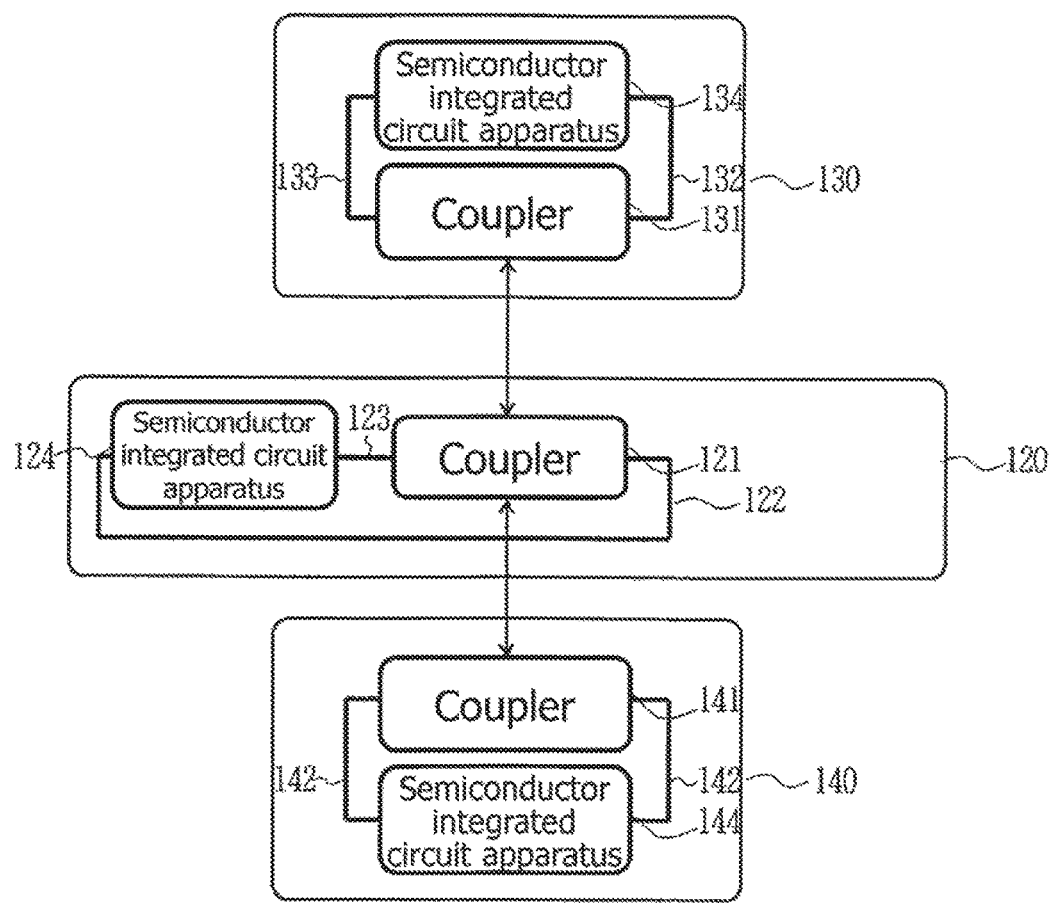
FIG. 27 is a schematic diagram showing the structure of the directional coupling differential communication apparatus according to Example 15 of the present invention.
Figure 28:
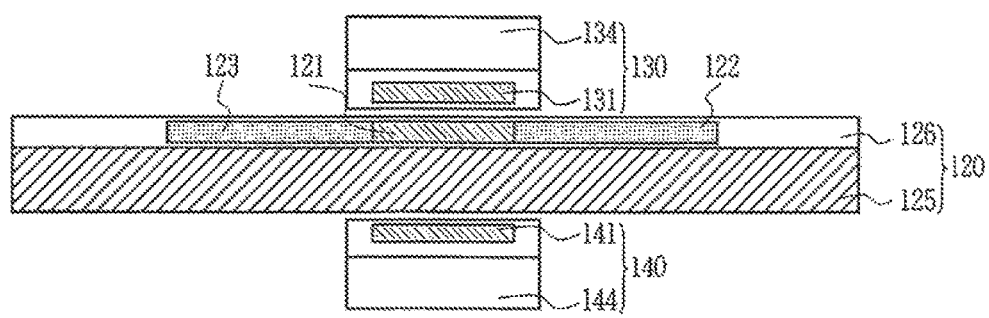
FIG. 28 is a cross-sectional diagram showing the concrete structure of the directional coupling differential communication apparatus according to Example 15 of the present invention.

Next, the directional coupling differential communication apparatus according to Example 15 of the present invention is described in reference to FIGS. 27 and 28. FIG. 27 is a schematic diagram showing the structure of the directional coupling differential communication apparatus according to Example 15 of the present invention, where a first module 120, a second module 130, and a third module 140 are respectively provided with semiconductor integrated circuit apparatuses 124, 134, and 144 having a transmitter/receiver circuit and couplers 121, 131, and 141 so as to establish communication between the first module 120 and the second module 130 as well as between the first module 120 and the third module 140.

In this case, in the first module 120 to the third module 140, respectively, the couplers 121, 131, and 141 and the semiconductor integrated circuit apparatuses 124, 134, and 144 are connected through lead transmission lines 122, 123, 132, 133, 142, and 143. Here, the semiconductor integrated circuit apparatus 124 is a microprocessor while the semiconductor integrated circuit apparatuses 134 and 144 are semiconductor memory apparatuses (memories).

FIG. 28 is a cross-sectional diagram showing the structure in detail of the directional coupling differential communication apparatus according to Example 15 of the present invention, where an FR4 substrate 125, which is a PCB substrate, is used as the substrate for the first module 120. Here, the front surface of the FR4 substrate 125 is provided with a surface layer 126.

In the second module 130, the coupler 131 is layered on the front surface side so as to overlap the coupler 121 in the first module 120 in the direction in which the modules are layered on top of each other. Meanwhile, the third module 140 is layered on the rear surface side so that the coupler 141 overlaps the coupler 121 in the first module 120 in the direction in which the modules are layered on top of each other.

In this case, in order for communication to be achieved with only one memory (134, 144), the other memory (144, 134) recognizes this and may ignore the contents of the communication. Meanwhile, each memory (134, 144) communicates with a microprocessor (124) individually in time division.

In Example 15, the coupler 121 is on the front surface of the FR4 substrate 125, and therefore, the distance between the coupler 121 and 131 is shorter than the distance between the coupler 121 and the coupler 141, and thus, the degree of coupling between the coupler 121 and the coupler 131 is stronger than the degree of coupling between the coupler 121 and the coupler 141. However, the coupler 121 may be formed of wires inside the FR4 substrate 125 by using a multilayer wire substrate as the FR4 substrate 125 so that the distance between the coupler 121 and the coupler 131 is approximately equal to the distance between the coupler 121 and the coupler 141, and thus, the degree of coupling between the coupler 121 and the coupler 131 may be approximately equal to the degree of coupling between the coupler 121 and the coupler 141.

Example 16

Figure 29:
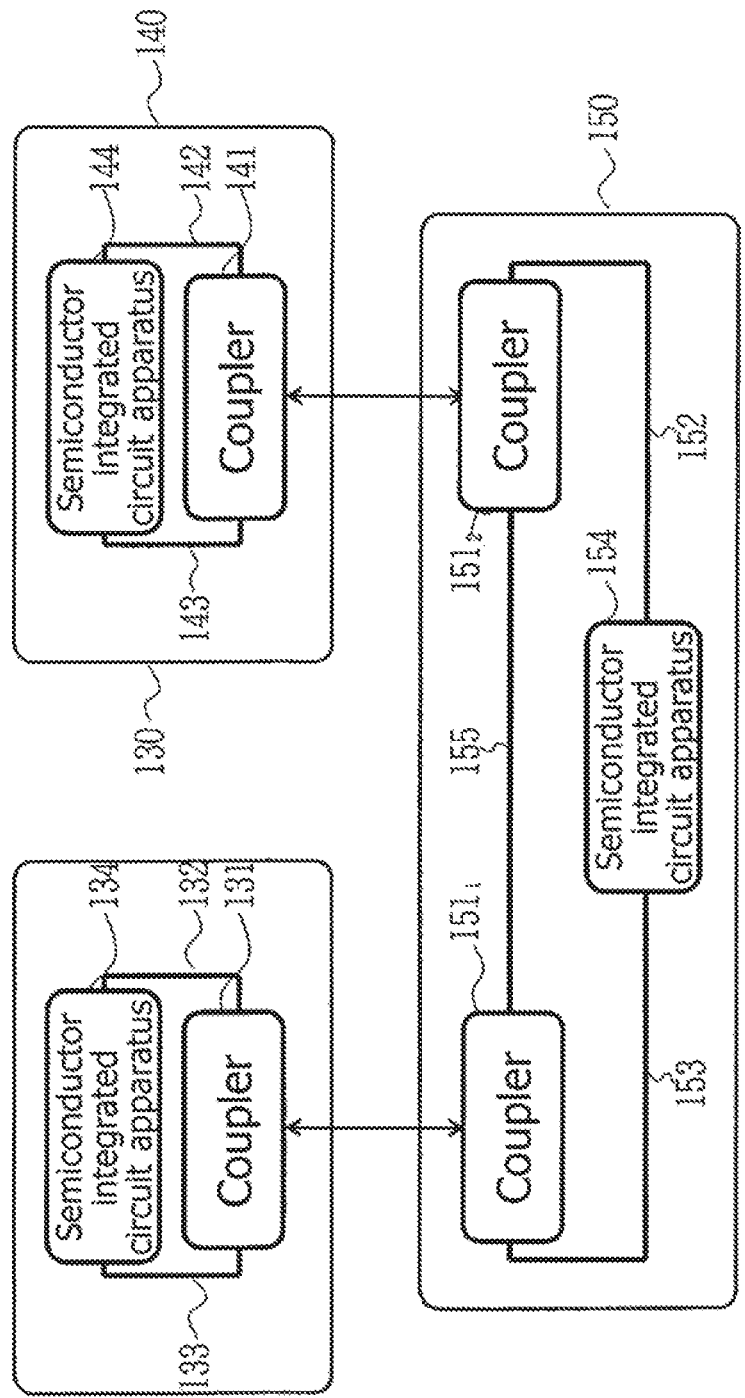
FIG. 29 is a schematic diagram showing the structure of the directional coupling differential communication apparatus according to Example 16 of the present invention.
Figure 30:
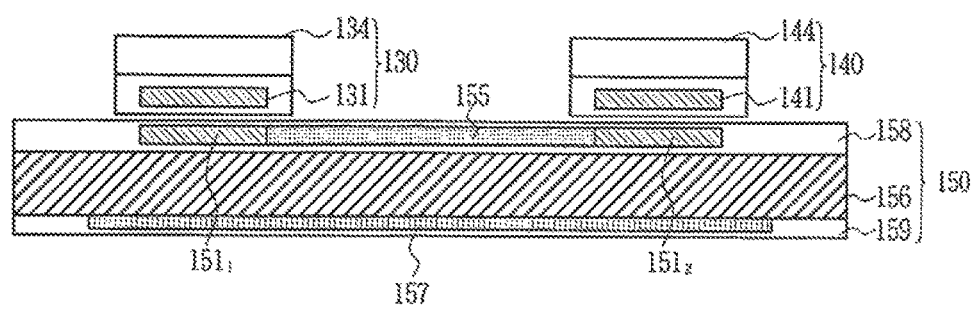
FIG. 30 is a cross-sectional diagram showing the concrete structure of the directional coupling differential communication apparatus according to Example 16 of the present invention.

Next, the directional coupling differential communication apparatus according to Example 16 of the present invention is described in reference to FIGS. 29 and 30. FIG. 29 is a schematic diagram showing the structure of the directional coupling differential communication apparatus according to Example 16 of the present invention, where a first module 150, a second module 130, and a third module 140 are respectively provided with semiconductor integrated circuit apparatuses 154, 134, and 144 having a transmitter/receiver circuit and couplers $151_1$, $151_2$, 131, and 141 so as to establish communication between the first module 150 and the second module 130 as well as between the first module 150 and the third module 140.

In this case, in the first module 150, the two couplers $151_1$ and $151_2$ are connected in series through a connection transmission line 155 and are connected to the semiconductor integrated circuit apparatus 154 through lead transmission lines 152 and 153.

In the second module 130 and the third module 140, as in Example 15, the couplers 131 and 141 and the semiconductor integrated circuit apparatuses 134 and 144 are respectively connected to each other through lead transmission lines 132, 133, 142, and 143. Here as well, the semiconductor integrated circuit apparatus 154 is a microprocessor while the semiconductor integrated circuit apparatuses 134 and 144 are semiconductor memory apparatuses (memories).

FIG. 30 is a cross-sectional diagram showing the structure in detail of the directional coupling differential communication apparatus according to Example 16 of the present invention, where an FR4 substrate 156, which is a PCB substrate, is used as the substrate for the first module 150. Here as well, the rear surface of the FR4 substrate 156 is provided with a plane 157 for electromagnetic shielding, and at the same time, the front and the rear surfaces are provided with surface layers 158 and 159.

The second module 130 is layered on the first module so that the coupler 131 overlaps the coupler $151_1$ in the first module 150 in the direction in which the two modules are layered on top of the other module. Meanwhile, the third module 140 is layered on the first module so that the coupler 141 overlaps the coupler $151_2$ in the first module 150 in the direction in which the two modules are layered on top of the other module.

In this case as well, as in Example 15, the microprocessor (154) can communicate with the two memories (134, 144) simultaneously, and each memory (134, 144) communicates with the microprocessor (154) in time division. Here, signals attenuate in the couplers and the signal length is different between the transmitter/receiver provided inside the semiconductor circuit apparatuses 154, 134, and 144 and the couplers $151_1$, $151_2$, 131, and 141, and therefore, the amplitude and the phase of the differential signal inputted into the two ends of each coupler $151_1$, $151_2$, 131, and 141 are shifted, and thus, the signal transmission performance is inferior to the case where there is only one coupler.

Though in the figures the first module 150 is provided with two couplers $151_1$ and $151_2$, three or more couplers may be provided, and in this case, it is possible to couple modules of which the number corresponds to the number of couplers. Here, the greater the number of couplers is, the more the signal transmission performance deteriorates.

Example 17

Figure 31:
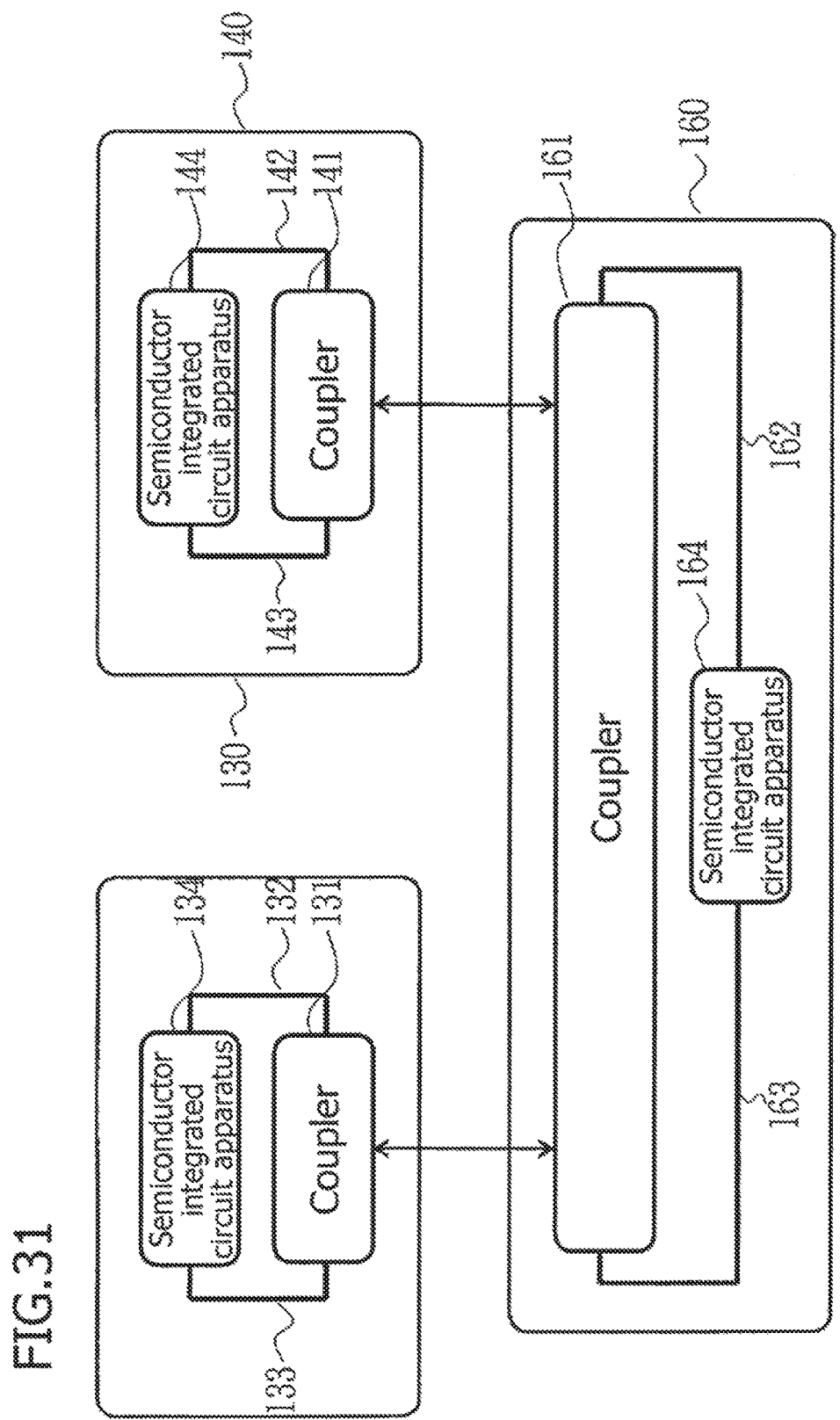
FIG. 31 is a schematic diagram showing the structure of the directional coupling differential communication apparatus according to Example 17 of the present invention.
Figure 32:
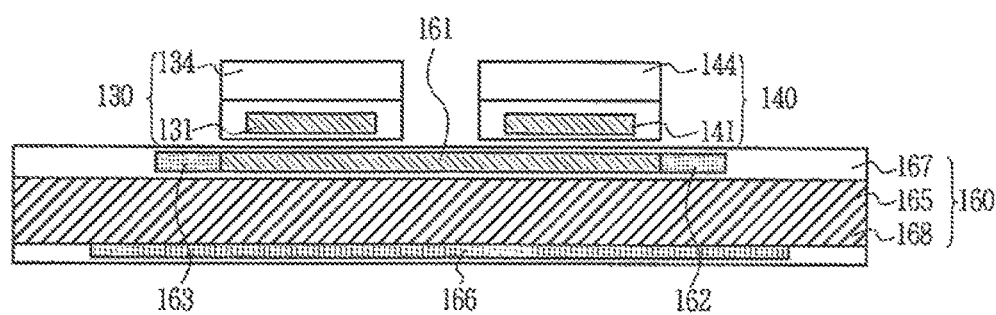
FIG. 32 is a cross-sectional diagram showing the concrete structure of the directional coupling differential communication apparatus according to Example 11 of the present invention.

Next, the directional coupling differential communication apparatus according to Example 17 of the present invention is described in reference to FIGS. 31 and 32. FIG. 31 is a schematic diagram showing the structure of the directional coupling differential communication apparatus according to Example 17 of the present invention, where a first module 160, a second module 130, and a third module 140 are respectively provided with semiconductor integrated circuit apparatuses 164, 134, and 144 having a transmitter/receiver circuit and couplers 161, 131, and 141 so as to establish communication between the first module 160 and the second module 130 as well as between the first module 160 and the third module 140.

In this case, the first module 160 has such a length as to be able to deal with two couplers 131 and 141 and is connected to the semiconductor integrated circuit apparatus 164 through lead transmission lines 162 and 163. In the second module 130 and the third module 140, as in Example 15, the couplers 131 and 141 and the semiconductor integrated circuit apparatuses 134 and 144 are respectively connected to each other through lead transmission lines 132, 133, 142, and 143. Here as well, the semiconductor integrated circuit apparatus 164 is a microprocessor while the semiconductor integrated circuit apparatuses 134 and 144 are semiconductor memory apparatuses (memories).

FIG. 32 is a cross-sectional diagram showing the structure in detail of the directional coupling differential communication apparatus according to Example 17 of the present invention, where an FR4 substrate 165, which is a PCB substrate, is used as the substrate for the first module 160. Here as well, the rear surface of the FR4 substrate 165 is provided with a plane 166 for electromagnetic shielding, and at the same time, the front and the rear surfaces are provided with surface layers 167 and 168.

The second module 130 is layered on the first module so that the coupler 131 overlaps a portion of the coupler 161 in the first module 160 in the direction in which the two modules are layered on top of the other module. Meanwhile, the third module 140 is layered on the first module so that the coupler 141 overlaps the other portion of the coupler 161 in the first module 160 in the direction in which the two modules are layered on top of the other module.

In this case as well, as in Example 16, the microprocessor (164) can communicate with the two memories (134, 144) simultaneously, and each memory (134, 144) communicates with the microprocessor (164) in time division. Here, signals attenuate in the couplers 151$_1$ and 151$_2$ and the signal length is different between the transmitter/receiver provided inside the semiconductor circuit apparatuses 164, 134, and 144 and the couplers 161, 131, and 141, and therefore, the amplitude and the phase of the differential signal inputted into the two ends of each coupler 161, 131, and 141 are shifted, and thus, the signal transmission performance is inferior.

Though in the figures the coupler 161 in the first module 160 has such a length as to deal with two couplers, it may have such a length as to deal with three or more couplers. In such a case, it is possible to couple modules of which the number corresponds to the length of the coupler. The greater the number of couplers is, the more the signal transmission performance deteriorates.

Example 18

Figure 33A:
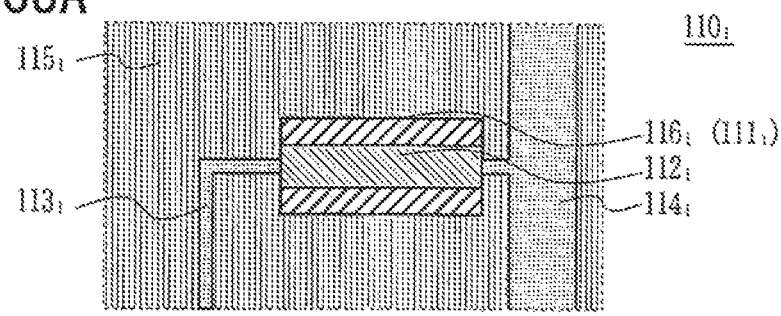
FIGS. 33A to 33C are diagrams showing the structure of a module for forming the directional coupling communication apparatus according to Example 18 of the present invention.

Next, the directional coupling differential communication apparatus according to Example 18 of the present invention is described in reference to FIGS. 33A to 37C. FIGS. 33A to 33C are diagrams for illustrating the structure of the modules for forming the directional coupling differential communication apparatus according to Example 18 of the present invention, where FIG. 33A is a plan diagram showing a first module, FIG. 33B is a plan diagram showing a second module, and FIG. 33C is a perspective plan diagram showing a case where the two modules are layered on top of each other with the second module being inverted.

Figure 33B:
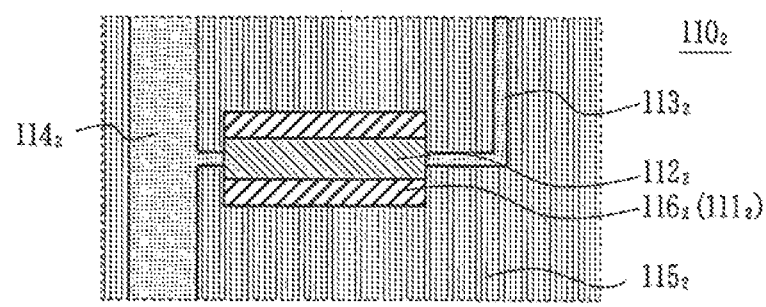
Figure 33C:
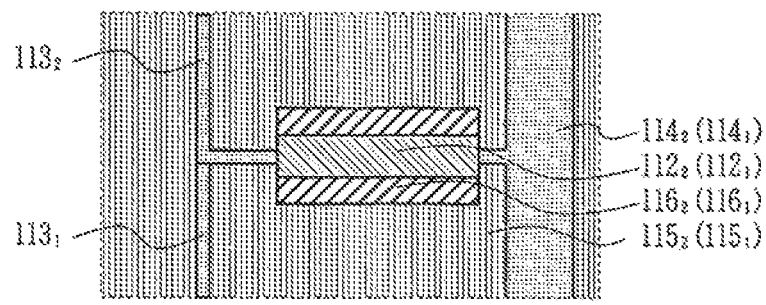

As shown in FIG. 33A or 33B, in each module 110$_1$ or 110$_2$, a coupler 112$_1$ or 112$_2$ is formed on an FPC 111$_1$ or 111$_2$ and a lead transmission line 113$_1$ or 113$_2$ is connected to one end of the coupler 112$_1$ or 112$_2$, and at the same time, the other end is connected to a termination line 114$_1$ or 114$_2$. Here, a plane 115$_1$ or 115$_2$ is provided on the rear surface of the FPC 111$_1$ or 111$_2$, and a missing portion 116$_1$ or 116$_2$ of the plane is provided in a portion that faces the coupler 112$_1$ or 112$_2$.

Figure 34A:
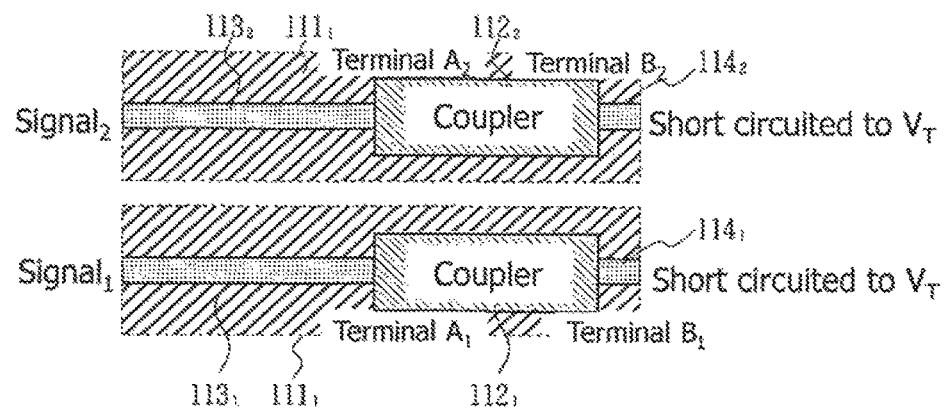
FIGS. 34A to 34C are a diagram and graphs for showing the operational principle (1) of the directional coupling communication apparatus according to Example 18 of the present invention.

Next, the operational principle of Example 18 according to the present invention is described in reference to FIGS. 34A to 37C, which is basically the same as the operational principle described in reference to FIGS. 4A to 6D. First, as shown in FIG. 34A, the input end of the coupler 112$_1$ for the $(+)_1$ signal is terminal $A_1$, and the connection point of the coupler 112$_1$ with the termination line 114$_1$ is terminal $B_1$. Likewise, the output end of the coupler 112$_1$ for a signal is terminal $A_2$, and the connection point of the coupler 112$_1$ with the termination line 114$_2$ is terminal $B_2$.

Figure 34B:
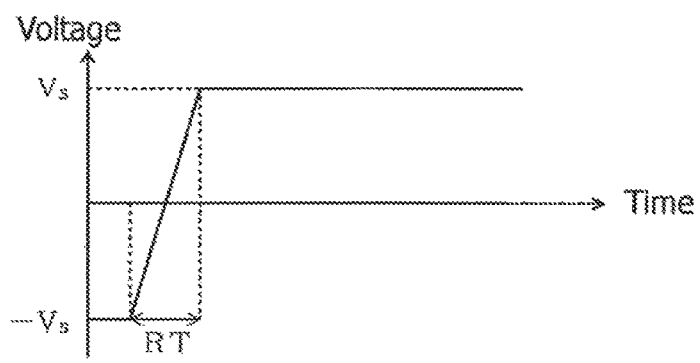
Figure 34C:
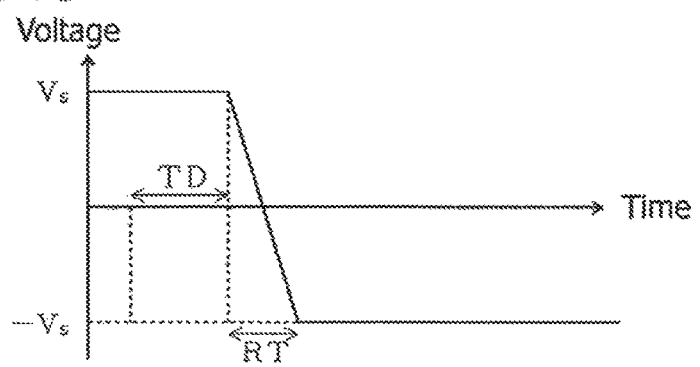

FIG. 34B is a diagram showing a waveform of an example of the $(+)_1$ signal, and FIG. 34C is a diagram showing a waveform of the wave reflected from the terminal $B_1$. The terminal $B_1$ is connected to the termination line 114$_1$ so as to be grounded to the termination potential ($V_T$), and therefore, the potential of the terminal $B_1$ is always the termination potential ($V_T$), which does not change. Accordingly, when the $(+)_1$ signal reaches the terminal $B_1$, a waveform having the opposite polarity is formed as a reflected wave in such a manner that the potential of the terminal $B_1$ is constant and progresses towards the terminal $A_1$. In this case, the reflected wave is generated after the time TD has elapsed before the $(+)_1$ signal reaches the terminal $B_1$.

Figure 35A:
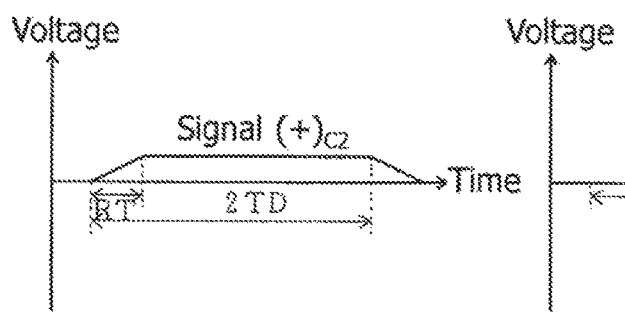
FIGS. 35A to 35F are graphs for showing the operational principle (2) of the directional coupling communication apparatus according to Example 18 of the present invention.
Figure 35B:
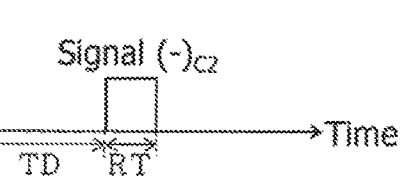

When the $(+)_1$ signal propagates from the terminal $A_1$ of the coupler 112$_1$ toward the terminal $B_1$, a capacitive coupling current and an inductive coupling current are induced and flow through the coupler 112$_2$ due to the coupling effects of $i=C(dv/dt)$ and $v=L(di/dt)$ in exactly the same manner as the operational principle described in reference to FIGS. 4A to 6D, and the waveform of the capacitive coupling signal shown in FIG. 35A appears in the terminal $A_2$. In addition, the capacitive coupling signal shown in FIG. 35B appears in the terminal $B_2$.

Figure 35C:
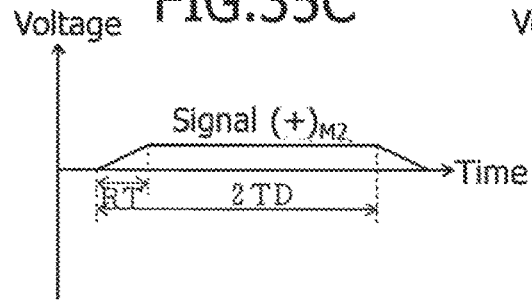
Figure 35D:
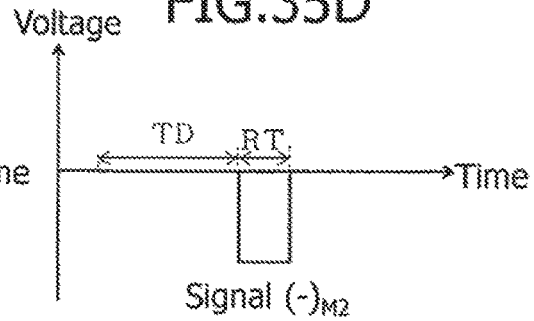
Figure 35E:
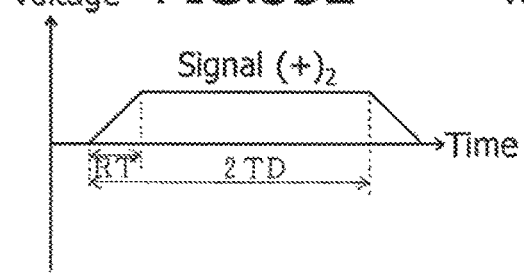

Meanwhile, the inductive coupling current has the waveform shown in FIG. 35C in exactly the same manner as the operational principle described in reference to FIGS. 4A to 6D and has the waveform shown in FIG. 35E when overlapping the capacitive coupling signal.

Figure 35F:
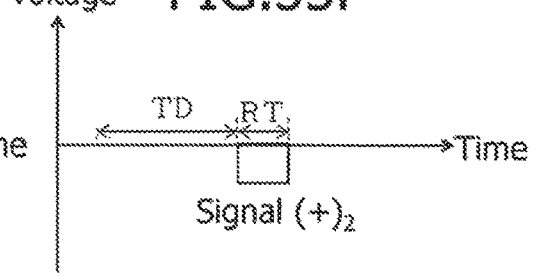

In addition, the signal that appears in the terminal $B_2$ has a symbol opposite to that of the signal that appears in the terminal $B_2$ due to the capacitive coupling as shown in FIG. 35D so as to weaken each other, and as a result, in many cases, a negative signal propagates through the terminal $B_2$ as shown in FIG. 35F.

Meanwhile, the wave reflected from the terminal $B_1$ generates a coupling signal of the reflected wave having the opposite polarity as shown in FIG. 36A in the terminal $A_2$ and a coupling signal having the same polarity as shown in FIG. 36B in the terminal $B_2$ due to the same principle as the operational principle described in reference to FIGS. 4A to 6D. Here, the coupling signal appears in the terminal $A_z$ after the time 2TD, which is required for the $(+)_1$ signal to have a roundtrip through the coupler 112$_1$, has elapsed. The coupling signal appears in the terminal $B_2$ at the same time as the reflection starts from the terminal $B_1$, which requires time TD.

Accordingly, the coupling signal shown in FIG. 35E and the coupling signal shown in FIG. 36A overlap so as to generate the signal in FIG. 36C in the terminal $A_2$. Likewise, the coupling signal shown in FIG. 35F and the coupling signal shown in FIG. 36B overlap so as to generate the signal in FIG. 36D in the terminal $B_2$.

Figure 37A:
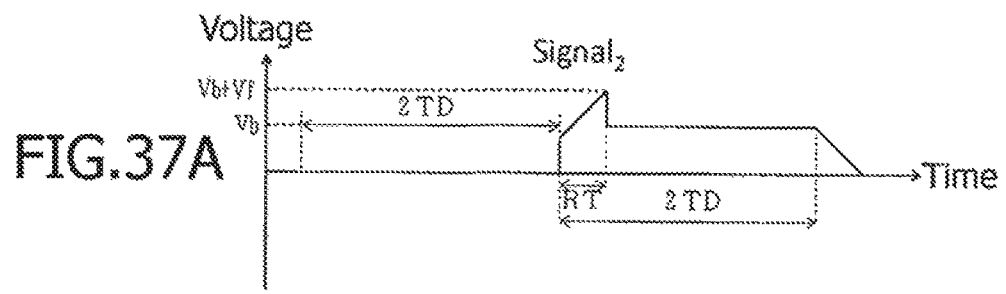
FIGS. 37A to 37C are graphs for showing the operational principle (4) of the directional coupling communication apparatus according to Example 18 of the present invention.

The coupling signal that has reached the terminal $B_2$ as shown in FIG. 36D becomes a reflected wave having the opposite polarity because the terminal $B_2$ is connected and short-circuited to the terminal line $114_2$ and appears in the terminal $A_2$ as the waveform shown in FIG. 37A. The signal due to this reflected wave delays by TD, which is the time for propagation through the coupler $112_2$, and delays by 2TD as a whole.

Figure 37B:
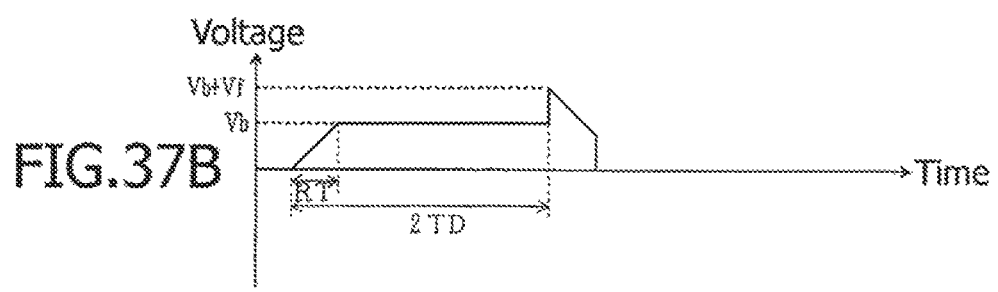
Figure 37C:
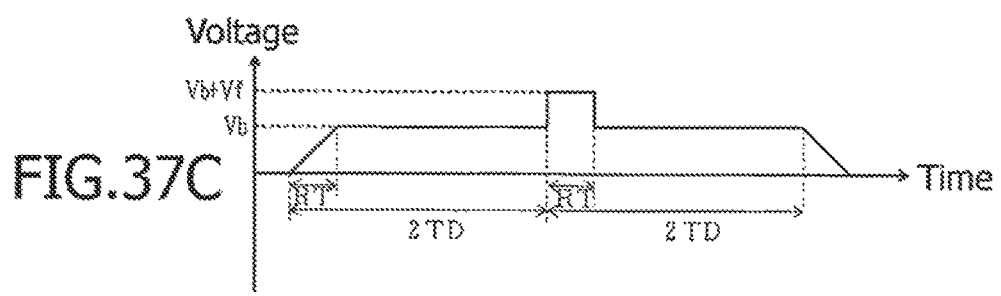

Accordingly, the waveform shown in FIG. 37A and the waveform shown in FIG. 37B that corresponds to FIG. 36C overlap so that the waveform shown in FIG. 37C appears in the terminal $A_2$. Therefore, in Example 18 as well, the coupling signal that appears in the terminal $B_2$ and corresponds to the crosstalk in the far ends is used for communication, and thus, the reliability of the signal transmission can be increased.

When the length of the couplers $112_1$ and $112_2$ in FIG. 34A is half of the length of the couplers $12_1$ and $12_2$ in FIG. 4A, the time for the waveform described in reference to FIGS. 35A to 37C to reach from one end of the coupler to the other is TD/2, and the time required for the roundtrip is TD. Accordingly, 2TD in FIG. 37C is halved, which is TD, and therefore, the waveform in FIG. 37C becomes equal to the waveform in FIG. 6C. That is to say, the coupler in Example 18 has a length that is half of that of the coupler in Example 1 in order for the same signal to communicate, and thus, the coupler can be made smaller. Here, this is a single-end signal instead of a differential signal, and therefore, the resistance to the same phase noise is lowered.

Example 19

Figure 38A:
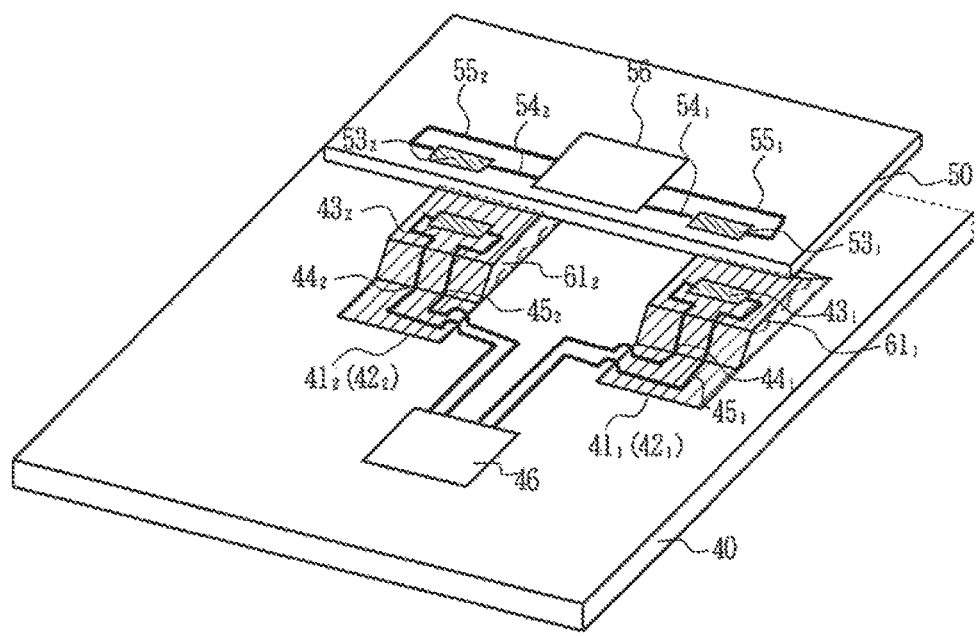
FIGS. 38A and 38B are diagrams showing the structure of the directional coupling differential communication apparatus according to Example 19 of the present invention.
Figure 38B:
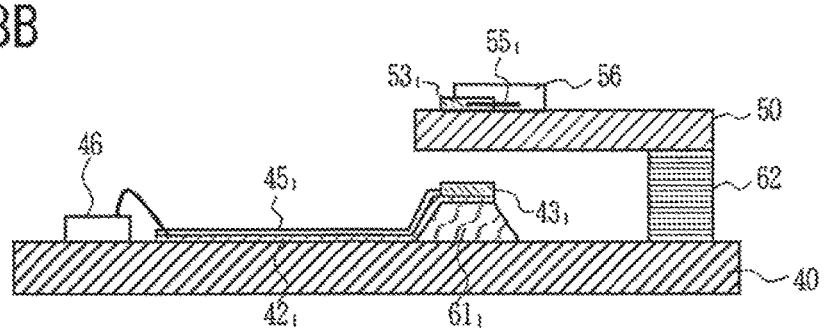

Next, the directional coupling differential communication apparatus according to Example 19 of the present invention is described in reference to FIGS. 38A and 38B, which is an example of the improved directional coupling differential communication apparatus of Example 1. FIGS. 38A and 38B are diagrams for illustrating the structure of the directional coupling differential communication apparatus according to Example 19 of the present invention, where FIG. 38A is a schematic perspective diagram and FIG. 38B is a schematic side diagram. Here, a coupler is directly provided on the surface of a child substrate in order to realize the interface between modules of a main substrate (motherboard) and the child substrate.

As in Example 1, coupler components $41_1$ and $41_2$ using an FPC $42_1$ or $42_2$ are installed on a main substrate 40, and each coupler component $41_1$ or $41_2$ is provided with a coupler $43_1$ or $43_2$, which is connected to a transmitter/receiver circuit 46 via lead transmission lines $44_1$ or $44_2$ and $45_1$ or $45_2$.

Meanwhile, couplers $53_1$ and $53_2$ are directly provided on the surface of the display module (child substrate) 50 and are connected to a transmitter/receiver circuit 56 via lead transmission lines $54_1$, $54_2$, $55_1$, and $55_2$. Here, a terrace member $61_1$ or $61_2$ provided on the main substrate 40 is used so that the coupler $43_1$ or $43_2$ provided in the coupler component $41_1$ or $41_2$ is installed in close proximity to the coupler $53_1$ or $53_2$ provided on the child substrate 50 in the structure. The main substrate 40 and the child substrate 50 are layered on top of each other using a support member 62. Here as well, the setting allows the coupling impedance $Z_{0\text{-}coupled}$ to be matched in the electromagnetic field coupling between the couplers that face each other.

Thus, in Example 19 of the present invention, wires on the child substrate can form couplers and lead transmission lines, which makes an FPC unnecessary and a reduction in the cost possible. Though it is necessary for the FPC to be bent with a small curvature radius in Example 1, no FPC is used in Example 19 where the manufacturing process can be simplified.

Example 20

Figure 39A:
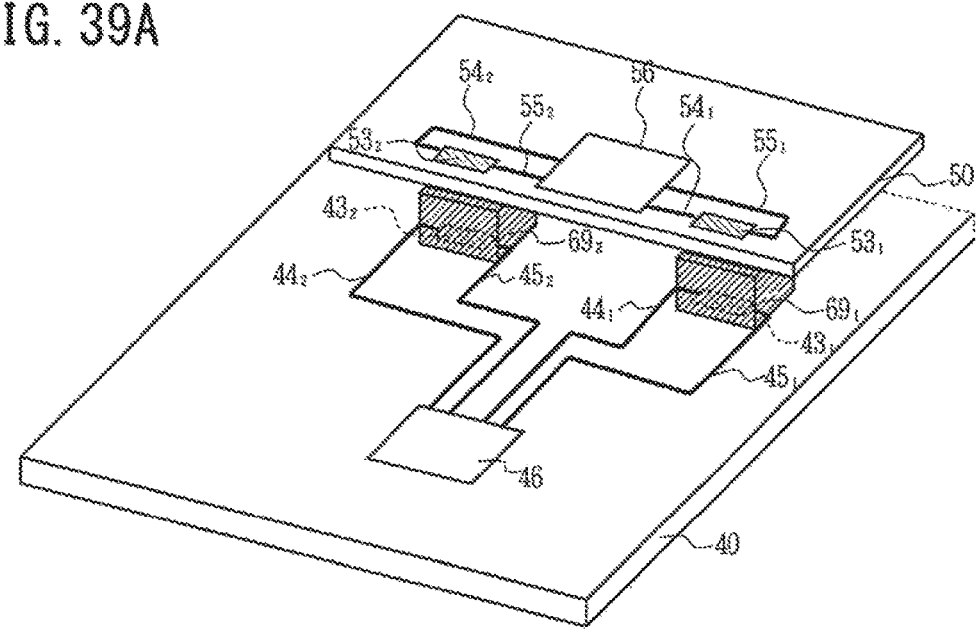
FIGS. 39A and 39B are diagrams showing the structure of the directional coupling differential communication apparatus according to Example 20 of the present invention.
Figure 39B:
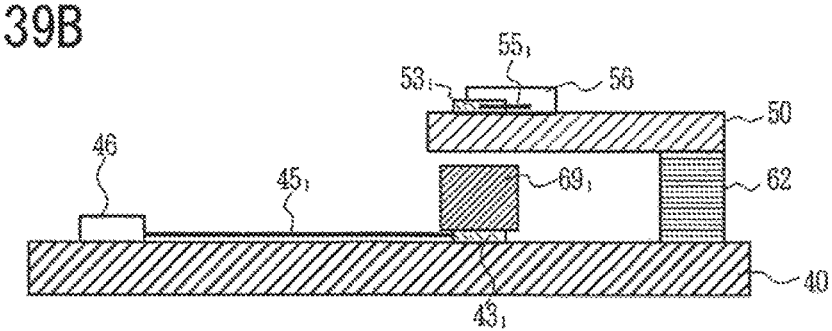

Next, the directional coupling differential communication apparatus according to Example 20 of the present invention is described in reference to FIGS. 39A and 39B, which is an example of the improved directional coupling differential communication apparatus of Example 19. FIGS. 39A and 39B are diagrams for illustrating the structure of the directional coupling differential communication apparatus according to Example 20 of the present invention, where FIG. 39A is a schematic perspective diagram and FIG. 39B is a schematic side diagram. Here, couplers are directly provided on the surface of a parent substrate and a child substrate, and at the same time, a dielectric body is used to strengthen the electromagnetic field coupling in order to realize the interface between modules of the main substrate (motherboard) and the child substrate.

Couplers $43_1$ and $43_2$ are directly provided on the surface of a main substrate 40 and are connected to a transmitter/receiver circuit 46 via lead transmission lines $44_1$, $44_2$, $45_1$, and $45_2$. Meanwhile, couplers $53_1$ and $53_2$ are directly provided on the surface of a display module (child substrate) 50 and are connected to a transmitter/receiver circuit 56 via lead transmission lines $54_1$, $54_2$, $55_1$, and $55_2$.

Here, a dielectric body $69_1$ or $69_2$, such as dielectric ceramics made of a material of which the relative dielectric constant is higher than 1, for example, $BaO$—$R_2O_2$—$TiO_2$, is provided between the coupler $43_1$ or $43_2$ and the coupler $53_1$ or $53_2$ so as to strengthen the electromagnetic field coupling between the coupler $43_1$ or $43_2$ and the coupler $53_1$ or $53_2$. The main substrate 40 and the child substrate 50 are layered on top of each other using a support member 62. Here as well, the setting allows the coupling impedance $Z_{0\text{-}coupled}$ to be matched in the electromagnetic field coupling between the couplers that face each other.

Thus, in Example 20 of the present invention, wires on the parent substrate and the child substrate can form couplers and lead transmission lines, which makes a terrace member and an FPC unnecessary as well as a reduction in the cost possible. Though it is necessary for the FPC to be bent with a small curvature radius in Example 1, no FPC is used in Example 20 where the manufacturing process can be simplified.

Example 21

Figure 40:
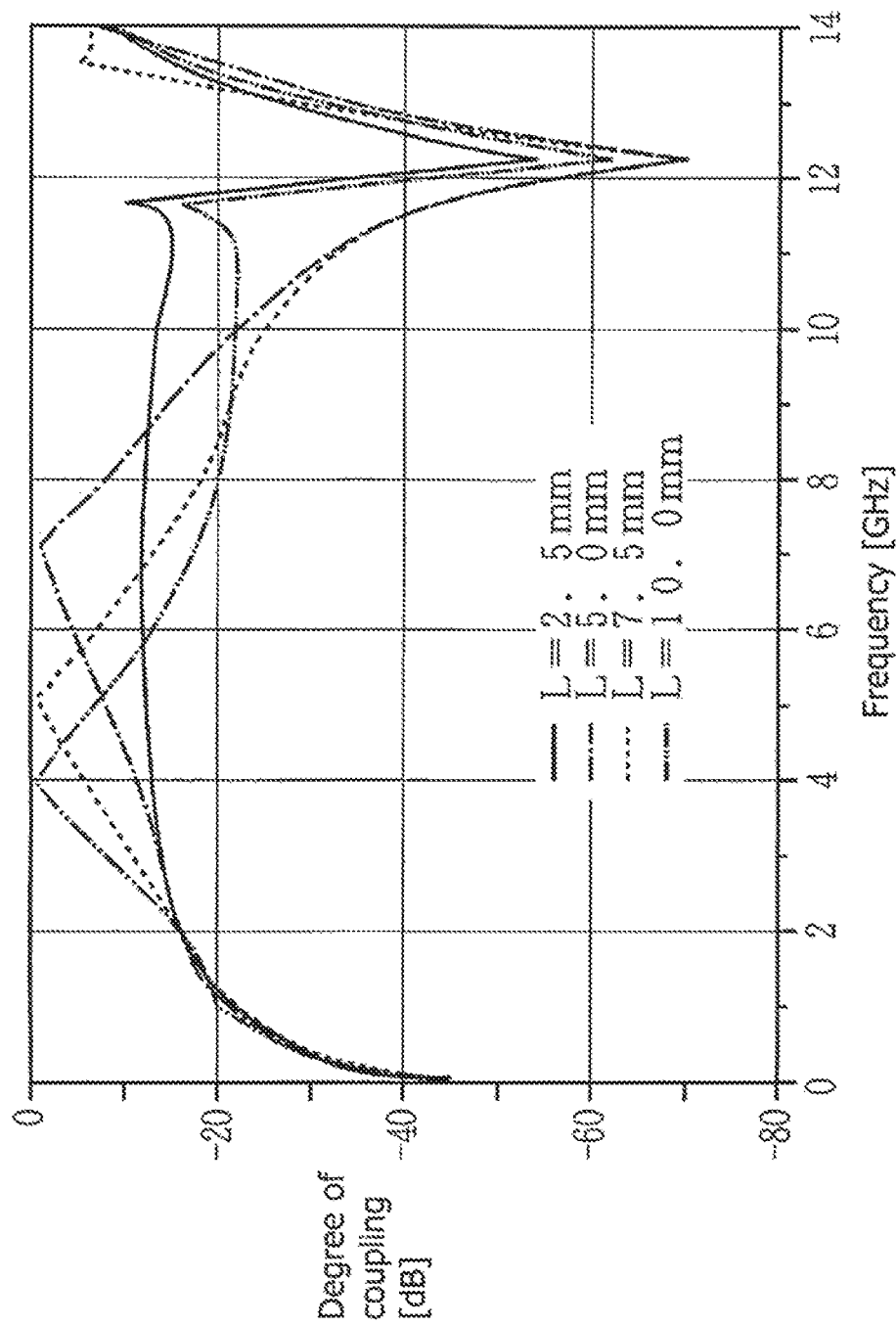
FIG. 40 is a graph showing the results of electromagnetic field simulation.
Figure 41A:
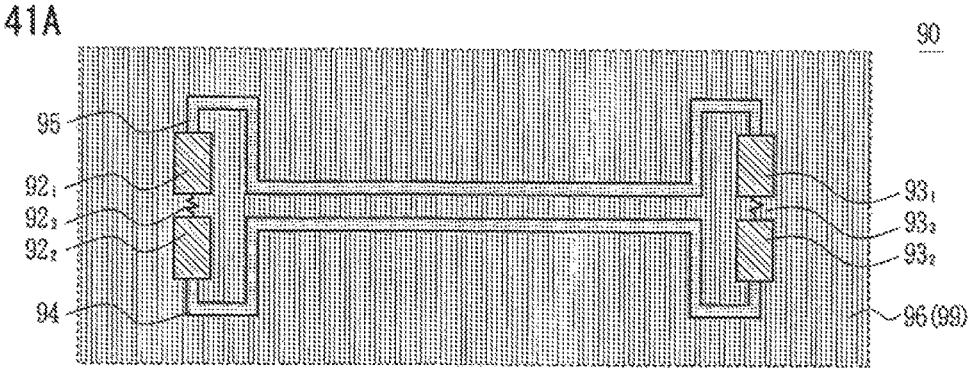
FIGS. 41A to 41C are schematic diagrams showing the structure of the directional coupling differential communication apparatus according to Example 21 of the present invention.
Figure 41B:
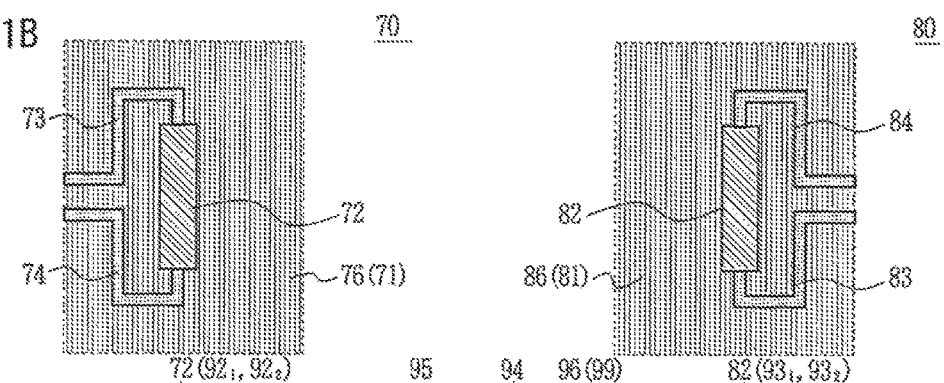
Figure 41C:
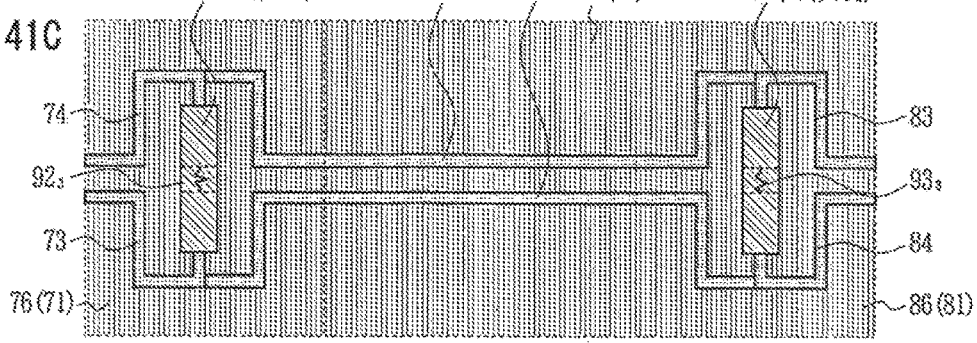

Next, the directional coupling differential communication apparatus according to Example 21 of the present invention is described in reference to FIGS. 40 to 41C, which is an example of the improved directional coupling differential communication apparatus of Example 11. That is to say, in Example 11, it can be seen from the results of electromagnetic field simulation that a stationary wave exists within the closed circuit shown in FIG. 21A, and the signal distorts in the case where the couplers 92 and 93 are long.

FIG. 40 is a graph for illustrating the results of electromagnetic field simulation, where flat characteristics are gained in the case where the length L of the couplers is 2.5 mm while a bump appears in the degree of coupling so that the flatness is lost in the cases where the length is 5.0 mm, 7.5 mm, and 10.0 mm. The peak values in the cases of L=5.0 mm, 7.5 mm, and 10.0 mm are 0.638 dB at 7.000 GHz, 0.699 dB at 5.100 GHz, and 0.673 dB at 4.050 GHz.

FIGS. 41A to 41C are schematic diagrams showing the structure of the directional coupling differential communication apparatus according to Example 21 of the present invention, where FIG. 41A is a plan diagram showing a third module, FIG. 41B is a plan diagram showing a first module and a second module, and FIG. 41C is a perspective plan diagram showing a case where the first module and the second module are layered on top of each other with one being inverted.

In Example 21, as shown in FIG. 41A, two couplers provided in the third module 90 are respectively formed of two couplers $92_1$ and $92_2$ or two couplers $93_1$ and $93_2$ and a terminal resistor $92_3$ or $93_3$ that links the two couplers. Here, the lead transmission line 94 and the lead transmission line 95 have the same length. The resistor value of the terminal resistor $92_3$ or $93_3$ is matched to the characteristic impedance of the lead transmission line 94 and the lead transmission line 95.

Here, the first module 70 and the second module 80 are the same as in Example 11 and are provided with couplers 72 and 82, respectively, and are connected to a semiconductor integrated circuit apparatus having a transmitter/receiver circuit through lead transmission lines 73, 74, 83, and 84.

Thus, in Example 21 of the present invention, a terminal resistor is inserted into a closed circuit so as to terminate the signal for matching so that the stationary wave attenuates, making it possible to remove signal distortion.

Example 22

Figure 42A:
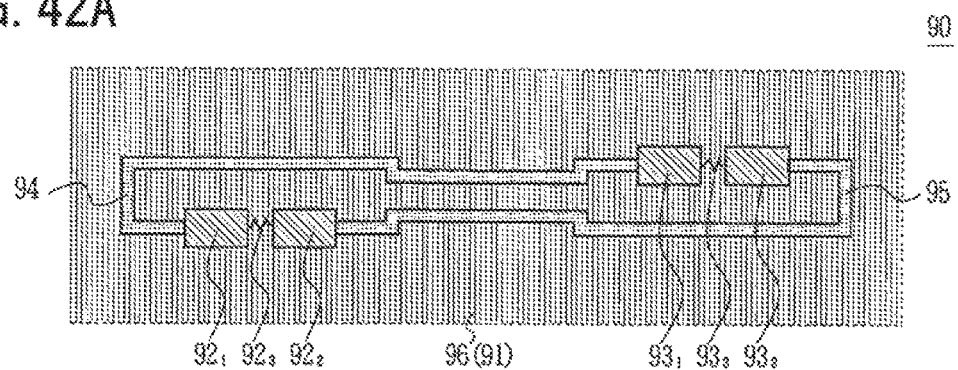
FIGS. 42A to 42C are schematic diagrams showing the structure of the directional coupling differential communication apparatus according to Example 22 of the present invention.
Figure 42B:
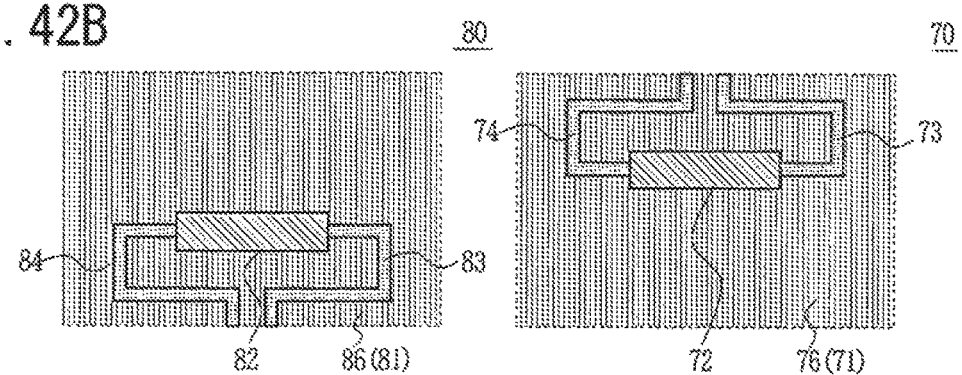
Figure 42C:
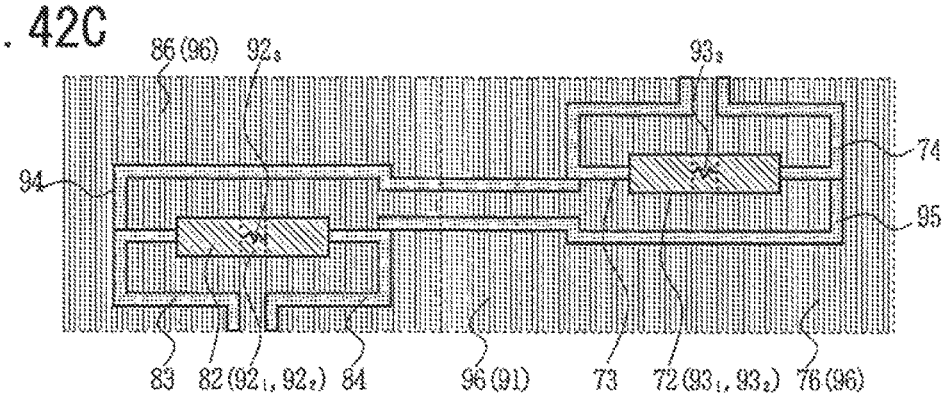

Next, the directional coupling differential communication apparatus according to Example 22 of the present invention is described in reference to FIGS. 42A to 42C, and Example 22 is an example of the improved directional coupling differential communication apparatus of Example 13. That is to say, in Example 13 as in Example 11, it can be seen that a stationary wave exists within a closed circuit that forms a third module, and a signal is distorted in the case where couplers 92 and 93 are long.

FIGS. 42A to 42C are schematic diagrams showing the directional coupling differential communication apparatus according to Example 22 of the present invention, where FIG. 42A is a plan diagram showing a third module, FIG. 42B is a plan diagram showing a first module and a second module, and FIG. 42C is a perspective plan diagram showing a case where the first module and the second module are layered on top of each other with one being inverted.

In Example 22, as shown in FIG. 42A, two couplers provided in a third module 90 are respectively formed of two couplers $92_1$ and $92_2$ or two couplers $93_1$ and $93_2$ as well as a terminal resistor $92_3$ or $93_3$ for linking the two couplers. Here, the lead transmission line 94 and the lead transmission line 95 have the same length. The resistor value of the terminal resistor $92_3$ or $93_3$ is matched to the characteristic impedance of the lead transmission line 94 and the lead transmission line 95.

Here, the first module 70 and the second module 80 are the same as in Example 13 and are provided with couplers 72 and 82, respectively, and are connected to a semiconductor integrated circuit apparatus having a transmitter/receiver circuit through lead transmission lines 73, 74, 83, and 84.

Thus, in Example 22 of the present invention as well, a terminal resistor is inserted into a closed circuit so as to terminate the signal for matching so that the stationary wave attenuates, making it possible to remove signal distortion.

Example 23

Figure 43A:
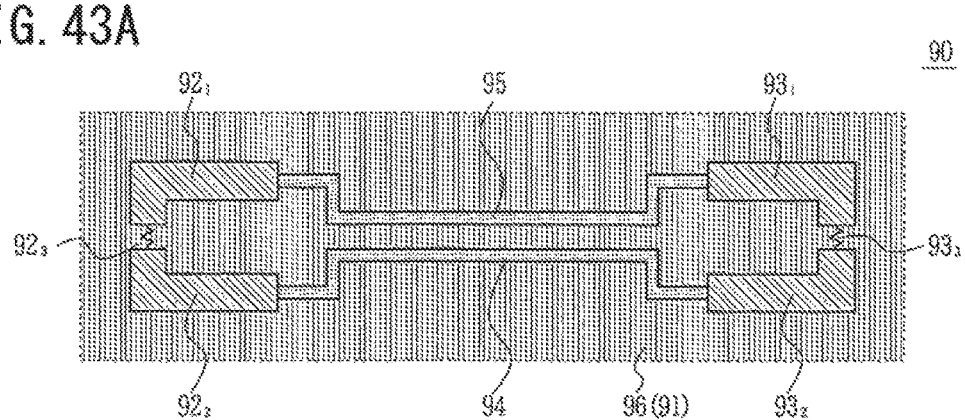
FIGS. 43A and 43B are schematic diagrams showing the structure of the directional coupling differential communication apparatus according to Example 23 of the present invention.
Figure 43B:
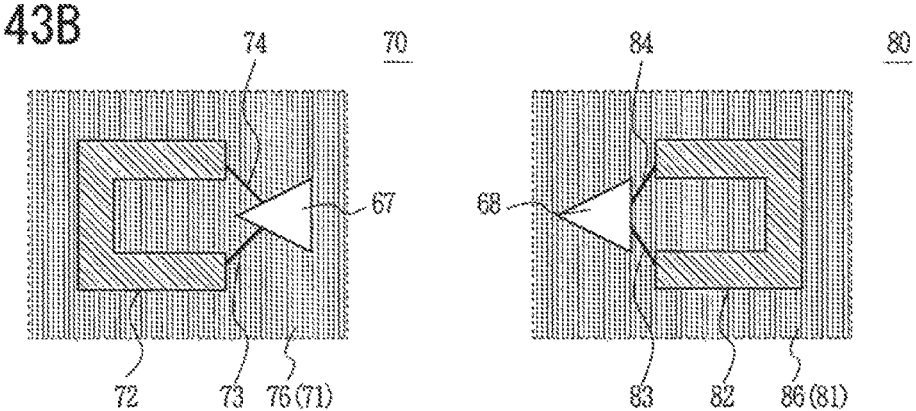

Next, the directional coupling differential communication apparatus according to Example 23 of the present invention is described in reference to FIGS. 43A and 43B, and Example 23 is an example of the improved directional coupling differential communication apparatus of Example 14. That is to say, in Example 14 as in Example 11, it can be seen that a stationary wave exists within a closed circuit that forms a third module, and a signal is distorted in the case where couplers 92 and 93 are long.

FIGS. 43A and 43B are schematic diagrams showing the directional coupling differential communication apparatus according to Example 23 of the present invention, where FIG. 43A is a plan diagram showing a third module and FIG. 43B is a plan diagram showing a first module and a second module.

In Example 23, as shown in FIG. 43A, two couplers provided in a third module 90 are respectively formed of two couplers $92_1$ and $92_2$ or two couplers $93_1$ and $93_2$ as well as a terminal resistor $92_3$ or $93_3$ for linking the two couplers. Here, the lead transmission line 94 and the lead transmission line 95 have the same length. The resistor value of the terminal resistor $92_3$ or $93_3$ is matched to the characteristic impedance of the lead transmission line 94 and the lead transmission line 95.

Here, the first module 70 and the second module 80 are the same as in Example 14 and are provided with couplers 72 and 82, respectively, and are connected to transmitter/receiver circuits 67 and 68, respectively, through lead transmission lines 73, 74, 83, and 84.

Thus, in Example 23 of the present invention, couplers provided in a closed circuit are formed of two couplers and a terminal resistor for linking the two couplers, and therefore, the properties of the degree of coupling can be flattened in the same manner as in Example 21 or Example 22, and as a result, signal distortion can be removed.

Example 24

Figure 44:
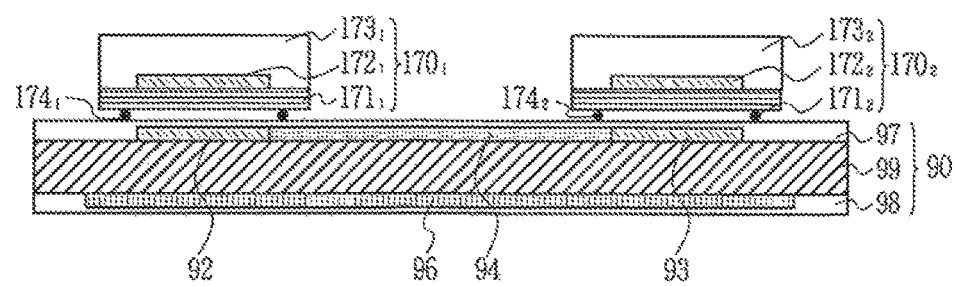
FIG. 44 is a schematic diagram showing the structure of the directional coupling differential communication apparatus according to Example 24 of the present invention.

Next, the directional coupling differential communication apparatus according to Example 24 of the present invention is described in reference to FIG. 44. In Example 24, the first module 70 and the second module 80 in the directional coupling differential communication apparatus in Example 11 are formed of a package, and the remaining part of coupling state between couplers is the same as in Example 11.

FIG. 44 is a schematic cross-sectional diagram showing the structure of the directional coupling differential communication apparatus according to Example 24 of the present invention, where a semiconductor integrated circuit chip is mounted inside a package.

In the case where the first module and the second module are formed of a package $170_1$ or $170_2$ as shown in FIG. 44, a coupler $172_1$ or $172_2$ is formed using the wires of the package $170_1$ or $170_2$ and is connected to a third module 90 using bumps $174_1$ or $174_2$ formed on the rear surface of the substrate $171_1$ or $171_2$.

In Example 24 of the present invention, a coupler can be made of wires of a package, and therefore, first and second modules can be provided closer to a coupler end of the third module than in the case where a coupler is made of wires on a semiconductor chip, and thus, the degree of coupling can be strengthened. Though the couplers are formed of wires on the substrates $171_1$ and $171_2$ on the side where the semiconductor chips are mounted in the figure, the couplers may be formed of wires on the substrates $171_1$ and $171_2$ on the rear side.

Example 25

Figure 45:
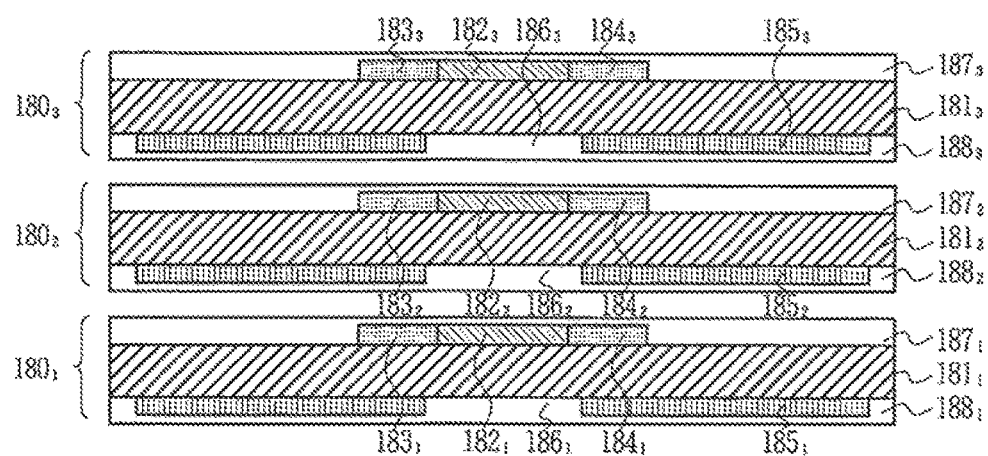
FIG. 45 is a diagram showing the directional coupling differential communication apparatus according to Example 25 of the present invention.
Figure 46A:
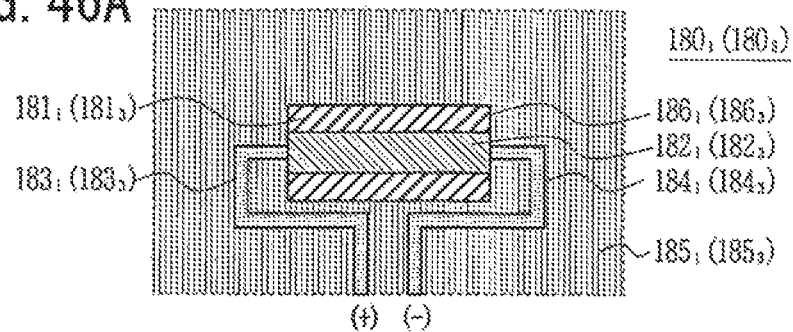
FIGS. 46A to 46C are diagrams showing the direction in which lead out transmission lines are led out.
Figure 46B:
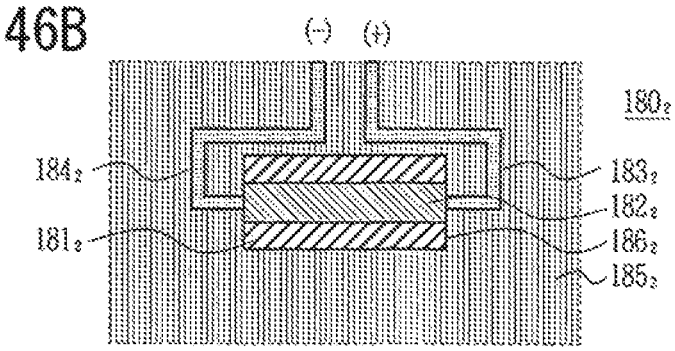
Figure 46C:
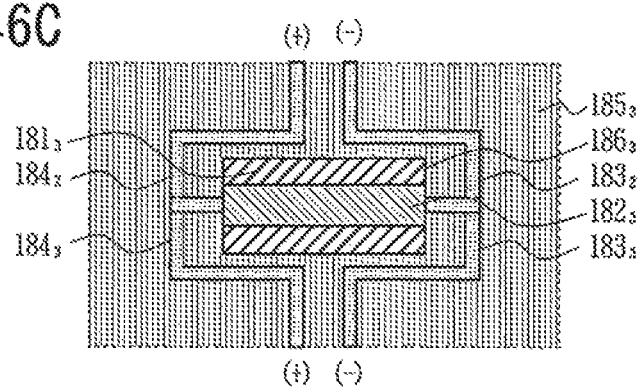

Next, the directional coupling differential communication apparatus according to Example 25 of the present invention is described in reference to FIGS. 45 to 46C. In Example 25, the design of the directional coupling differential communication apparatus of Example 15 is changed in order for it to be used as a multi-drop bus.

FIG. 45 is a diagram for illustrating the directional coupling differential communication apparatus according to Example 25 of the present invention, where coupler components $180_1$, $180_2$, and $180_3$ are mounted on top of each other to form a multi-drop bus. In each coupler component $180_1$, $180_2$, or $180_3$, a coupler $182_1$, $182_2$, or $182_3$ is provided on the surface of an FPC $181_1$, $181_2$, or $181_3$ and is connected to lead transmission lines $183_1$ and $184_1$, $183_2$ and $184_2$, or $183_3$ and $184_3$. In addition, a plane $185_1$, $185_2$, or $185_3$ having a missing portion $186_1$, $186_2$, or $186_3$ in a portion corresponding to the coupler $182_1$, $182_2$, or $182_3$ is provided on the rear surface of the FPC $181_1$, $181_2$, or $181_3$.

In addition, the two surfaces, front and rear, of the FPCs $181_1$, $181_2$, or $181_3$ are provided with surface layers $187_1$ and $188_1$, $187_2$ and $188_2$, or $187_3$ and $188_3$ for protection, and the FPCs face each other with a gap in between. The distance of the gaps is 0 mm to several cm. Instead of the gaps, insulating films made of a material of the surface layers of the FPCs, such as polyethylene terephthalate (PET), is sandwiched between the FPCs, which are thus pasted together with an adhesive so that the couplers $182_1$, $182_2$, and $182_3$ overlap in the direction in which the FPCs are layered on top of each other. In addition, there are no restrictions to the FPCs, but rather printed circuit boards (PCBs), semiconductor substrates, or substrates within a package may be used.

FIGS. 46A to 46C are diagrams for illustrating the direction in which lead transmission lines are led, where FIG. 46A is a plan diagram showing a coupler component $180_1$ located in a lower layer and a coupler component $180_3$ located in an upper layer, FIG. 46B is a plan diagram showing a coupler component $180_2$ located in a middle layer, and FIG. 46C is a partial perspective plan diagram showing a case where the components are layered as in FIG. 45. Here, the directions in which the lead transmission lines $183_1$, $184_1$, $183_3$, and $184_3$ are led out from the upper and lower coupler components $180_1$ and $180_3$ are opposite to the directions in which the lead transmission lines $183_2$ and $184_2$ are led out from the coupler component $180_2$ in the middle layer so that the coupling between the lead transmission lines can be reduced.

In Example 25 of the present invention, the three couplers are layered on top of each other in the direction in which the coupler components are layered on top of each other, and therefore, a multi-drop bus can be formed using the middle coupler component $180_2$ as the bus so that the coupler $182_2$ can communicate with the coupler $182_1$ and the coupler $182_3$ simultaneously. It is also possible to form a multi-drop bus using the lower coupler component $180_1$ as the bus so that the coupler $182_1$ can communicate with the coupler $182_2$ and the coupler $182_3$ simultaneously.

Example 26

Figure 47A:
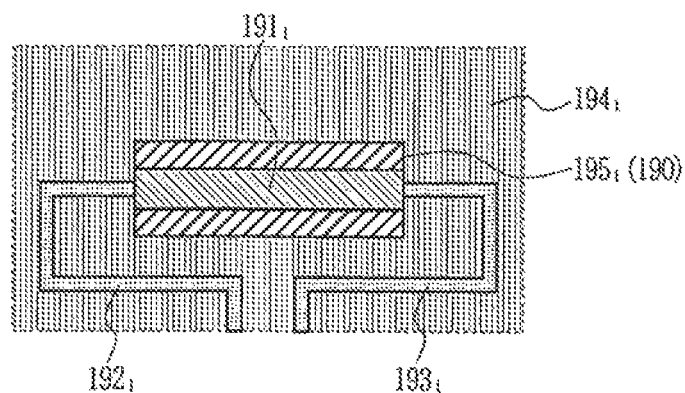
FIGS. 47A to 47C are schematic diagrams showing the structure of the directional coupling differential communication apparatus according to Example 26 of the present invention.
Figure 47B:
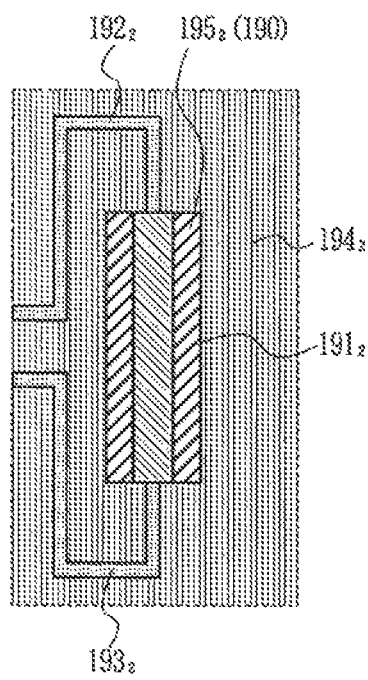
Figure 47C:
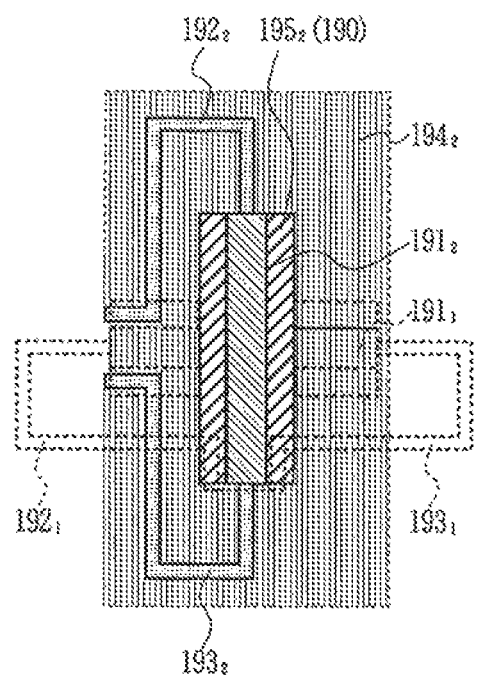

Next, the directional coupling differential communication apparatus according to Example 26 of the present invention is described in reference to FIGS. 47A to 47C. FIGS. 47A to 47C are schematic diagrams showing the structure of the directional coupling differential communication apparatus according to Example 26 of the present invention, where FIG. 47A is a plan diagram showing a third module from the top, FIG. 47B is a plan diagram showing the third module from the bottom, and FIG. 47C is a perspective plan diagram showing the main portion of the third module. As shown in FIG. 47C, the couplers $191_1$ and $191_2$ provided on the front and rear surfaces of an insulating substrate 190 are placed in the directions perpendicular to each other so that interference between the couplers $191_1$ and $191_2$ can be prevented. The symbols $192_1$, $192_2$, $193_1$, and $193_2$ in the figures are lead transmission lines. The symbols $194_1$, $194_2$, $195_1$, and $195_2$ in the figures are planes and missing portions of the planes.

Accordingly, the coupler $191_1$ and the coupler in the first module can be coupled, and the coupler $191_2$ and the coupler in the second module can be coupled without causing coupling between the first module and the second module, and therefore, no crosstalk occurs.

Example 27

Figure 48A:
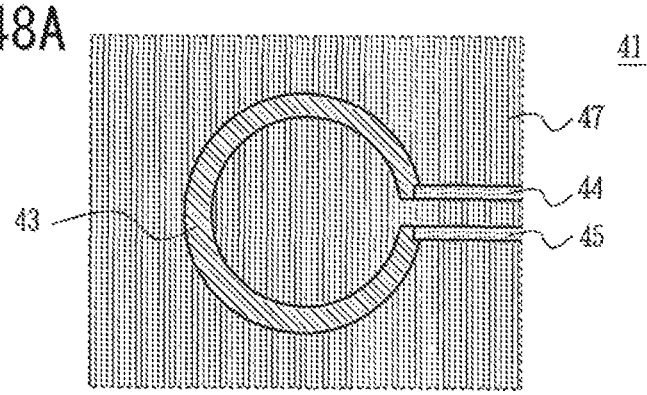
FIGS. 48A to 48C are schematic diagrams showing the structure of the directional coupling differential communication apparatus according to Example 27 of the present invention.

Next, the directional coupling differential communication apparatus according to Example 27 of the present invention is described in reference to FIGS. 48A to 49C, where Example 27 is a modification of Example 1. FIGS. 48A to 48C are schematic diagrams showing the structure of the directional coupling differential communication apparatus according to Example 27 of the present invention, where FIG. 48A is a plan diagram showing a coupler component in a first module, FIG. 48B is a plan diagram showing a coupler component in a second module, and FIG. 48C is a perspective plan diagram showing a case where the modules are layered on top of each other with the second module being inverted from the front to the rear side.

Figure 48B:
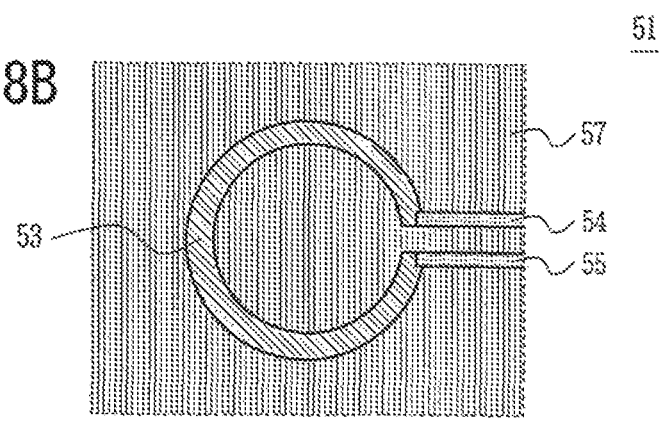
Figure 48C:
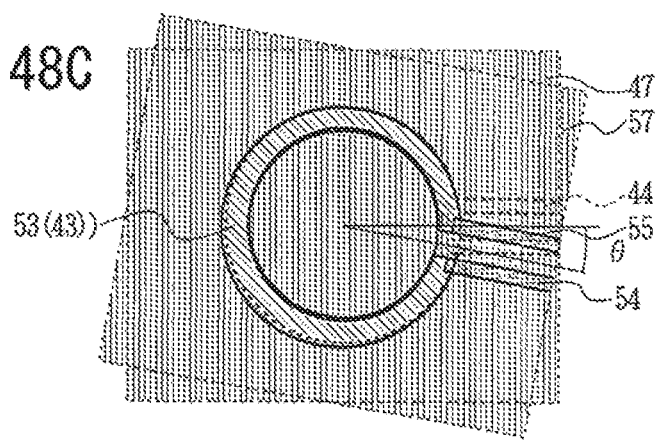

In Example 27, as shown in FIG. 48A, a coupler 43 provided in a coupler component 41 in a first module is a coupler in arc form. As shown in FIG. 48B, a coupler 53 provided in a coupler component 51 in a second module is also a coupler in arc form that is the same shape as of the coupler 43. As shown in FIG. 48C, the modules are layered on top of each other with the second module being in a rotated state by an angle θ. Though the second module is inverted from the front to the rear side when layered, it may be layered without being inverted.

Figure 49A:
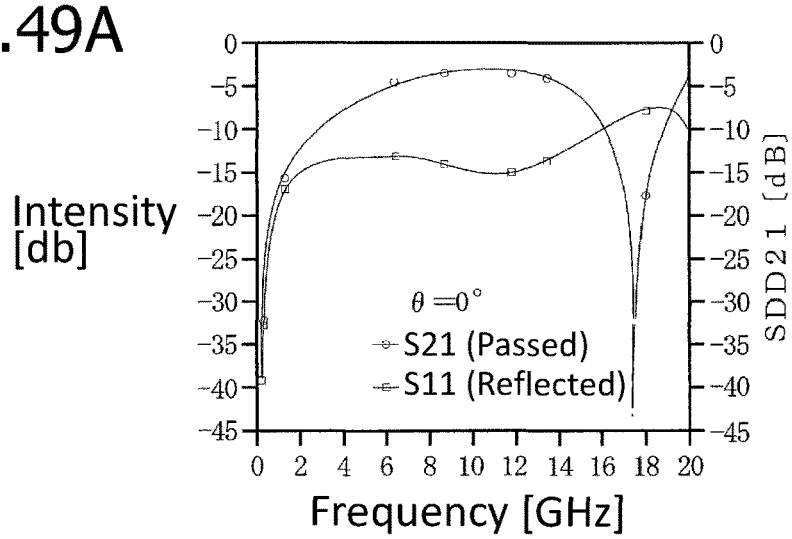
FIGS. 49A to 49C are graphs showing the dependency of the degree of coupling on the angle θ.
Figure 49B:
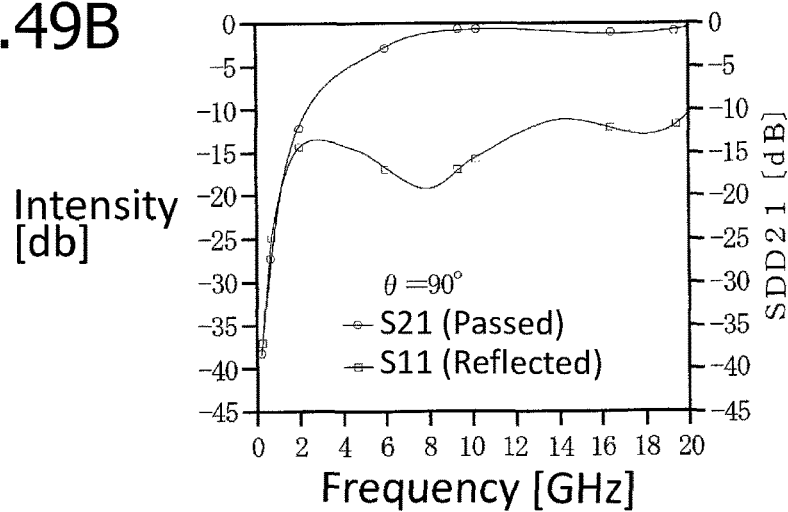
Figure 49C:
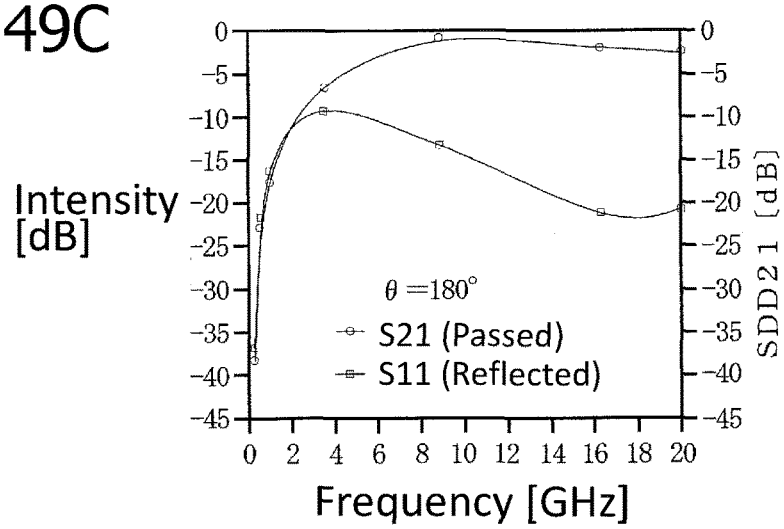

FIGS. 49A to 49C are graphs illustrating the dependency of the degree of coupling on the angle θ, where FIG. 49A is a graph illustrating the degree of coupling in the case of θ=0°, FIG. 49B is a graph illustrating the degree of coupling in the case of θ=90°, and FIG. 49C is a graph illustrating the degree of coupling in the case of θ=180°. As shown in the figures, it can be seen from the electromagnetic field simulation that stable degrees of coupling can be gained between θ=0° and θ=180°.

Accordingly, lead transmission lines 44, 45, 54, and 55 in the first module and in the second module can be led out at a free angle, which can increase the freedom in design. Here, the lead transmission lines can be installed so as to be freely rotatable relative to the first module and the second module so as to be used as an electromagnetic field coupling connector in a rotatable portion.

Example 28

Figure 50A:
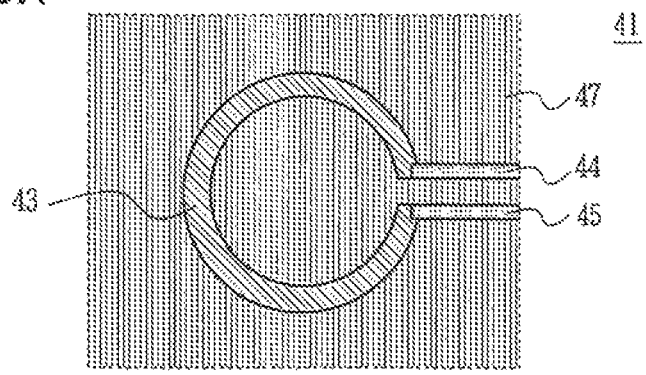
FIGS. 50A to 50C are schematic diagrams showing the structure of the directional coupling differential communication apparatus according to Example 28 of the present invention.
Figure 50B:
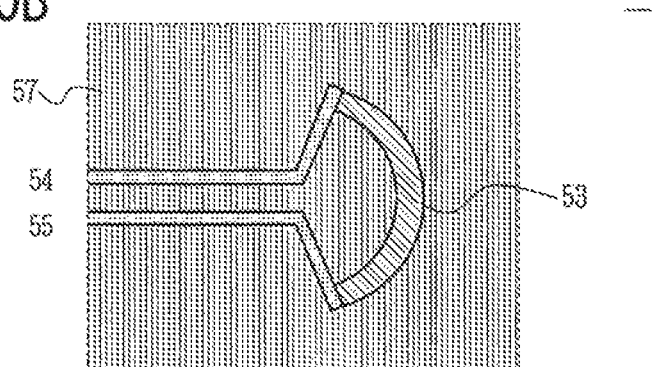
Figure 50C:
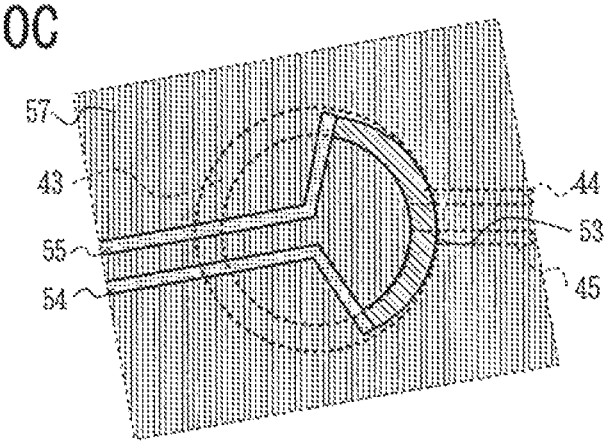
Figure 52:
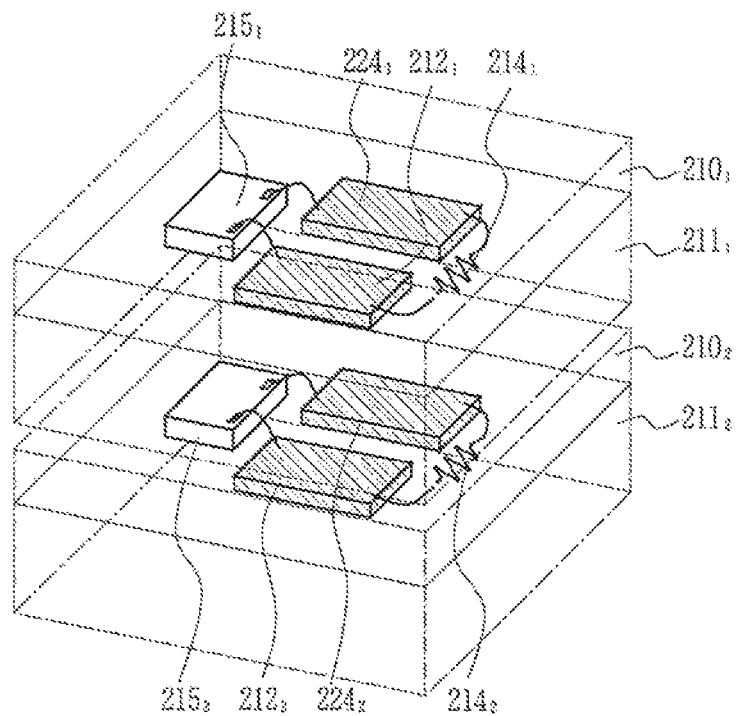
FIG. 52 is a schematic perspective diagram showing an inter-module communication apparatus that had been proposed by the present inventor.
Figure 53:
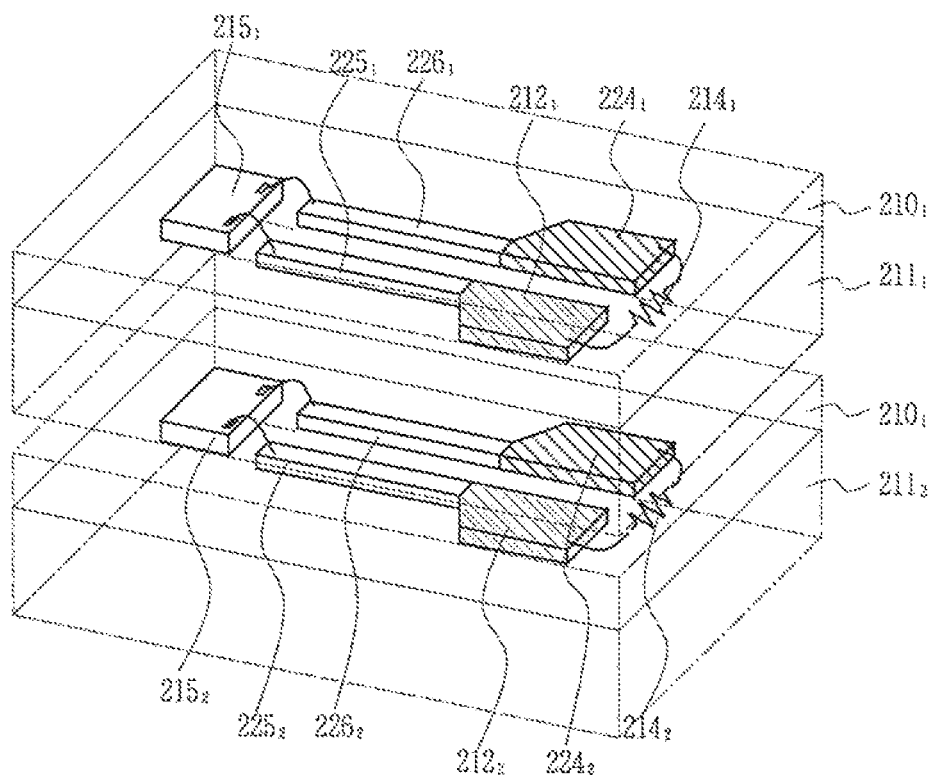
FIG. 53 is a schematic perspective diagram showing another inter-module communication apparatus that had been proposed by the present inventor.

Next, the directional coupling differential communication apparatus according to Example 28 of the present invention is described in reference to FIGS. 50A to 50C, and Example 28 is a modification of Example 27. FIGS. 50A to 50C are schematic diagrams showing the structure of the directional coupling differential communication apparatus according to Example 28 of the present invention, where FIG. 50A is a plan diagram showing a coupler component in a first module, FIG. 50B is a plan diagram showing a coupler component in a second module, and FIG. 50C is a perspective plan diagram showing a case where the modules are layered on top of each other. Though the second module is inverted from the front to the rear side when layered, it may be layered without being inverted.

In Example 28, as shown in FIG. 50A, a coupler 43 provided in a coupler component 41 in the first module is a coupler in arc form that is almost circular as in Example 27. Meanwhile, as shown in FIG. 50B, a coupler 53 provided in a coupler component 51 in the second module is a coupler in arc form that is in a crescent shape.

As shown in FIG. 50C, at whichever angle θ the couplers are coupled when one coupler is in a coupler in arc form that is in a crescent shape, the degree of coupling barely varies, and therefore, an electromagnetic field coupling connector to be used in a rotatable portion can be provided.

Example 29

Next, the directional coupling differential communication apparatus according to Example 29 of the present invention is described in reference to FIGS. 51A to 51C. FIGS. 51A to 51C are schematic diagrams showing the structure of the directional coupling differential communication apparatus according to Example 29 of the present invention, which is appropriate as an electromagnetic field coupling connector to be used in a rotatable portion. FIG. 51A is a partial perspective diagram showing the main portion of the apparatus, and FIGS. 51B and 51C are perspective diagrams showing an electromagnetic field coupling connector.

As shown in FIG. 51A, a coupler $204_1$ in arc form connected to lead transmission lines $205_1$ and $206_1$ is fixed to and provided in a hinge 203 in the coupling portion between a PC main body 201 and a PC display 202 so as to form an electromagnetic field connector where a coupler in arc form $204_2$ connected to lead transmission lines $205_2$ and $206_2$ is incorporated inside the coupler in arc form $204_1$ as a rotatable cylinder bush.

As shown in FIG. 51B, the couplers in arc form $204_1$ and $204_2$ have a thickness in the direction in which the hinge 203 extends. The coupler in arc form $204_2$ is incorporated inside the coupler in arc form $204_1$ in a cylinder bush form that is rotatable in a concentric manner. FIG. 51B shows the structure in a state where the PC display 202 is open.

Alternatively, as shown in FIG. 51C, the hinge 203 may be long in the direction in which it extends so that a signal flows in the longitudinal direction, that is to say, in the direction in which the hinge 203 extends.

Thus, an electromagnetic field coupling connector is provided in a hinge portion in Example 29 of the present invention, and therefore, it is not necessary to connect the PC main body 201 and the PC display 202 with wires.

EXPLANATION OF SYMBOLS $10_1$ First module
$10_2$ Second module
$11_1$ First insulating substrate
$11_2$ Second insulating substrate
$12_1$ First coupler
$12_2$ Second coupler
$13_1$, $13_2$, $14_1$, $14_2$ Input/output connection lines
$15_1$, $15_2$, Transmitter/receiver circuits
$16_1$, $16_2$ Electromagnetic shield layers
$17_1$, $17_2$ Missing portions
$18_1$, $18_2$, $19_1$, $19_2$ Surface layers
40 Main substrate
41, $41_1$, $41_2$, 51, $51_1$, $51_2$ Coupler components
42, $42_1$, $42_2$, 52, $52_1$, $52_2$ FPCs
43, $43_1$, $43_2$, $43_3$, 53, $53_1$, $53_2$ Couplers
44, $44_1$, $44_2$, 45, $45_1$, $45_2$, 55, $54_1$, $54_2$, $55_1$, $55_2$ Lead transmission lines
46, 56 Transmitter/receiver circuits
47, $47_1$, $47_2$, 57, $57_1$, $57_2$ Planes
48, $48_1$, $48_2$, 58, $58_1$, $58_2$ Missing portions
$49_1$, $49_2$, $59_1$, $59_2$ Surface layers
50 Child substrate
61, $61_1$, $61_2$ Terrace members
62 Support member
$63_1$, $63_2$, $64_1$, $64_2$ Bonding wires
65, 66 Semiconductor integrated circuit apparatuses
67, 68 Transmitter/receiver circuits
$69_1$, $69_2$ Dielectric bodies
70 First module
71, 81, 91 FPCs
72, 82, 92, $92_1$, $92_2$, 93, $93_1$, $93_2$ Couplers
73, 74, 83, 84, 94, 95 Lead transmission lines
75, 85 Semiconductor integrated circuit apparatuses
76, 86, 96 Planes
77, 87 Semiconductor chips
78, 88 Bumps
79, 89 Bonding wires
80 Second module
90 Third module
$92_3$, $93_3$ Terminal resistors
97, 98 Surface layers
99 FR4 substrate
100 PCB
101 FR4 substrate
102 Plane
103, 104 Surface layers
$110_1$, $110_2$ Modules
$111_1$, $111_2$ FPCs
$112_1$, $112_2$ Couplers
$113_1$, $113_2$ Lead transmission lines
$114_1$, $114_2$ Termination lines
$115_1$, $115_2$ Planes
$116_1$, $116_2$ Missing portions
120, 150, 160 First modules
121, 131, 141, $151_1$, $151_2$, 161 Couplers
122, 123, 132, 133, 142, 143 Lead transmission lines
124, 134, 144, 154, 164 Semiconductor integrated circuit apparatuses
125, 156, 165 RF4 substrates
126, 158, 159, 167, 168 Surface layers
130 Second module
140 Third module 152, 153, 162, 163 Lead signal lines
155 Connection transmission line
$170_1$, $170_2$ Packages
$171_1$, $171_2$ Substrates
$172_1$, $172_2$ Couplers
$173_1$, $173_2$ Caps
$174_1$, $174_2$ Bumps
$180_1$, $180_2$, $180_3$ Coupler components
$181_1$, $181_2$, $181_3$ FPCs
$182_1$, $182_2$, $182_3$ Couplers
$183_1$, $183_2$, $183_3$, $184_1$, $184_2$, $184_3$ Lead transmission lines
$185_1$, $185_2$, $185_3$ Planes
$186_1$, $186_2$, $186_3$ Missing portions
$187_1$, $187_2$, $187_3$, $188_1$, $188_2$, $188_3$ Surface layers
190 Insulating substrate
$191_1$, $191_2$ Couplers
$192_1$, $192_2$, $193_1$, $193_2$ Lead transmission lines
$194_1$, $194_2$ Planes
$195_1$, $195_2$ Missing portions
201 PC main body
202 PC display
203 Hinge
$204_1$, $204_2$ Couplers in arc form
$205_1$, $205_2$, $206_1$, $206_2$ Lead transmission lines
$210_1$, $210_2$ Modules
$211_1$, $211_2$ Substrates
$212_1$, $212_2$ Signal lines
$214_1$, $214_2$ Resistors
$215_1$, $215_2$ Semiconductor integrated circuit apparatuses
$224_1$, $224_2$ Feedback lines
$225_1$, $225_2$, $226_1$, $226_2$ Transmission lines

The invention claimed is:

1. A directional coupling communication apparatus, comprising:
    a first coupler in arc form provided on a first insulating substrate, where an input/output connection line is connected to a first end, and either a ground line or an input/output connection line to which an inverse signal of a signal to be inputted to the input/output connection line connected to said first end is inputted is connected; and
    a second coupler in arc form, where an input/output connection line is connected to a first end, and either a ground line or an input/output connection line to which an inverse signal of a signal to be inputted to the input/output connection line connected to said first end is inputted is connected, wherein
    the diameter of a coupler in said second coupler in smaller than the diameter of a coupler in said first coupler, and said second coupler is incorporated inside said first coupler so as to be freely rotatable around said first coupler in a concentric manner.

2. The directional coupling communication apparatus according to claim 1, wherein said first coupler and said second coupler are provided to a hinge portion of a housing that can be freely opened and closed.

* * * * *